United States Patent
Yassour et al.

(10) Patent No.: US 7,530,778 B2
(45) Date of Patent: May 12, 2009

(54) HIGH-PERFORMANCE NON-CONTACT SUPPORT PLATFORMS

(75) Inventors: Yuval Yassour, Kibbutz Hasolelim (IL); Hilel Richman, Haifa (IL); Daniel Levin, Herzliya (IL)

(73) Assignee: Coreflow Ltd., Yoqneam llit (IL)

( * ) Notice: Subject to any disclaimer, the term of this patent is extended or adjusted under 35 U.S.C. 154(b) by 252 days.

(21) Appl. No.: 10/501,307

(22) PCT Filed: Dec. 27, 2002

(86) PCT No.: PCT/IL02/01045

§ 371 (c)(1),
(2), (4) Date: May 31, 2005

(87) PCT Pub. No.: WO03/060961

PCT Pub. Date: Jul. 24, 2003

(65) Prior Publication Data

US 2006/0054774 A1    Mar. 16, 2006

Related U.S. Application Data

(60) Provisional application No. 60/342,374, filed on Dec. 27, 2001.

(51) Int. Cl.
*F16C 32/06* (2006.01)
*H01L 21/00* (2006.01)
(52) U.S. Cl. ......................... 414/676; 384/12
(58) Field of Classification Search ............. 414/676; 384/5, 12
See application file for complete search history.

(56) References Cited

U.S. PATENT DOCUMENTS 2,848,820 A     8/1958    Claes et al.

(Continued)

FOREIGN PATENT DOCUMENTS

FR         1 342 552        11/1963

(Continued)

OTHER PUBLICATIONS

International Search Report for PCT/IL02/01045 dated May 8, 2003.

*Primary Examiner*—Douglas A Hess
(74) *Attorney, Agent, or Firm*—Pearl Cohen Zedek Latzer, LLP

(57) ABSTRACT

A non-contact support platform for supporting without contact a stationary or traveling object by air-cushion induced forces, the platform comprising at least one of two substantially opposite support surfaces, each support surfaces comprising at least one of a plurality of basic cells each having at least one of a plurality of pressure outlets and at least one of a plurality of air-evacuation channels at least one of a plurality of outlets, and one of a plurality of air-evacuation channels, each of the pressure outlets fluidically connected through a pressure flow restrictor to a high-pressure reservoir, the pressure outlets providing pressurized air for generating pressure induced forces, maintaining an air-cushion between the object and the support surface, the pressure flow restrictor characteristically exhibiting fluidic return spring behavior; each of said at least one of a plurality of air-evacuation channels having an inlet and outlet, the inlet kept at an ambient pressure or lower, under vacuum condition, for locally discharging mass flow, thus obtaining uniform support and local nature response.

72 Claims, 21 Drawing Sheets

U.S. PATENT DOCUMENTS

| | | |
|---|---|---|
| 3,223,500 A | 12/1965 | Mission |
| 3,449,102 A | 6/1969 | Chaumont et al. |
| 5,439,341 A | 8/1995 | Makl et al. |
| 5,501,569 A * | 3/1996 | Yamazaki et al. ............ 414/676 |
| 5,562,396 A * | 10/1996 | Yamazaki et al. ............ 414/676 |
| 6,543,662 B1 * | 4/2003 | Kuhlmann et al. ......... 226/97.3 |
| 6,810,297 B2 * | 10/2004 | Adin et al. .................. 700/110 |
| 7,108,123 B2 * | 9/2006 | Zeidler et al. ............... 198/493 |

FOREIGN PATENT DOCUMENTS

| | | |
|---|---|---|
| FR | 1 477 171 | 4/1967 |
| WO | WO 01/14752 | 3/2001 |
| WO | WO 01/14782 | 3/2001 |
| WO | WO 01/19572 | 3/2001 |

* cited by examiner

PRIOR ART

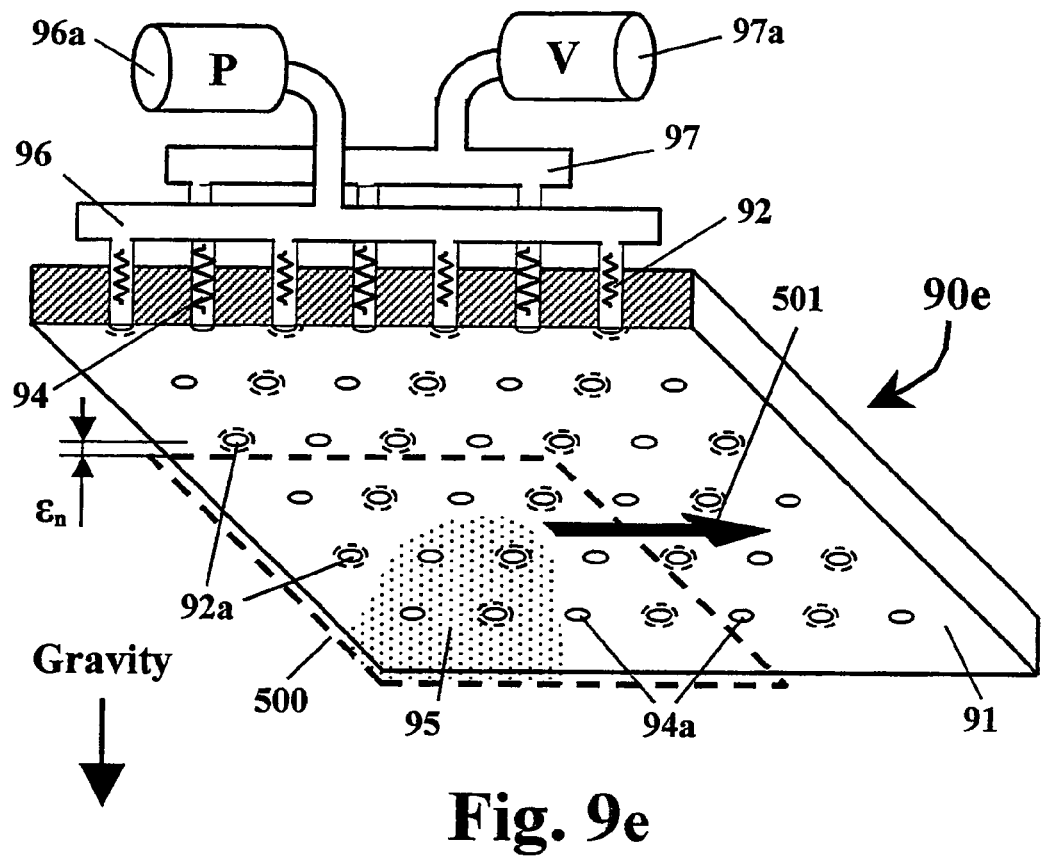
Fig. 9e
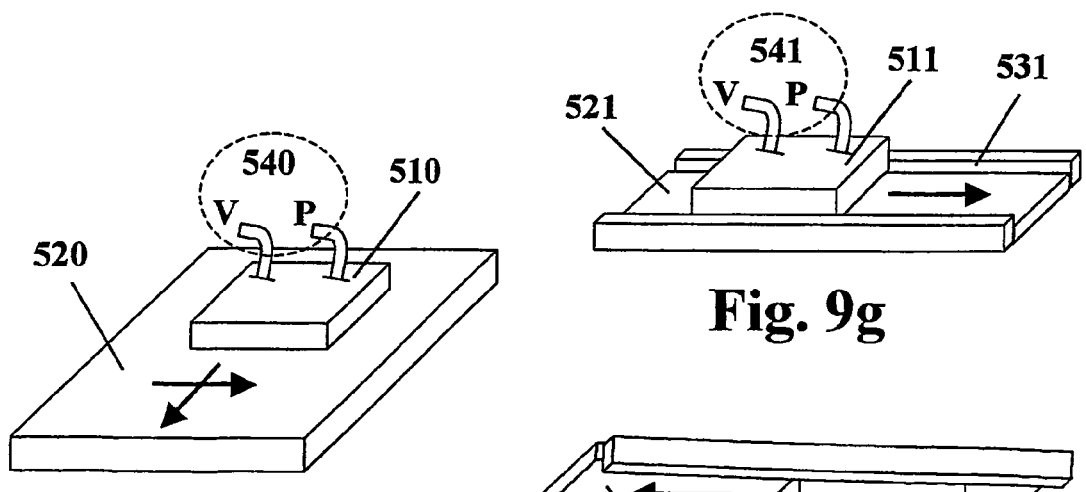
Fig. 9f
Fig. 9g
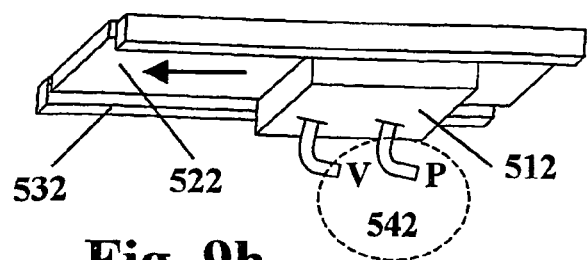
Fig. 9h

HIGH-PERFORMANCE NON-CONTACT SUPPORT PLATFORMS

CROSS-REFERENCE TO RELATED APPLICATIONS

This application is a National Phase Application of PCT International Application No. PCT/IL02/01045, International Filing Date Dec. 27, 2002, claiming priority of U.S. Provisional Patent Application 60/342,374, filed Dec. 27, 2001.

FIELD OF THE INVENTION

The present invention relates to non-contact supporting and conveying platforms and handling tools. More particularly, it relates platforms for supporting and conveying flat objects, such as silicon-wafers or Flat Panel Displays (FPD), (but not necessarily limited to thin or flat objects), that make beneficial use of various types of air-cushions that are based on same generic fluidic element, hereinafter referred to as the "fluidic return spring", to provide high performance non-contact platforms and handling tools.

BACKGROUND OF THE INVENTION

In resent years, much attention has been given to the option of using non-contact equipment for supporting, gripping or conveying products in manufacturing processes. In particular, such non-contact equipment has a unique appeal for high-tech industry where the production is highly susceptible to direct contact. It is especially important in the semiconductors industry, in the manufacturing phase of silicon wafers, Flat Panel Displays (FPD) and Printed Circle Boards (PCB), as well as computer's hard-discs, compact discs (CD), DVD, liquid crystal display (LCD) and similar products. Non-contact equipment can beneficially be applied also in the manufacturing phase of optical equipment and in the printing world, mainly in wide format printing when apart from papers, printing is performed on various types of "hard" materials.

By using non-contact equipment, many problems that are associated with the manufacturing phase may be solved and directly enhance the production yield. Without derogating the generality, some of the advantages in using non-contact systems includes, inter alia:

(a) Eliminating or greatly reducing mechanical damages—including, for example, impact, press, but, most importantly, any friction that may be involved. Friction is inherently eliminated in non-contact systems.
(b) Eliminating or greatly reducing in-contact contamination—a very important feature for semiconductors production lines of silicon wafers and FPDs.
(c) Eliminating or greatly reducing electrostatic discharge (ESD). Critical ESD problems may be founds in the semiconductors production lines of FPD and silicon wafers.
(d) Eliminating or greatly reducing in-contact local deformation of objects due to particles that are trapped on the contact surface, between the product and the in-contact equipment. Such problems may occur when a wafer is gripped by an electrostatic or vacuum chuck during a sequential lithography process in the semiconductors industry.
(e) Non-flatness of local nature, found in in-contact equipment, is inherently averaged when using non-contact equipment.

Additional benefits of using non-contact equipments can be obtained:

(f) Conveying of products by moving only the product thus avoiding the need to move also the holding-table that may be of much heavier weight than the product itself, a situation that is typically found in the FPD market and semiconductors industry as well as in the printing world.
(g) Conveying the product accurately where accuracy can be provided only at a small distinct area or along a narrow line where the process is executed continuously of step-by-step during the travel of the product. It is relevant in steppers that are widely in use the semiconductors industry with planar (X,Y) wafer motion is applied, when rotating the wafer during inspection, or when linear motion in one direction is applied in the manufacturing line of FPD.
(h) To flatten with no contact, by pure moments enforcing, objects that are not flat, in order to provide accurate gripping. It is important for PCB & FPD makers as well as in the semiconductors industry where both regular or thin wafers have to be flatten prior to many processes. It is also important in the printing world when media other than paper is used, including direct digital writing on different media, and printing-plate for off-set printing and press. In most of these examples, optics or optical imaging is involved where the focal distance must be very accurate.

Commonly, such systems comprise a flat platform having one or more active-surfaces. Each of the active-surfaces, that are in most cases flat, is equipped with a plurality of pressure ports for providing pressurized air aimed at generating an air-cushion. An air-cushion is developed when a surface, that is flat in most cases, is placed over the active surface at a close range. Air-cushion support can be preloaded by the object weight, by pressure dual-side configuration or preloaded by vacuum. In case of light weight, as in many cases of the products mentioned above, high performance air-cushion support, in many cases, adopts the pressure or vacuum preloading approaches.

Currently used non-contact supporting and conveying systems that are based on air-cushions offer limited performance in many aspects. These limited performance aspects are mainly related to the relatively high mass flow or energy consumption associated with these systems, and to the accuracy performance that is directly related to the aero-mechanic stiffness of the air-cushion. The non-contact supporting and conveying equipment of the present invention that implements various types of air-cushions, employing a plurality of flow-restrictors that are functioning as a "fluidic return springs", and provide effective high-performance air-cushion support at much lower mass flow consumption with respect to conventional non-contact equipment. In particular, when using non-contact platforms where the active-area is much larger than the confronting surface of the supported object and most of the platform's active area is not cover, the use of flow restrictors provides an efficient and cost-effective non-contact platform in terms of mass flow consumption. With respect to the present invention, a flow restrictor is individually installed in each conduit of the pressure ports of the non-contact platform active-area. By active area is meant, throughout the present specification the area of the support surface where injecting ports are distributed. It is preferred, for the purposes of the present invention, to use self-adaptive segmented orifice (SASO) nozzles as the preferred flow-restrictors, so as to effectively produce the fluidic return spring effect.

PCT/IL00/00500, published as WO 01/14752, entitled APPARATUS FOR INDUCING FORCES BY FLUID INJECTION, described the SASO nozzle and its uses in non-contact supporting systems. It is a purpose of the present invention to provide, in preferred embodiment of the present invention, a novel high-performance non-contact supporting and conveying platforms based on air-cushion technology that employs the SASO nozzle as a fluidic return spring and that is capable of limiting the flow of air through these nozzles.

The self adaptive segmented orifice (SASO) flow control device comprising a fluid conduit, having an inlet and outlet, provided with two opposite sets of fins mounted on the inside of the conduit, each two fins of same set and a portion of the conduit internal wall between them defining a cavity and the fin of the opposite set positioned opposite said cavity, so that when fluid flows through the conduit substantially stationary vortices are formed in the cavities said vortex existing at least temporarily during the flow thus forming an aerodynamic blockage allowing a central core-flow between the vortices and the tips of the opposite set of fins and suppressing the flow in a one-dimensional manner, thus limiting the mass flow rate and maintaining a substantial pressure drop within the conduit. It exhibits the following characteristics of the SASO nozzle:

(a) A fluidic return spring effect is established when pressurized air is supplied at the inlet to the SASO-nozzle and the outlet is partially blocked by an objects but not closed completely, allowing air flow out of the outlet, in such a way that a potion of the supply pressure is dropped inside each of the SASO-nozzles and the remaining pressure is introduced to the air cushion, that is developed in the narrow gap between the "active surface" of that platform having the SASO-nozzle outlets and the surface of the object, thus force is applied on the object to elevate it. The pressure introduced to the air cushion is increased as the gap is decreased and is decreased as the gap is increased. If, for example, the object is supported by an air-cushion, this pressure establishes a force that balances the object's weight. The object is floating over the non-contact platform active-surface at a self-adaptive manner where, with respect to this example, the air-cushion gap is self-defined to such a levitation distance that the total forces up-wise that act on the floating object are equal to the gravity force. The fluidic return spring behavior is obtained when trying to change that balanced situation: when trying to close the gap, the pressure at the air-cushion is increased and pushes the object up to the balanced air-cushion gap, and when trying to open the gap, the pressure at the air-cushion is decreased and the gravity force pulls the object down to the balanced air-cushion gap. This simple example is given to clarify the functionality of the fluidic return spring, but in general it can be applied in various ways as will be discussed hereinafter.

(b) An aerodynamic blockage mechanism is obtained when the SASO-nozzle outlet is not closed. In fact, a SASO-nozzle has laterally large physical scales to prevent mechanical blockage by contaminating particles, and when it is totally covered (as the flow stops, the aerodynamic blockage dissipates), it introduces pressure or vacuum at the platform active surface with no losses. But, when the SASO-nozzle outlet is not closed and a through-flow exists, it has a dynamic behavior of a small orifice that is controlled by the aerodynamic blockage mechanism. This behavior is significantly important as the mass flow rate is dramatically reduced when the non-contact platform supporting or conveying a smaller in size object and a large portion of it's active surface is not covered.

The SASO-nozzle is a flow-control device that has a self-adaptive nature, based purely on aero-dynamic mechanism, with no-moving parts or any means of controls. As it has laterally large physical scales, it is not sensitive to contamination blockage. When using a plurality of SASO-nozzles to feed a well functioning air-cushion, it has a local behavior that provides homogeneous air-cushion.

BRIEF DESCRIPTION OF THE INVENTION

There is therefore provided, in accordance with a preferred embodiment of the present invention, a non-contact support platform for supporting without contact a stationary or traveling object by air-cushion induced forces, the platform comprising:

at least one of two substantially opposite support surfaces, each support surface comprising at least one of a plurality of basic cells having at least one of a plurality of pressure outlets and at least one of a plurality of air-evacuation channels at least one of a plurality of outlets, and one of a plurality of air-evacuation channels, each of the pressure outlets fluidically connected through a pressure flow restrictor to a high-pressure reservoir, the pressure outlets providing pressurized air for generating pressure induced forces, maintaining an air-cushion between the object and the support surface, the pressure flow restrictor characteristically exhibiting fluidic return spring behavior; each of said at least one of a plurality of air-evacuation channels having an inlet and outlet, the inlet kept at an ambient pressure or lower, under vacuum condition, for locally discharging mass flow, thus obtaining uniform support and local nature response.

Furthermore, in accordance with a preferred embodiment of the present invention, the pressure flow restrictor comprises a conduit, having an inlet and outlet, provided with two opposite sets of fins mounted on the inside of the conduit, each two fins of same set and a portion of the conduit internal wall between them defining a cavity and the fin of the opposite set positioned opposite said cavity, so that when fluid flows through the conduit substantially stationary vortices are formed in the cavities said vortex existing at least temporarily during the flow thus forming an aerodynamic blockage allowing a central core-flow between the vortices and the tips of the opposite set of fins and suppressing the flow in a one-dimensional manner, thus limiting mass flow rate and maintaining a substantial pressure drop within the conduit.

Furthermore, in accordance with a preferred embodiment of the present invention, said at least one of a plurality of air-evacuation channels includes an evacuation flow restrictor.

Furthermore, in accordance with a preferred embodiment of the present invention, the evacuation flow restrictor comprises a conduit, having an inlet and outlet, provided with two opposite sets of fins mounted on the inside of the conduit, each two fins of same set and a portion of the conduit internal wall between them defining a cavity and the fin of the opposite set positioned opposite said cavity, so that when fluid flows through the conduit substantially stationary vortices are formed in the cavities said vortex existing at least temporarily during the flow thus forming an aerodynamic blockage allowing a central core-flow between the vortices and the tips of the opposite set of fins and suppressing the flow in a one-dimensional manner, thus limiting mass flow rate and maintaining a substantial pressure drop within the conduit.

Furthermore, in accordance with a preferred embodiment of the present invention, the evacuation channels are fluidically connected to a vacuum reservoir.

Furthermore, in accordance with a preferred embodiment of the present invention, the vacuum flow restrictor has significantly lower aerodynamic resistance than the pressure flow restrictor.

Furthermore, in accordance with a preferred embodiment of the present invention, the vacuum flow restrictors are designed so as to lower the vacuum level to a value in the range of 70%-90% of the vacuum of the vacuum reservoir.

Furthermore, in accordance with a preferred embodiment of the present invention, the absolute value of pressure supply to the platform is larger by a factor of 1.2.-3 with respect to the absolute value of vacuum supply to the platform.

Furthermore, in accordance with a preferred embodiment of the present invention, the support surface comprises at least one of a plurality of planar surfaces.

Furthermore, in accordance with a preferred embodiment of the present invention, the support surface is flat.

Furthermore, in accordance with a preferred embodiment of the present invention, the support surface is provided with grooves.

Furthermore, in accordance with a preferred embodiment of the present invention, the support surface is cylindrically shaped.

Furthermore, in accordance with a preferred embodiment of the present invention, the support surface is substantially rectangular.

Furthermore, in accordance with a preferred embodiment of the present invention, the support surface is substantially circular.

Furthermore, in accordance with a preferred embodiment of the present invention, the support surface is constructed from plates in a layered formation.

Furthermore, in accordance with a preferred embodiment of the present invention, at least one of the plates contains a plurality of voids constructing the flow restrictors and interlayer passages for the air-evacuation channels and for pressure or vacuum supply.

Furthermore, in accordance with a preferred embodiment of the present invention, the pressure reservoir is in the form of an Integral manifold within the layered-formation.

Furthermore, in accordance with a preferred embodiment of the present invention, the evacuation channels are fluidically connected to a vacuum reservoir and the vacuum reservoir is in the form of an Integral manifold within the layered-formation, constituting a double-manifold structure.

Furthermore, in accordance with a preferred embodiment of the present invention, said at least one of a plurality of basic cells is provided in a repeated arrangement in order to provide local balance.

Furthermore, in accordance with a preferred embodiment of the present invention, the basic cell is provided in a one-dimensional repeated arrangement.

Furthermore, in accordance with a preferred embodiment of the present invention, the basic cell is provided in a two-dimensional repeated arrangement.

Furthermore, in accordance with a preferred embodiment of the present invention, the pressure flow restrictors are designed so as to reduce the pressure supplied by the pressure reservoir to a value in the range of 30%-70% of the pressure of the pressure reservoir, to be introduced through the pressure outlets to the air-cushion.

Furthermore, in accordance with a preferred embodiment of the present invention, at least one of a plurality of through-openings is provided in the support surface, for allowing access to the object for handling or processing.

Furthermore, in accordance with a preferred embodiment of the present invention, the support surface is segmented into several segments, separated by spaces.

Furthermore, in accordance with a preferred embodiment of the present invention, the evacuation channels are fluidically connected to a vacuum reservoir, and wherein pressure level in the pressure reservoir or vacuum reservoir is regulated to adjust globally levitation gap of the object over the support surface.

Furthermore, in accordance with a preferred embodiment of the present invention, the evacuation channels are fluidically connected to a vacuum reservoir, and wherein pressure level in the pressure reservoir or vacuum reservoir is regulated in at least one selected separated zone of the pressure reservoir or vacuum reservoir, in order to locally adjust t levitation gap of the object over the support surface.

Furthermore, in accordance with a preferred embodiment of the present invention, the evacuation channels are fluidically connected to a vacuum reservoir and wherein along a line of selected separated zones of the pressure reservoir the pressure is individually regulated, in order to flatten the object over the support surface along that line.

Furthermore, in accordance with a preferred embodiment of the present invention, along the line selected separated zones parallelism is maintained with respect to an independent reference.

Furthermore, in accordance with a preferred embodiment of the present invention, the selected separated zones are located at edges of the support surface to suppress edge effects.

Furthermore, in accordance with a preferred embodiment of the present invention, resolution of basic cells at edges of the support surface is higher with respect to inner zones of the support surface, in order to minimize degrading edge effects of the air-cushion.

Furthermore, in accordance with a preferred embodiment of the present invention, the basic cell comprises at least one of a plurality of evacuation grooves, serving as an air-evacuation channel.

Furthermore, in accordance with a preferred embodiment of the present invention, the basic cell comprises at least one of a plurality of evacuation vents, serving as an air-evacuation channel.

Furthermore, in accordance with a preferred embodiment of the present invention, the basic cell comprises at least one of a plurality of evacuation vents, serving as an air-evacuation channel.

Furthermore, in accordance with a preferred embodiment of the present invention, pressure outlets and evacuation channels are arranged linearly, pressure outlets aligned in lines and evacuation channels aligned in lines.

Furthermore, in accordance with a preferred embodiment of the present invention, said at least one of two substantially opposing support surfaces is oriented so that the object is to be supported below it.

Furthermore, in accordance with a preferred embodiment of the present invention, the platform is adapted to be supported or conveyed over the object, which is stationary.

Furthermore, in accordance with a preferred embodiment of the present invention, the object is a carriage and the support surface is an elongated track.

Furthermore, in accordance with a preferred embodiment of the present invention, the track is provided with rails on opposing sides of the track to limit the motion of the object to a predetermined path over the track.

Furthermore, in accordance with a preferred embodiment of the present invention, the rails comprise each a platform as claimed in Claim 1, for eliminating or greatly reducing friction forces.

Furthermore, in accordance with a preferred embodiment of the present invention, the object is a flat track and the support surface is incorporated in a carriage.

Furthermore, in accordance with a preferred embodiment of the present invention, the track is provided with rails on opposing sides of the track to limit the motion of the carriage to a predetermined path over the track.

Furthermore, in accordance with a preferred embodiment of the present invention, the ratio between the number of pressure outlets and evacuation channels is in the range of 3-16.

Furthermore, in accordance with a preferred embodiment of the present invention, gripping means are provided to be coupled to the object for holding or moving the object over the support surface.

Furthermore, in accordance with a preferred embodiment of the present invention, the gripping means comprise a gripper unit, which itself is supported with no contact by the support surface.

Furthermore, in accordance with a preferred embodiment of the present invention, the gripping means comprise a gripper unit, which itself is supported with no contact by the support surface.

Furthermore, in accordance with a preferred embodiment of the present invention, the gripping means is coupled to the object and used to convey it over the support surface sideways.

Furthermore, in accordance with a preferred embodiment of the present invention, gripping means is coupled to the object and used to convey it over the support surface in a linear motion.

Furthermore, in accordance with a preferred embodiment of the present invention, gripping means is coupled to the object and used to convey it over the support surface in a rotational motion.

Furthermore, in accordance with a preferred embodiment of the present invention, the gripping means is coupled to the support surface and the support surface is transportable.

Furthermore, in accordance with a preferred embodiment of the present invention, the platform is vertically oriented.

Furthermore, in accordance with a preferred embodiment of the present invention, the air-evacuation channels allow air to be passively discharged into ambient atmosphere.

Furthermore, in accordance with a preferred embodiment of the present invention, more flow restrictors are provided for each basic cell in order to support a heavier object and vice versa.

Furthermore, in accordance with a preferred embodiment of the present invention, the evacuation channels are placed closer to pressure outlets for supporting a very light object.

Furthermore, in accordance with a preferred embodiment of the present invention, the higher the supply pressure is provided to the pressure reservoir the smaller the risk of contact between the object and the support surface.

Furthermore, in accordance with a preferred embodiment of the present invention, the platform is designed to support an object which substantially covers the support surface, wherein the each of the air-evacuation channels is fluidically connected to a vacuum reservoir, thus generating vacuum-induced forces on the object, facilitating unilateral gripping of the object without contact by both the pressure induced forces and the vacuum induced forces, which act in opposite directions, where aerodynamic stiffness of the air-cushion is augmented by vacuum-preloading.

Furthermore, in accordance with a preferred embodiment of the present invention, the platform is designed to support an object substantially is smaller than the support surface, wherein the each of the air-evacuation channels is fluidically connected to a vacuum reservoir through a flow restrictor, thus generating vacuum-induced forces on the object, facilitating unilateral gripping of the object without contact by both the pressure induced forces and the vacuum induced forces, which act in opposite directions, where aerodynamic stiffness of the air-cushion is augmented by vacuum-preloading.

Furthermore, in accordance with a preferred embodiment of the present invention, said at least one of two substantially opposite support surfaces comprise only one support surface, and opposite it a passive surface is provided so that the object may be pressed against the passive surface without contact by aerodynamically induced forces generated by the support surface.

Furthermore, in accordance with a preferred embodiment of the present invention, the passive surface is adapted to be laterally moved.

Furthermore, in accordance with a preferred embodiment of the present invention, the passive surface is a rotatable cylinder, that can be used as a driving unit to move the object by enhanced friction forces.

Furthermore, in accordance with a preferred embodiment of the present invention, the passive surface is a vacuum table.

Furthermore, in accordance with a preferred embodiment of the present invention, there is provided a dual-sided non-contact support platform for supporting without contact an object by air-cushion induced forces, the platform comprising:

two substantially opposite support surfaces, each support surface comprising at least one of a plurality of basic cells having at least one of a plurality of pressure outlets and at least one of a plurality of air-evacuation channels at least one of a plurality of outlets, and one of a plurality of air-evacuation channels, each of the pressure outlets fluidically connected through a pressure flow restrictor to a high-pressure reservoir, the pressure outlets providing pressurized air for generating pressure induced forces, maintaining an air-cushion between the object and the support surface, the pressure flow restrictor characteristically exhibiting fluidic return spring behavior; each of said at least one of a plurality of air-evacuation channels having an inlet and outlet, the inlet kept at an ambient pressure or lower, under vacuum condition, for locally discharging mass flow, thus obtaining uniform support and local nature response.

Furthermore, in accordance with a preferred embodiment of the present invention, each of the air-evacuation channels is connected to a vacuum reservoir.

Furthermore, in accordance with a preferred embodiment of the present invention, each of the air-evacuation channels is connected to a vacuum reservoir through a vacuum flow restrictor, the vacuum flow restrictor characteristically exhibiting fluidic return spring behavior.

Furthermore, in accordance with a preferred embodiment of the present invention, the two substantially opposite support surfaces are substantially symmetrical.

Furthermore, in accordance with a preferred embodiment of the present invention, a gap between the two substantially opposite support surfaces is determined to be at least the width of anticipated object to be supported within plus twice the desired air-cushion gap.

Furthermore, in accordance with a preferred embodiment of the present invention, a preload mechanical spring is provided to adjust the gap between the two substantially opposite support surfaces in a parallel and self adaptive manner, and limit the forces induced on the two substantially opposite support surfaces to below a predetermined threshold.

Furthermore, in accordance with a preferred embodiment of the present invention, pressure supply or vacuum to one of the two substantially opposite support surfaces is different from the pressure supply or vacuum supply to the second of the two substantially opposite support surfaces, so that the levitation of the object between the two substantially opposite support surfaces may be adjusted to any desired gap in between the surfaces.

Furthermore, in accordance with a preferred embodiment of the present invention, there is provided a system for conveying without contact a substantially flat object, the system comprising:

at least one of two substantially opposite support surfaces, each support surface comprising at least one of a plurality of basic cells having at least one of a plurality of pressure outlets and at least one of a plurality of air-evacuation channels at least one of a plurality of outlets, and one of a plurality of air-evacuation channels, each of the pressure outlets fluidically connected through a pressure flow restrictor to a high-pressure reservoir, the pressure outlets providing pressurized air for generating pressure induced forces, maintaining an air-cushion between the object and the support surface, the pressure flow restrictor characteristically exhibiting fluidic return spring behavior; each of said at least one of a plurality of air-evacuation channels having an inlet and outlet, the inlet kept at an ambient pressure or lower, under vacuum condition, for locally discharging mass flow, thus obtaining uniform support and local nature response;

driving mechanism for driving the object over said at least one of two substantially opposite support surfaces;

handling means for handling the object during loading or unloading of the object onto said at least one of two substantially opposite support surfaces;

sensing means for sensing properties selected from the group of properties including: position, orientation, proximity and velocity of the object; and controller for controlling the position, orientation and traveling velocity of the object over said at least one of two substantially opposite support surfaces and communicate with a process line adjacent the system.

Furthermore, in accordance with a preferred embodiment of the present invention, loading and unloading zones are provided.

Furthermore, in accordance with a preferred embodiment of the present invention, the system comprises several one-sided types of said at least one of two substantially opposite support surfaces.

Furthermore, in accordance with a preferred embodiment of the present invention, one of the several one-sided types of said at least one of two substantially opposite support surfaces comprises a PV support surface for providing flattening of the object, where at central zone of that PV support surface a processing on the object is conducted.

Furthermore, in accordance with a preferred embodiment of the present invention, the PV support surface is provided with a relaxation zone on edges of the PV support surface having a relaxation length of about 5-15 lengths of basic cells.

Furthermore, in accordance with a preferred embodiment of the present invention, further comprising at least one of a plurality of dual-sided type of said at least one of two substantially opposite support surfaces.

Furthermore, in accordance with a preferred embodiment of the present invention, the dual-sided type of said at least one of two substantially opposite support surfaces comprising PP-type dual-sided support surfaces for high flattening performance.

Furthermore, in accordance with a preferred embodiment of the present invention, the dual-sided type of said at least one of two substantially opposite support surfaces comprising PV-type dual-sided support surfaces for high flattening performance.

BRIEF DESCRIPTION OF THE FIGURES

In order to better understand the present invention, and appreciate its practical applications, the following Figures are provided and referenced hereafter. It should be noted that the Figures are given as examples only and in no way limit the scope of the invention as defined in the appending Claims. Like components are denoted by like reference numerals.

FIG. 9e illustrates a basic PV-type non-contact platform used to hold or convey objects beneath it.

FIGS. 9f-9h illustrate some basic embodiments of carriages with active PV-type non-contact surfaces designed to be supported or conveyed over a flat track, or be suspended without contact from such track.

DETAILED DESCRIPTION OF THE INVENTION AND PREFERRED EMBODIMENTS

The significant configuration with respect to the present invention is the case where the air-cushion is provided by an "active" platform and the object over it is supported without motion or conveyed over that platform. Without derogating the generality, in most of the cases described in this specification this configuration is usually referred to, but other possible configurations where the platform is passive and the air-cushion is generated by an object having its own "active surface" generating the air-cushion are considered to be covered by the present invention. Hereinafter, this second configuration is referred to as the "active carriage configuration".

The present invention discloses novel non-contact platforms or equipments that make use of various types of air-cushions. A single aerodynamic building block links the various types of air-cushions, namely the usage of a plurality of fluidic return springs to established a high performance non-contact platform. It is asserted that for better performance of air-cushion support systems, it is important to deal with the evacuation of air from over the active surface. Without derogating the generality, the following types of air-cushions are disclosed, each handling the evacuation of air in a different manner:

Pressure-Air (PA) Type Air-cushion

According to a preferred embodiment of the present invention, PA-type air-cushion is generated using an active surface with a plurality of pressure ports, and evacuation vents, where air is allowed to evacuate into the surroundings. The PA-type air-cushion is preloaded by the object bodyweight, where an object is supported by the non-contact platform that balances the gravity forces. The PA-type platform provides non-contact support in both cases where the object, that in common cases is flat and/or thin and/or of wide-format, is stationary supported or while it conveyed by any drive mechanism. The lateral dimensions of the object are usually much larger than the dimensions of the "basic cell" of the PA-platform to be discussed hereafter. "Bodyweight preloading" means that aerodynamic stiffness (to be referred hereafter by AD-stiffness), of the PA-type air-cushion at a predetermined equilibrium floating gap (to be referred hereafter as the air-cushion nominal gap, denoted by $\epsilon_n$), depends on the object weight. "AD-stiffness" means the amount of force that is developed by the air-cushion in a self-adaptive manner, when trying to change the nominal gap (between the lower surface of the object and the active-surface of the non-contact platform). The AD-stiffness is measured, for the purposes of the present invention, in terms of $grams/cm^2/\mu m$.

Figure 1:
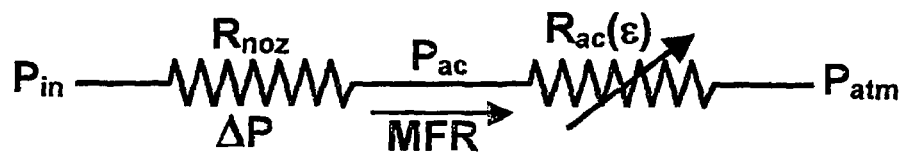
FIG. 1 illustrates an electric-circuit analogy of a PA-type air-cushion, in accordance with the present invention.
Figure 2A:
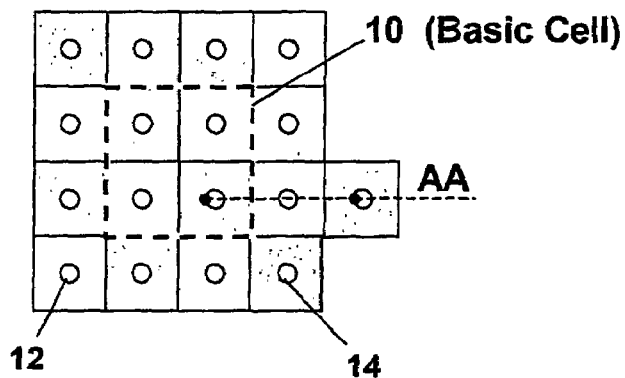
FIG. 2a illustrates a typical arrangement for a active-surface of a PA-type platform, in accordance with a preferred embodiment of the present invention.

PA-type air-cushion is generated in a narrow gap between the active surface of the platform and the supported object lower surface. The air is introduced to the air cushion by a plurality of pressure ports 12, provided with flow restrictors, preferably arranged in two dimensional manner or optionally at a mixed repeatable format with a plurality of evacuation holes 14, through which excessive air evacuates into the surrounding atmosphere. FIG. 2a shows a typical rectangular format that is very practical, and it also defines the repeatable "basic-cell" 10 of the PA-type air-cushion. The dimensions of the basic cell are selected with respect to the lateral dimensions of the object to be levitated, and in general it is desired that the resolution of the pressure ports and evacuation vents (all termed herein as holes) be such that at any given time a plurality of holes is covered by the levitated object. To obtain uniform support of local nature, it is preferable that a plurality of basic-cells will be distributed in two-dimensional manner to support the object. The PA-type air-cushion can be described by an analogous electric-circuit (where the current is the mass flow rate, the resistors are the flow-restrictors and the electricity-potential is the pressure), as shown in FIG. 1. It has to be emphasized that the "resistor-symbol" used for the flow-restrictor hereafter is only of symbolic meaning and the embodiment details of the flow-restrictors such as the preferred SASO-nozzles were described in WO 01/14782, WO 01/14752 and WO 01/19572, all incorporated herein by reference. With respect to this figure, $R_{noz}$ represents the Fluidic-Return-Spring (to be referred hereafter as FRS), flow-restrictors of the non-contact platform, and with respect to a preferred embodiment of the present invention, SASO-nozzles will be applied as the FRS flow-restrictors. $R_{ac}$ symbolized the aerodynamic-resistance (or shortly, AD-resistance), of the air-cushion, having a dynamic nature. $P_{in}$ is the supply pressure, $P_{ac}$ is the pressure introduced to the air-cushion by the flow-resistors, $P_{atm}$ is the ambient or the atmospheric pressure and $\Delta P$ is the pressure drop along the flow-restrictor $R_{noz}$. MFR is the mass flow rate. This analogy clarifies that the flow of the PA-type air-cushion is controlled by two serial flow-restrictors $R_{noz}$ and $R_{ac}$. $R_{noz}$ is a solid restrictor such as SASO-nozzle characterized by MFR that is dependent on the inlet and the outlet pressures, $P_{in}$ and $P_{ac}$. $R_{ac}$ is a restrictor that depends on (1) the aero-mechanic geometrical parameters of each specific design. It includes parameters such as the details of the flow-restrictor exit at the active-surface of the platform and the resolution of the plurality of FRS flow-restrictors (or the typical distance between neighboring flow-restrictors), (2) Operationally, $R_{ac}$ depends on the air-cushion gap in a local and a temporal, thus $R_{ac}$ is a dynamic flow-resistors whose aerodynamic resistance depends on the air-cushion gap. Accordingly, when an object faces the active-surface of the platform and an air-cushion is established, the pressure introduced to the air-cushion $P_{ac}$ as well as the MFR are also controlled by the air-cushion gap that may be off-seted dynamically by an external force or due to interaction with the object that is in motion or due to any other reason. Off-set of the air-cushion gap must be considered also in a local manner.

The functionally of the PA-type air-cushion is associated with gravity. In an undisturbed equilibrium state (see FIG. 2b, equilibrium case), where, for example, about half of the pressure supply ($P_{in}$) is introduced to the air-cushion ($P_{ac}$), and accordingly $\Delta P$ is of the similar value, the object is supported by the PA-type air-cushion at $\epsilon_n$ where the average pressure force ($\Sigma F_p$) that is developed by the air-cushion balances gravity. A practical set-up would involve pressure flow restrictors over which some 30%-70% of the supplied pressure is delivered to the active-surface, through the pressure outlets. When trying to close the gap (see FIG. 2b, off-set down case), the aerodynamic-resistance of the air-cushion ($R_{ac}$) increased, thus more pressure is introduced by the flow-restrictor $R_{noz}$ to the air-cushion, as a portion of the $\Delta P$ is discharged since MFR is reduced. Consequently, the increased $\Sigma F_p$ pushes, like a two-dimensional spring, the object up to equilibrium at $\epsilon_n$. On the other hand, when trying to open the gap, (see FIG. 2b, offset up case), the air-cushion aerodynamic-resistance ($R_{ac}$) is decreased and $P_{ac}$ decreases and MFR and $\Delta P$ are increased. Consequently, gravity pulls the object down to $\epsilon_n$. as it is a two directional behavior, but of asymmetric response, It is stated hereafter that the AD-stiffness of the PA-type air-cushion is of one-directional nature because only lifting force that is equal to the object weight is needed to take the object away from the platform but when trying to push it down to contact with the active-surface of the platform, aerodynamic counterforce that can be many times larger than the object weight is exerted by the PA-type air-cushion to ensure no contact.

A PA-type non-contact platform is preloaded by the object bodyweight. In general, as the pressure introduced to the air-cushion is higher, the AD-stiffness is intensified. It means that a well-functioning non-contact platform in terms of air-cushion stiffness, a stable and easy to-controlled platform, is obtained when the object is heavy, and relatively high pressure ($P_{ac}$), has to be introduced to the air-cushion in order to balance gravity. A "non-contact guaranteed" safety feature, may be achieved by using large pressure supply ($P_{in}$), to increase the $\Delta P$ inside the flow-restrictor $R_{noz}$, thus $R_{noz}$ must be of large AD-resistance In such an operational conditions, the potential to developed high return forces with respect to the object weight is obtained when trying to close much of the air-cushion gap. At such a large offset from $\epsilon_n$, $\Delta P$ is discharged and $P_{ac}$ is significantly increased. Consequently, large FRS forces that can be many times larger than the object weight is developed and guarantees no contact. It has to be mentioned with respect to the PA-type air-cushion that in order to relieve most of the $\Delta P$ potential to guarantee no-contact, it is not necessary to close the gap because the AD-resistance of $R_{ac}$ rapidly grows as the gap is narrowed. Typically, the nominal equilibrium floating gap ($\epsilon_n$) of PA-type air-cushion is in the range of 50-1000 µm, with respect to many of the applications mentioned herein, where the lower the desired $\epsilon_n$, the smaller the MFR supply that is needed.

When it is required to support or to convey flat and thin low-weight objects, such as wafers or FPDs, a well functioning air-cushion support must not be simply related to (ultra-light) bodyweight preloading. Such objects that are also flexible to some extent (with respect to its large lateral dimensions), typically have a bodyweight distribution of about 0.3 gram/cm$^2$ (thus an average pressure of 0.3 millibars is enough to support such a flat objects), In case of supporting printing world media, the bodyweight can be much more smaller. It means that in order to provide a well functioning non-contact platform, extremely high operational pressure with respect to object weight must be introduced to the air cushion but still the average supporting pressure should be fairly small to support such a low-weight objects. Therefore, with respect to preferred embodiments of the present invention, the "finger touch" approach is introduced to provide high performance and well functioning non-contact platform that is based on the PA-type air-cushion. The "finger touch" approach is applied by distributing evacuation holes or by creating evacuation grooves, or both, at the active-surface of the non-contact platform. The purpose of local air evacuation is to introduce the ambient pressure in close vicinity to the outlets of each of the flow-restrictors, that are evenly distributed on the non-contact platform. In such way, at nominal conditions, the pressure introduced to the air-cushion is high only at a small effective-zone around each of the flow-restrictors exits and rapidly decays in a circumferential manner, and the out-coming flow is locally evacuated to the ambient atmosphere through the closest evacuating holes. When both flow restrictors and evacuation holes (or grooves) are distributed in any well-organized manner, homogenous support is obtained. For example, it is very practical (see FIG. 2a), to use a chess-table format where the flow-restrictors are placed at the center of the (imaginary) white squares and the evacuation-holes at the center of the (imaginary) black squares. At such arrangement, the air-cushion becomes like a nail-bed having supporting fingers of high pressure and most of the active-surface of the non-contact platform is not contributing a significant support at nominal conditions.

Figure 2B:
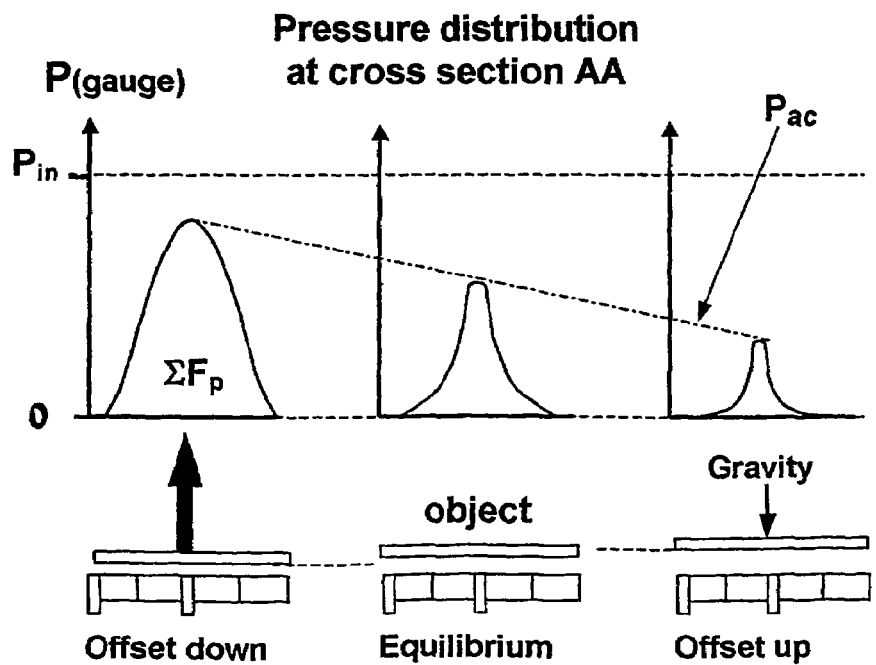
FIG. 2b is a chart illustrating the behaviour of a PA-type air-cushion.

To discuss the functionality of a PA-type air-cushion that implements the "finger touch" approach, reference is made to FIG. 2b. When applying the "finger touch" approach, AD-stiffness of the PA-type air-cushion is significantly intensified. When trying to close the air-cushion nominal gap ($\epsilon_n$) the air-cushion dynamically responds in two complementary aspects: first of all, FRS flow restrictors provides it's portion where the high $\Delta P$ of the flow-restrictor is discharged and the pressure introduced to the air cushion $P_{ac}$ is significantly increased. Simultaneously, the global effective-area (which is the contributions of all the local effective-zones around the exits of the flow-restrictors), is rapidly increased (see FIG. 2b, offset down case). The pressure extended redistribution occurs close to the outlets of the flow-restrictors, where the high pressure around the outlets occupied more area as the offset down from the $\epsilon_n$ is larger. Accordingly, AD-stiffness is significantly amplified due to both FRS flow-restrictors and pressure redistribution inside the air-cushion. The implementation of the finger-touch approach and the beneficial use of the effective-area self-adaptive response, which is associated with that approach, provide a behavior that is disassociated from the object bodyweight. In-addition, when using high pressure supply that can be as large as 100 to 1000 times more than the average pressure needed to support a low weight object (for example, $P_{in}$ can be 30 to 300 millibars for objects of bodyweight of about 0.3 gram/cm$^2$), no-contact is ensured and a stable and easy-to-control non-contact platform is obtained. It also reduces risks of local contact when the object is not perfectly flat, as it locally resists to local changes of the gap by generating extremely high upper-wise local forces. The finger touch approach is also of significant importance in case of supporting low weight objects. The finger touch approach also provides significant advantages when aiming at supporting heavy objects, in particular with respect to the safety factors of "non-contact guarantee" requirements, where the PA-type air-cushion performances must be evaluated in terms of local-nature performances.

It is important to emphasize that when applying the "finger touch" approach, the non-contact support of the PA-type air-cushion is essentially not sensitive to the object bodyweight, thus as the object weight is increased, the resulting changes in $\epsilon_n$ are small (the object slightly lowers down). A well designed non-contact PV-type platform must also fulfil the requirement for low sensitivity to the object's lateral dimensions. The PA-type platform must also function well in common cases where the object has small lateral dimensions with respect to the platform active-surface and it covers only a portion of the active-area, or when the object travels over the platform and a part (even a substantial part) of the active-surface is not covered temporarily. The PA-type air-cushion provides such a requirement where only minor changes in the $\epsilon_n$ due to insignificant lateral chances of the supply pressure $P_{in}$ when significant portion of the platform active-surface is not covered. First of all and most effective way of providing such low-sensitivity support is the use of flow-restrictors such as SASO-nozzles that prevent excessive mass flow as the already described aerodynamic blockage mechanism of the SASO-nozzles significantly limits the flow at the uncovered areas. Secondly, It is also directly connected (a) to the "finger-touch" approach that enables the working with high $P_{in}$ (b) to the use of a plurality of flow-restrictors having large AD-resistance (such as SASO-nozzles) to use large $\Delta P$. Practically, both prevent lateral gradients inside the pressure reservoir that feeds the flow-restrictors, thus each of the flow restrictors operates individually with no interactions by upstream influences on the reservoir pressure, with the other existing restrictors.

Another important feature of the Pa-type platform of the present invention is the "local-balanced" high quality support that is characterized by a uniform air-cushion support with no global effects, and self-adaptive behavior of local nature. When (a) the supported object is of a wide-format, flat and thin and optionally flexible to some extent (such as 200×180 cm FPDs or wafers), and when (b) it is intended to support or to convey such an object by a PA-type non-contact platform having a plurality of flow-restrictors such as SASO-nozzles and when (c) there is no local evacuation of flow, then the object is supported in a global malfunctioning manners. It that case, the flow can be evacuated only at the edges of the active-area, which is the actual dynamic overlapped area between the object lower surface and the active-surface of the platform, thus lateral flow from the central supporting areas must exist and accordingly the air-cushion support is inherently of non-homogenous nature. In that case (a) $P_{ac}$ developed at the central-areas is higher than the $P_{ac}$ found close to the edges of the active-areas, thus (b) when the object is flexible (in respect to its lateral dimensions), a non-uniform levitation gap of the dimensional character is established, causing the object to significantly deform convexly, as the central-area is lifted to a higher levitation gap with respect to the levitation gap at the edges of the levitated object, Accordingly (c) the AD-stiffness at central area deteriorates dramatically or even vanishes when $P_{in}=P_{ac}$, and (d) when the central area of the object is over-lifted, much more MFR is needed to maintain the air-cushion. Consequently, a malfunctioning inhomogeneous non-contact platform is obtained, a situation that may damage the levitated object, or it may not meet the requirement to keep the flatness of the object within small allowable tolerance.

According to a preferred embodiment of the present invention, a well-functioning PA-type non-contact platform can be obtained by adopting the "local balanced" approach, to be implemented by using local evacuation by holes and/or grooves. When local evacuation is established and the flow-restrictors are homogenously arranged in a repeated pattern of similar basic-cells of local nature, it provides a "local balanced" uniform PA-type air-cushion support; where as the smaller the basic-cell is, the more uniform the air-cushion characteristics are. In such a locally balanced situation, the out-coming flow from each of the flow restrictors is discharged though the neighboring evacuation elements. Accordingly, a PA-type non-contact platform designed according to the local balance approach is a well functioning air-cushion where the stiffness, the pressure, the force, and the MFR are equally distributed, as long as the dimensions of the basic-cell are substantially smaller with respect to the actual active-area excluding it's edges-area. The local balance approach provides homogeneous support with no damage to the object and a capability to keep the flatness of the object within the required tolerance.

Both the local-balance and the finger-touch approaches are implemented by making local evacuation holes or outlets. With respect to several preferred embodiments of the present invention, the basic-cell may includes (a) one evacuation vent for each of pressure port. It is very practical to use the already described chess format arrangement (see FIG. 2a). (b) more than one evacuation hole for each of pressure port (c) more than one pressure port for each of the evacuation holes. Evacuation grooves can be considered too, (d) surface grooves with ends at the edges of the active-surface platform, and/or (e) making limited number of evacuation holes inside the surface grooves. Evacuation can be achieved partly or solely through the edges of the platform's active-surfaces. (f) In general, any practical combination of evacuation holes and/or grooves and/or edge-evacuation can be considered.

With respect to another prefer embodiments of the present invention, it is an option to (a) divide the active surface of the non-contact platform (in a one-dimensional manner), into several separated elongated active surfaces thus local evacuation at internal active-surfaces can be obtained, at least partly, through the edges of each of the elongated active-surfaces. (b) The surface of the non-contact platform can be divided also in a two-dimensional manner, Where the active-surface is divided into several separated rectangular sub-surfaces, to provide internal evacuation through the edges.

The PA-type platform can be configured in any practical way. According to another prefer embodiments of the present invention, (1) It is practical to configure rectangular configuration for a non-contact PA-type platform, that can be also a section of a greater non-contact system, for example when the platform is used to support or convey FPDs, (2) PA-type platform can be provided in a circular active-surface shape to support, for example, wafers in both cases where the wafer is in rest or in rotational motion. It can be beneficial also to use a circular PA-type platform for a turning a sub-system where a rectangular object such as FPD is supported with no-contact and have it reoriented by any mechanical means.

The resolution of the basic-cell or the number of pressure ports at the platform's active-surface affects the manufacturing cost. High resolution indeed provides high level of homogenous support but the stiffness can be weakened. Therefore the resolution must be specified with respect to the lateral dimensions of the anticipated supported object, and it's elastic properties that directly relate also to it's lateral dimensions and width. Accordingly, resolution must be specified with respect to the requirements of a specific application in mind. With respect to other preferred embodiments of the present invention (a) in some cases it is recommended to increase the resolution only at only a portion of the platform active-surface to provide better performance locally, where the specification demands it, (2) it is recommended to increase the resolution close to the edges of the active-surface thus reducing the lateral scale of the edge effects (the air-cushion decays in a lateral direction that is normal to the edges), to improve edge-area performances. Typically, holes spacing in the range of 10-60 mm for the PP-type platform covers most practical applications. In another preferred embodiment of the present invention, the pressure supply to the areas that are close to the edges of the actives-surface of the PA-platform is larger from the rest of the platform in order to improve the edges' local performance. Typically, 400-2000 flow-restrictors are used per square meter and MFR of each of the flow-restrictors at pressure supply of about 100 millibars is in the range of 0.2-0.8 Nlit/min for a wide format active surface, thus the overall MFR needed is significany small with respect to operational cost-performance.

In particular, when processing is taking place while the object is supported in rest or conveyed by a PA-type platform, with respect to another prefer embodiments of the present invention, the PA-type platform active-surface can be divided into two or more sections to assist the process. The space created between two sections can be as wide as 10-100 mm across the direction of motion, usually without hurting the natural flatness of the object (depending on the elasticity of the object). Sub-surfaces can also be created in two-dimensional manner for any practical reasons, Such an inter-sections space can be useful in the following manners: (1) It becomes possible to assist the process from its bottom side as the process takes place on the top surface of the object, that may be stationary, continuously moved or move at a step-by-step motion). Assistance by any source of light for illumination or imaging, laser beam of any power, as well as heating by radiation or by hot air flow are only a few practical examples. (2) It provides an option to perform, a dual-side process, optionally simultaneous, at both the upper and the lower surfaces of the object while it is conveyed over the non-contact platform. In addition, (3) when a low-cost conveying system is considered, sectional active-surface to provide non-contact to only parts (20-60%) of the object bottom surface can be both suitable and very cost effective.

With respect to another prefer embodiments of the present invention, (a) it is possible to create a system where the object is supported or conveyed with non-contact, part of the time but at the rest of the time it changes it's functionality and becomes a vacuum table to holds down the object in-contact for any practical reasons. It can be done by introducing vacuum instead of pressure to the platform active-surface's holes. Such a system can supports or convey an object without contact, or grip the object in-contact by vacuum, objects that are much smaller than the platform's active-area, due to the aerodynamic blockage mechanism that provides by flow-restrictors such as SASO nozzles that effectively limits the MFR in uncovered active-areas. When switching back to pressure, the recommended SASO flow-restrictors rapidly limit the flow, to provide soft disconnecting process. (2) Such a soft process can be applied in vacuum tables systems as a non-contact landing and disconnecting mechanism. It is established by switching to pressure when at the loading phase, switching to vacuum for landing and holding the object in contact during the process and switching back to pressure to softly disconcert the object at the unloading phase. The switching between vacuum and pressure can be carried out rapidly, when using a low-volume integrated manifold with the pressure reservoir.

With respect to another prefer embodiment of the present invention, the high performance PA-type air-cushion can be used, for example (as a low-cost replacement to air-bearing non-contact technology that commonly makes use of several air-bearing pads), to support a heavy stage or a carrier, (frequently made of granite), usually found in the production line's process-machines found at the semiconductor industry or at the FPD fabrication lines. Operationally, The differences between the air bearings and the air-cushion are: (1) air-bearings practical floating gap is in the range of 3-20 micrometers while the PA-type air-cushion typical range is 50-1000 micrometers, thus air-bearing can be applied only when two extremely smooth confronting surfaces are involved. (2) air-bearing equipment uses high operational pressure (1-10 bars, but in many cases about 5 bars above the ambient pressure), whereas the Pa-type air-cushion operational pressure is much lower, typically in the range between 10-500 millibars. Although we consider so far only flat configurations of the PA-type platform, the active-surface with respect to such applications, can be laterally "v" shaped or of cylindrical shape (when elongated active-surface is considered), in order to established a naturally stable non-contact mechanism to avoid, in a self-adaptive aerodynamic nature, lateral movements.

With respect to another preferred embodiment of the present invention, It is an possible to use a sectorial pressure manifold where the pressure is individually controlled at each sector. It Provides local control of the pressure introduced to the air-cushion ($P_{ac}$), or alternatively speaking, it provides a mechanism to adjust the nominal gap $\epsilon_n$, thus the flatness accuracy may be locally improved. The non-contact platform can include any practical division to sectors, in an one-dimensional or two-dimensional arrangement.

Pressure-Vacuum (PV) Type Air-cushion

According to a preferred embodiment of the present invention, PV-type air-cushion is generated using an active surface with a plurality of pressure ports, and evacuation outlets connected to a vacuum source, thus excessive air is evacuated by that vacuum.

According to another preferred embodiment of the non-contact platform of the present invention, the PV-type air-cushion is introduced. It is a vacuum preloaded air-cushion where the object is accurately supported in rest or conveyed while gripped by the PV-type air-cushion. The AD-stiffness of the PV-type air-cushion is inherently of bi-directional nature and it may not be depended on the object bodyweight. Bi-directional stiffness means that in both cases when trying to push the abject toward the active-surface of the non-contact platform or when trying to pull it away from that surface, AD-forces that can be much larger than the object bodyweight force the object back, in a self-adaptive manner, to the equilibrium nominal gap. The object dimensions can be much smaller than the active-surface of the platform. Accordingly we shell refer to the expression active-area as the area on the active-surface of the platform where the object subsists.

Figure 4A:
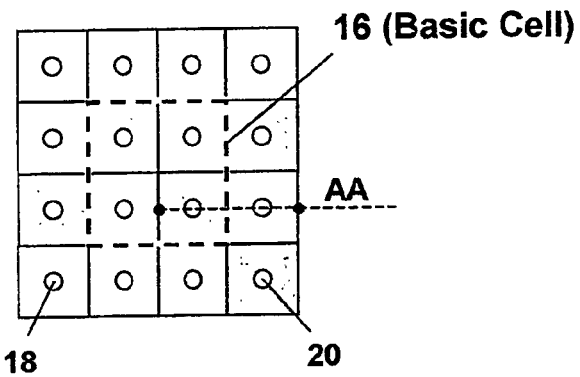
FIG. 4a illustrates a typical arrangement for the active-surface of the PV-type platform.

PV-type air-cushion generally includes two types of conduits, frequently arranged in a repeatable chess-table format above the active surface of the non-contact platform as shown in FIG. 4a, where outlets of pressure conduits 18 are placed at the center of each of the white squares and one outlets of vacuum suction conduits 20 are placed at the center of each of the black squares. The repeated "basic cell" 16 of the PV-type non-contact platform is also shown in this figure. The pressure conduits are always individually equipped with flow-restrictors, preferably SASO-nozzles, to provide the FRS local behavior of the non-contact platform and to secure, by implementing the aerodynamic blockage mechanism, the uniformity of pressure supply in cases where the active surface of the platform is not fully covered. the vacuum conduits are simple cylindrical hole or Optionally, they may also equipped with an individual flow-restrictors such as SASO-nozzles, but it must be of much lower AD-resistance with respect to the pressure flow-restrictors, in order to secure the vacuum level by aerodynamic blockage mechanism in uncovered areas.

The pressure distribution of the PV-type air-cushion is aligned with the chess-table format arrangement of the pressure and vacuum conduits distributed over the active-surface of the PV-type platform. When the facing surface of gripped object confronts the horizontal active-surface of PA-type platform in a small nominal gap ($\epsilon_n$), and PV-type air-cushion is established, the pressure is distributed around the oprts of the pressure conduit and the vacuum is distributed around the outlets of the vacuum ports. Accordingly two opposing forces grips the object and the difference between them balances the object weight. Due to the effective use of different AD-resistance for the pressure and the vacuum conduits, PV-type air-cushion is characterized by different ranges of influence away from the active-surface, where the global force induced by the pressure ($\Sigma F_p$) has a shorter range of influence and the opposing global force induced by the vacuum ($\Sigma F_v$) has a longer range of influence. With respect to a preferred embodiment of the present invention, the PV-type non-contact platform provides such an uneven range of influence, and it is the essential operational mode for the PV-type air-cushion. Although the PV-type platform induces forces from only one side, it grips, in fact, the object in a two-directional manner and resists aerodynamically to any (up or down) offset from $\epsilon_n$ in as self-adaptive and local manner. This significant behavior is the important character of that non-contact platform, and it stands in both cases, whether the vacuum conduit is equipped with a flow-restrictor or not, because in both cases the AD-resistance of the vacuum conduits is much lower than the AD-resistance of the pressure conduits that are unconditionally equipped with a flow-restrictor such as SASO nozzle. It has to be emphasized that the bi-directional behavior provides bi-directional AD-stiffness, to be the essential and the most important property PV-type air-cushion.

Figure 3:
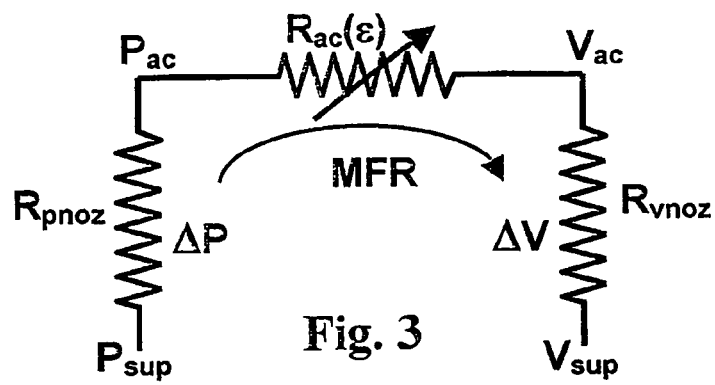
FIG. 3 illustrates an electric-circuit analogy of a PV-type air-cushion, in accordance with a preferred embodiment of the present invention.

PV-type air-cushion can be analogously described by an electric-circuit (see FIG. 3). $R_{noz}$ represents the FRS flow-restrictors, which are preferably SASO-nozzles, $R_{ac}$ symbolized the dynamic AD-resistance of the narrow air-cushion, $R_{vnoz}$ represents the vacuum flow-restrictors (preferably SASO-nozzles) optionally provided inside the vacuum conduits. $P_{sup}$ is the supply pressure and $P_{ac}$ is the pressure introduced to the air-cushion. $V_{sup}$ is the supply vacuum and $V_{ac}$ is the vacuum introduced to the air-cushion. MFR is the mass flow rate. $\Delta P$ is the pressure drop along the restrictor $R_{pnoz}$. $\Delta V$ is the vacuum drop along the restrictor $R_{vnoz}$ if exists (and if not $\Delta V=0$). This analogy clearly indicates that the flow of the PV-type air cushion is controlled by three serial flow restrictors $R_{pnoz}$, $R_{ac}$ and, optionally, $R_{vnoz}$, $R_{pnoz}$ and $R_{vnoz}$ are different solid flow-restrictors such as SASO-nozzles of different characteristics (means a MFR that is depended on $P_{sup}$ and $P_{ac}$ at the pressure side and on $V_{sup}$ and $V_{ac}$ at the vacuum side). As the through MFR are the same, $\Delta P$ and $\Delta V$ are dynamically adjusted in a self-adaptive manner to obey the requirement for continuity. $R_{ac}$ is a flow-restrictor that depends on the dynamic air-cushion gap $\epsilon$. (for more details see the relevant text on the PA-type air-cushion). Accordingly, $R_{ac}$ is a dynamic flow-resistor whose AD-resistance depends on the air-cushion gap, and when an air-cushion is established, the pressure and the vacuum introduced to the air cushion, as well as the MFR, are also controlled by $\epsilon$ which is also the gap between the active surface of the platform and the confronting surfaces of the supported object.

It is possible to provide a flow restrictor in the air-evacuation vents which are fluidically connected to the ambient atmospheric pressure, without connecting it to a vacuum source, thus in effect the pressure of the air-cushion and hence the lifting force under the object are increased. It would be natural to call these flow restrictors "air-evacuation flow restrictors", but in order to simplify the term "vacuum flow restrictor is used throughout this specification to refer to air-evacuation flow restrictors too.

According to a preferred embodiment of the PV-type platform, the functionality of the PV-type air-cushion may not be related to gravity. In an equilibrium gripping state ($\epsilon_n$), the object is supported by the PV-type air-cushion where the total pressure forces ($\Sigma F_p$), which are developed around each outlet of the pressure restrictors $R_{pnoz}$ (preferably SASO nozzles), are of the same order of magnitude as the total opposing vacuum forces ($\Sigma F_v$) that are developed around each outlet of the vacuum conduits, which may optionally be equipped with different flow-restrictors $R_{vnoz}$ (but preferably SASO nozzles). Both opposing forces may by larger by a factor of 10 or 100 and more from the object bodyweight, and the differential force ($\Sigma F_p - \Sigma F_v$) balances the gravity. In such magnitudes, the functionality of the PV-type air-cushion, with respect to AD-stiffness and accordingly to the flatness accuracy performances, is disassociated form the object weight. It has to be emphasize again that the PV-type air-cushion has essentially bi-directional AD-stiffness that does not depend on the object weight, and it is a most important property of the PV-type platform, for it means that in both cases when trying to push the object towards the active-surface of the platform or when trying to pull it away, opposing aerodynamic forces are developed by the air-cushion in a self adaptive and local manner to return it to its equilibrium position.

According to a preferred configurations of the present invention, the PV-type platform can be configured in the following orientation with respect to the direction of gravity: (a) A horizontally oriented object can be gripped from its bottom side by a horizontal active-surface of the PV-type platform, which is based on the PV-type air-cushion, where ($\Sigma F_p - \Sigma F_v$) balances the object weight, (b) A horizontally oriented object can be gripped form it's upper side by a horizontal active-surface of the platform above the object, where the ($\Sigma F_v - \Sigma F_p$) balances the object weight. It is also possible (c) to grip the object in a close gap to the active surface of the non-contact PV-type platform when the object's facing surface is not horizontally oriented or is even vertically oriented with respect to gravity.

In order to understand the equilibrium state of the PV-type air-cushion reference is made to the configuration where the object is gripped from its bottom side by the PV-type platform, equipped with a plurality of both pressure and vacuum (possibly different) flow-restrictors, distributed at a staggering chess-table format as shown in FIG. 4a. The flow is introduced to the air-cushion at a pressure $P_{ac}$ through the outlets of the pressure flow-restrictors, which are preferably SASO nozzles, placed in the white squares and the vacuum $V_{ac}$ sucks air off the surface through the outlets of the vacuum conduits equipped with flow-restrictors, which are, again, preferably SASO nozzles, placed at the black squares. At equilibrium state, (see FIG. 4b, equilibrium case), the introduced pressure and vacuum ($P_{ac}$ and $V_{ac}$) are almost the same and distributed almost equally thus occupying similar effective-area. Yet, the differential lifting force ($\Sigma F_p - \Sigma F_v$) balances the object weight. Hence the PV-platform performance is disassociated from the object bodyweight, and $\Sigma F_p$ and $\Sigma F_v$ can be substantially greater than the gravity force.

Figure 4B:
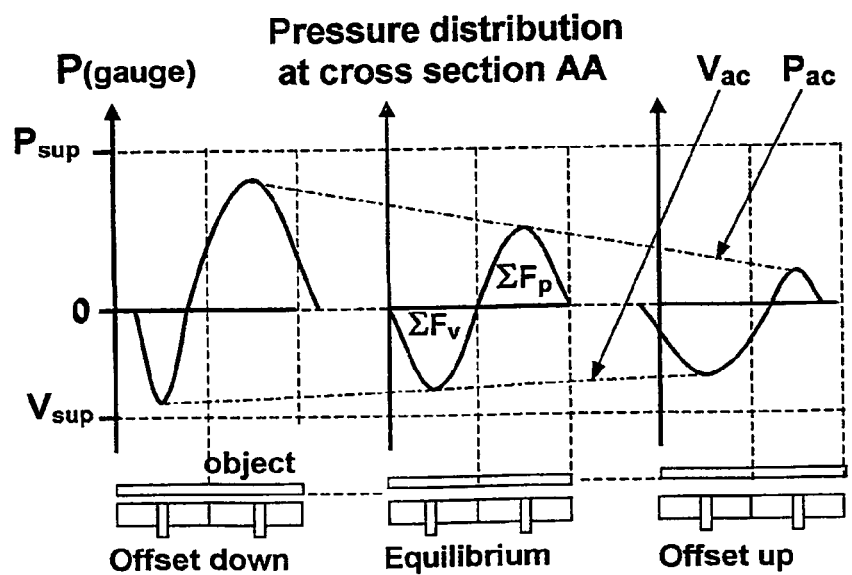
FIG. 4b illustrates the functionality of the PV-type air-cushion

The dynamic characteristics of the PV-type air-cushion will be explain hereafter with respect to FIG. 4b, illustrating the pressure distribution along cross-section AA (see FIG. 4a) in three different states—offset down, equilibrium and offset up. When trying to close the PV-type air-cushion nominal gap $\epsilon_n$, the AD-resistance of the air-cushion ($R_{ac}$) increases, reducing the MFR, thus more pressure is introduced to the air-cushion by the flow-restrictor $R_{pnoz}$, as a portion of the $\Delta P$ is discharged. Unfortunately, the vacuum introduced to the air-cushion by $R_{vnoz}$ also increases as a portion of the $\Delta V$ is discharged. Consequently, a situation where a similar, potentially equal, increase in both the $\Sigma F_p$ and the $\Sigma F_v$ can be obtained, resulting with a degenerate PV-type non-contact platform with no AD-stiffness. Therefore, with respect to a preferred embodiment of the present invention, the AD-resistance of flow-restrictor $R_{pnoz}$ must be significantly larger than the AD-resistance of the flow-restrictor $R_{vnoz}$. Accordingly, with respect to the MFR, $\Delta V$ must be much smaller than $\Delta P$. For-example, if a well functioning PV-type air-cushion is operated at a typical $P_{sup}$=200 milibar and half of it is introduced to the air cushion (thus $P_{ac}$=100 milibar and $\Delta P$=100 milibar), in order to provide high AD-stiffness at $\Sigma_n$, the introduced vacuum $V_{ac}$=100 milibar (under the assumption that the both counter-forces are almost equally distributed), and in order to provide a well-functioning PV-type air cushion, the value $\Delta V$ must be not more than half of the value of $\Delta P$, and preferably 10%-30%. Practical value is $\Delta V$=20 milibar with respect to the example and accordingly $V_{sup}$=120 milibar. Accordingly, the absolute value of the pressure supply may be larger by a factor of 1.2.-3 with respect to the absolute value of the vacuum supply. When using different aerodynamic resistance for $R_{pnoz}$ and $R_{vnoz}$, preferably two different SASO nozzles, and when trying to offset $\epsilon_n$ (up or down), the pressure becomes more sensitive to such offsets with respect to the vacuum sensitivity. As the vacuum flow-restrictor is responsible for deteriorating the air-cushion performance, providing flow-restrictors at the vacuum conduits is necessary only when it is needed to avoid vacuum losses and waste of MFR (by applying the aerodynamic blockage mechanism when SASO nozzle are used), in cases where the active-surface of the platform is not-fully covered at least during a potion of the operational time. Therefore, if the active-surface of the PV-type platform is fully covered and if there are no restrictions attributed to the process or the loading and unloading phases, it is suggested, according to another preferred embodiment of the present invention, not to use flow-restrictors for the vacuum suction restrictors, The use of FRS SASO-nozzles (where the self-adaptive aerodynamic blockage mechanism is applied), for the pressure flow-restrictors $R_{pnoz}$, also avoids pressure losses and waste of MFR. And it is another good reason to work with SAOS-nozzles.

the rationale behind using different flow-restrictors for the pressure and the vacuum conduits was already explained hereinabove. the dynamic characteristics of a well functioning PV-type platform will be described hereafter with respect to FIG. 4b. The dynamic behavior of the PV-type air-cushion is controlled by the gap $\epsilon$. The AD-resistance of $R_{ac}$ is very sensitive to changes in $\epsilon$. Accordingly, changes occur in the introduced pressure ($P_{ac}$) and vacuum ($V_{ac}$), and in the pressure distribution inside the air-cushion. In particular, the changes in the internal pressure distribution contribute significantly to amplification of the AD-stiffness. When the PV-type air-cushion grips and supports an object at the nominal equilibrium gap $\epsilon_n$, and with respect to a preferred operational mode of the present invention, it operates at even operational conditions, the value of $P_{ac}$ is almost similar to the value $V_{ac}$ and the area occupied by the pressure lifting forces $\Sigma F_p$ is almost equal to the area occupied by the holding down vacuum forces $\Sigma F_v$, as shown in FIG. 4b, equilibrium case. In such an even situation, and when $\Sigma F_p$ and $\Sigma F_v$ are both greater many times more with respect to the object weight, the differential lifting force ($\Sigma F_p - \Sigma F_v$) stably supports the gripped object weight, which is levitated with high flatness accuracy at $\epsilon_n$.

When trying to close the PV-type air-cushion gap $\epsilon_n$ (see FIG. 4b, offset down case), the AD-resistance of the air-cushion ($R_{ac}$) increases reducing the MFR, thus significantly more pressure $P_{ac}$ is introduced by $R_{pnoz}$ as a portion of the $\Delta P$ is discharged, and the vacuum $V_{ac}$ introduced by $R_{vnoz}$ is only slightly increased as a portion of the $\Delta V$ discharged. This favorable uneven changes occur when the AD-resistance of pressure flow-restrictor $R_{pnoz}$ is significantly larger than the AD-resistance of vacuum flow-restrictor $R_{vnoz}$, and accordingly $\Delta P$ is much larger than $\Delta V$, where both $\Delta P$ and $\Delta V$ may be referred to as a pressure-potential—to be optionally delivered to the air-cushion. Simultaneously rapid changes with the air-cushion pressure distribution take place, where the area occupied by the lifting pressure forces $\Sigma F_p$ significantly increases and accordingly the area occupied by the holding down vacuum forces $\Sigma F_v$ significantly decreases as shown in the figure. Consequently high FRS forces push the object up, back to the $\epsilon_n$. On the contrary (see FIG. 4b, offset up case), when trying to open the PV-type air-cushion gap and create an up-wise offset from $\epsilon_n$, the AD-resistance of the air-cushion ($R_{ac}$) decreases and the MFR increases, thus significantly less pressure $P_{ac}$ is introduced by $R_{pnoz}$ as $\Delta P$ is increased, and the vacuum $V_{ac}$ introduced by $R_{vnoz}$ is only slightly increased as $\Delta V$ slightly decreases. Simultaneously significant changes with the pressure distribution take place, where the area that is occupied by the pressure forces $\Sigma F_p$ significantly decreases and accordingly the area that is occupied by the vacuum forces $\Sigma F_v$ significantly increases as shown in the figure. Consequently, high FRS forces pull the object down, back to the $\epsilon_n$. It has to be emphasized that the FRS forces are of self-adaptive and local nature.

The active-surface of the PV-type non-contact platform is provided with both a plurality of pressure flow-restrictors to introduced the air to the air-cushion, and vacuum conduits, optionally equipped with different flow-restrictors, to suck the out-coming flow. Optionally, both are arranged in a chess-table repeatable format. In such a case, the PV-type air-cushion is inherently of local balance nature. Accordingly, uniform gripping in all aspects of performance are naturally provided, thus no-global effect occurs. Therefore it is available to provide a PV-type non-contact platform as wide as needed to grip an object of extremely large dimensions as it is accurately supported at rest or conveyed by any drive system. It has to be emphasized that the local nature and the uniformity are valid as long as the dimensions of the basic-cell (see FIG. 4a), of the PV-type air-cushion are significantly smaller with respect to object lateral dimensions, and the locality and uniformity are no-longer valid at areas that are close to the edges of the active surface of the platform. In order to reduce the damage of edge effects, with respect to another preferred embodiment of the present invention, it is favorable to increase the resolution (i.e. increase the density of holes) near the edges of that active-surface thus reducing the edge effects on a lateral scale (the air-cushion decays in a direction that is normal to the edges). Similarly, according to another preferred embodiment of the present invention, a differentiation will be made in the pressure manifold and the pressure supply to areas that are close to the edges of the actives-surface, will be larger than the pressure supply to internal areas of the PV-type platform.

By implementation of vacuum preloading, the PV-type air-cushion provides an AD-stiffness of bi-directional nature, and it opposes, in a self adaptive and local manner, any changes in $\epsilon_n$, both when trying to push it towards, or when trying to pick it away from a horizontal active-surface of the non-contact platform. In order to provide accurate floating flatness, since the air-cushion support follows the active-surface in common cases where the objects are of wide-format and flexible with respect to its width and lateral dimensions, the platform active-surface must preferably be flat and manufactured with respect to the required tolerances. If the object is rigid, the platform tolerances are averages, but the risk of local contact may increase. Furthermore, a uniform air-cushion floating gap is to be obtained by providing high AD-stiffness. Two straightforward parameters affect the stiffness (a) as the pressure supply is higher and accordingly the MFR intensified, higher AD-stiffness is obtained. Without derogating the generality, practical values of pressure supply are 50-1000 millibars and accordingly the practical vacuum level will be as much as half of the pressure level (b) as the predetermined $\epsilon_n$ is smaller, higher AD-flatness and accordingly increased flatness accuracy are obtained. Practically (for many of the applications mentioned hereinabove) $\epsilon_n$ is in the range of 10-200 micrometers.

Typically, as the object to be supported is of large dimensions, or it is not elastic and when moderate accuracy is needed, $\epsilon_n$ and also the basic-cell dimensions may be larger (less resolution). If the object is of small dimensions or it is elastic or when high flatness accuracy is needed, narrower $\epsilon_n$ and smaller basic-cell dimensions (less resolution) may be used. It has to be emphasized, that the smaller the basic cell is, the higher the uniformity of the non-contact PV-type platform and vise-versa. With respect to other preferred embodiments of the present invention, (1) practical dimension of the basic cell that typically includes four squares as shown in the figures are between 12×12 mm to 64×64 mm. (2) It is also an option that the two dimensions of the basic cell may not be of the same lengths. (3) It is also an option that the basic cell will be of small dimensions in a restricted areas where high performance is required with respect to high flatness accuracy, AD-stiffness and uniformity, whereas in other areas the density be smaller. (4) It is also very practical to use different aspect ratio for the basic cells close to the edges of the active area, and to provide fine resolution to improve the local performance at the edges of the non-contact platform.

To obtain optimal performance, global aero-mechanic design of the non-contact platform must be pedantically executed. With respect to a preferred operational mode of the PV-type non-contact platform of the present invention, The aero-mechanic design takes into account (1) the operational conditions and the available MFR. (2) the characteristics of the flow-restrictors involved (in terms of the MFR vs. the input and the output pressure). (3) geometrical parameters such as the resolution or the dimensions of PV-type air-cushion basic cell and the details of the outlets of both the vacuum and the pressure conduits.

A PV-type air-cushion of high aerodynamic stiffness performance is created by two complementary components: (a) the use of a plurality of pressure flow-restrictors, preferably SASO nozzles, serving as a FRS, to produce opposing forces of self-adaptive and a local nature, by rapidly increasing/decreasing the pressure introduced to the PV-type air-cushion, (the vacuum flow-resistors, if exist, reduce the AD-stiffness). (b) generating extreme changes in the air-cushion pressure distribution when offsets up or down in $\epsilon_n$ occur. Although the implementation of FRS provides high AD-stiffness, extreme lateral changes of the pressure distribution inside the air-cushion provide a potential to intensify the stiffness by a factor in a range of 2-5. A well functioning high performance PV-type air-cushion is obtained as the AD-stiffness is large enough to provide high accuracy in terms of small floating gap tolerances ($\Delta\epsilon_n$). If also the active surface is flat within small tolerances, the PV-type platform provides non-contact gripping at high flatness accuracy when an object that is not rigid supported at rest or as it conveyed by any drive system. The key point for providing optimized PV-type air-cushion with respect to flatness accuracy is to guarantee as much as deeded AD-stiffness with respect to specific requirements for flatness, and to provide it by using as less as possible MFR. According to different considerations, higher stiffness that can provides uniform and accurate $\epsilon_n$ can replace demanding manufacturing tolerances for the platform. Typical values for the PV-type air-cushion stiffness are in the range of 3-60 gram/cm$^2$/μm, and if thin objects like wafers or FPDs are supported or conveyed, a return forces of local nature that are 10 to 200 times greater than the object distributed bodyweight, are developed in a vertical translation (up or down) of only 1 μm.

The dependence of the AD-stiffness with $\epsilon$, with respect to a specific aero-mechanic design of a PV-type air-cushion is characterized by an optimum that is designed to be at the $\epsilon_n$. Accordingly, the AD-stiffness decays both at wider and narrower gaps. In particular, when closing the gap, the AD-stiffness vanishes before the gap is totally closed thus additional movements toward the active surface will not result in increase of the fluidic return forces. It is important to identify such behavior, to reduce the risk of contact that can be also of local nature and to guarantee no-contact in critical cases, where the object is subjected to external forces, including forces that are associated with accelerated motion of the gripped object, or in cases where the object is instantly subjected to additional weight, cases where a transitional process from one equilibrium state to another occurs. Furthermore, the object may also be subjected to local enforcement where only a restricted zone is disturbed, it is important especially when the object is thin and of wide dimensions and accordingly flexible, where the transitional process can be of three-dimensional nature. Therefore, a well functioning and effective PV-type platform must operate at optimal conditions to provide high performances of local nature.

When it is required to support or to convey without contact flat and thin low-weight objects, such as wafers or FPDs, at extremely high flatness accuracy, the inherently local-balanced PV-type air-cushion is suited for the task. Such low-weight flat and thin objects can be also flexible to some extent (with respect to their large lateral dimensions), typically have a distributed bodyweight of about 0.3 gram/cm$^2$. and In case of supporting printing media the bodyweight can be much smaller. For example, when the active-surface platform is perfectly flat and when applying high performance PV-type air-cushion, it is possible to support with no-contact a 300 mm (in diameter) wafer with an overall flatness accuracy of less than 1 μm, hovering at $\epsilon_n$=20 μm. When using wide-format (50×180 cm) PV-type platform, it is very expensive to provide perfect manufacturing flatness for the active-surface PV-type platform, to be optionally used to support in rest or to convey wide-format object, such as FPDs, during various production stations. It is feasible to reach an overall operational flatness of 10-50 μm, where half of it or less is contributed by the air-cushion itself. Furthermore, in many cases, the manufacturing process or quality control inspection of FPDs or wafers are performed along a thin line, thus flatness is essentially needed only along this line that is orthogonal to the direction of motion. It can be a linear motion for FPD and rotational motion for wafers. When accurate flatness is practically needed in a one-dimensional aspect, it is preferable, with respect to a preferred embodiment of the present invention to spend much effort in a close restricted area along the "process line" to improve the flatness accuracy. It can be done by providing more input pressure and/or by reducing the basic-cell dimensions close to the "process line". Such passive means to improve locally the PV-type air-cushion performances with respect to flatness accuracy, can be obtained only by mechanical setup, such as to provide different pressure and vacuum manifolds for the elongated accurate-zone and/or by changing the flow-restrictors type, and/or by changing locally the resolution, etc. It is straightforward that high flatness performance may be needed also in a restricted small zone of two-dimensional character (rectangular or round zone). In such cases, high performance can be provided in restricted zone by adopting similar measures that are taken to locally improve performances at the "process-line" case.

According to another preferred embodiment of the present invention, it is suggested to provide setting-screws along the "process-line" to regulate locally the flatness of the active-surface of the PV-type platform. Furthermore, according to another preferred embodiment of the present invention, it is suggested to create a separate pressure/vacuum manifolds to provide different conditions at the "process-line" of the platform, and in addition to divide the manifolds into several sections where at each of the sub-manifolds, a slightly different pressure (or vacuum) will be set in order to provide by purely aerodynamic means a compensation technique for improving the flatness along the process line. In such a technique, when an object such as FPD, is floating higher than allowed in a restricted zone along the "process line", more vacuum or less pressure with respect to the nominal values will be adjusted and as a result, the object will be pulled down at this restricted zone in order to be gripped within the allowed tolerance, and if, on the contrary, such an object is floating lower than allowed in other restricted zone along the "process line", less vacuum or more pressure with respect to the nominal values will be applied and as a result, the object will be pushed up at this restricted zone in order to be gripped within the allowed tolerance. Such an active flatness adjustment mechanism can compensate also offset of manufacturing tolerances, It can be done at any time, particularly just after the platform is assembled at the manufacturing site, and occasionally during routine service operations. The flatness adjustment may be also done with respect to the process machine active component that also may be not flat, or it may move not accurately. In such a case it is possible to compensate also this non-flatness and provide extremely high accuracy it terms of parallelism. This aerodynamic compensation technique can be also implemented in a two-dimensional regional manner if needed.

In common cases, objects such as wafers, FPDs and inner PCB layers, are thin and flexible with respect to their lateral large dimension (wafers' typical thickness is 0.7 mm having a diameter of up to 300 mm, and FPDs typical thickness is 0.5 mm having a length of up to 200 cm). When A process takes place, while such objects are gripped and remain at rest or conveyed by the PV-type platform, an homogenous support of local balance nature must be provided in order to avoid large scale deformations and to keep the required flatness accuracy within the allowed tolerance. As mentioned before, the PV-type air cushion exhibits inherently a "local balance" nature. It is common that such large and thin objects are not perfectly flat. In such cases, the PV-type air cushion provides another important feature: it has the ability to grip and to flatten with no-contact non-flat thin objects. The potential to flatten non-flat objects depends on the elasticity of the objects, but in the cases of the objects mentioned above, it is feasible to flatten such thin objects that have non-flatness tolerances similar in scale to the PV-type air-cushion gap. The non-contact mechanism of flattening by the PV-type platform becomes available due to the presence of opposing forces that allow the production of pure flattening moments of local nature (see more details about flattening by pure moments when it discussed with respect to the PP-type platform). Although the PP-type platform to be discussed hereafter provides much more flattening performance, the PV-type is a one-sided non-contact platform and when high accuracy is required, and only small non-flatness is allowed, the PV-type air-cushion support can provide adequate flattening mechanism to improve the overall flatness accuracy of the non-contact PV-type platform.

In order to improve the flattening performance, an alternating arrangement by rows can be applied where the pressure flow-restrictors, preferably SASO nozzles, are placed along one set of parallel lines and the vacuum conduits, optionally equipped with low AD-resistance flow-restrictors, such as another set of different SASO nozzles, are placed along a second set of parallel lines, lapped equally in between the pressure flow-restrictors set of lines on the platform active-surface. With respect to another preferred embodiment of the present invention, it is an option to connect the conduits outlets of each of the lines (both for the pressure lines and the vacuum lines) by surface grooves to improve the flattening performances. This line-PV-type air-cushion of one-dimensional format provides non-contact platform with better a flattening performance in lateral direction, which is substantially not perpendicular to the lines, and with optimum performance in a direction that is parallel to the flow-restrictors lines. It has to be mentioned that the flattening mechanism is of local nature, self adaptive and dynamic.

There are many different options to apply the inherently local-balanced PV-air cushion, with respect to preferred embodiments of the present invention, distinction has already been made between (a1) a PV-type air-cushion that equipped with vacuum flow-restrictors when it is intended to stationary support or to convey objects when the active-surface is not fully covered for at least part of the time, and (a2) a case where it is beneficial (more stiffness, lower manufacturing cost), not to use vacuum flow-restrictors when the active-surface of the platform is fully covers. Another distinction made between (b1) a (common) case of supporting a horizontal object from its bottom side, (b2) a case of gripping a horizontal object with no contact from its upper side, and (b3) holding objects that are vertically oriented or not oriented at all with respect to gravity.

Further distinctions made between (c1) the possibility of using different aspect-ratios for the basic cell of the PV-air-cushion, to enhance performances at the edges of the active-area, and here it is extended also to (c2) any practical arrangement of basic cells that can be also non-repeatable in a spatial manner. It includes practical arrangements on the active area where the number of pressure conduits provided is different from the number of vacuum conduits. It is also possible to apply the vacuum preloading PV-type air-cushion in a circular format where the vacuum and the pressure outlets are distributed in a circular plan of a cylindrical coordinate system. Circular distribution is practical in cases where the active-surface of the PV-type platform is round and of relatively small dimensions.

Although we considered only flat surfaces so far, there is no restriction to create any practical active surface that is not flat. A typical example is to shape a spherical active surface in order to grip spherical optical component, or a "V" shaped elongated active area to provide a conveying line where a carriage with similar "V" shape bottom surface can move in one horizontal direction with no lateral or rotational motion on top of such PV-type "slider" and secure the vertical direction. In fact, any practical side active surfaces can be implemented when the object is supported from its bottom side or alternatively, when the PV-type air-cushion is applied upside-down. In addition separated "side" active-surfaces can be applied to limit lateral or rotational movements with no-contact.

When accuracy is not a major concern, it is possible, with respect to another preferred embodiment of the present invention, to divide the active surface of the PV-type platform in a one-dimensional manner into several separated elongated active-surfaces at a lateral width of one or few "basic cells" dimensions, to reduce costs, MFR and platform bodyweight, or alternatively, it is also possible, for the same reasons, to divide the active surface in a two-dimensional manner into several separated rectangular or round sub-surfaces. When dividing a supporting platform, attention must be made to the risk of contact between the object, which may be flexible, and the edges of the sub-surfaces due to gravity, thus it must be done with respect to the elasticity of the anticipated levitated object. In the case of upper gripping, this risk does not exist, but a risk of disconnecting due to large downwards deformations at the areas between the sub-surfaces must be avoided, in order to provide a secured non-contact upper gripping and conveying.

With respect to the preferred operational conditions of the present invention, the PV-type air cushion at (d1) an even equilibrium as already presented, where the pressure level $P_{ac}$ is almost equal to the vacuum level $V_{ac}$ and the area occupied by the pressure is almost equal to the area occupied by the vacuum, and both are similarly distributed. Here it is extended also to additional two equilibrium states: (d2) an operational condition where the pressure level $P_{ac}$ is much larger (practically up to a factor of 2), than the vacuum level $V_{ac}$, and thus the area occupied by the pressure is much smaller than the area occupied by the vacuum, and both may not be similarly distributed, (d3) an operational condition where the vacuum level $V_{ac}$ is much larger (practically up to a factor of 2) than the pressure level $P_{ac}$ and thus the area occupied by the vacuum is smaller than the area occupied by the pressure and both may not similarly distributed. These unequal operational condition can beneficently be applied with respect to specific applications. for example, using more pressure to avoid local contacts when the object is supported at rest, or conveyed and subjected to top-surface forces that may be connected to the manufacturing process, or use more vacuum to secures the non-contact gripping of objects from the upper side.

Although the PV-type platform can provide accurate support, and it may also be used in cases where accuracy is not essential, and safe non-contact gripping of local is the essential requirements. It is relevant for many applications of the present invention such as (1) supporting or conveying with no-contact flat objects, such as FPD from its upper side, where the main concern is to secure the object from falling down, (2) securing non-contact gripping of handling tools for flat objects, such as wafers or FPDs, where accelerated motion is involved, (3) supporting or conveying with no-contact flat objects, such as wafers or FPDs, during the alignment or cleaning processes, (4) using limited size PV-type air-cushion at the top of landing pins to provide non-contact landing mechanism during the loading and the unloading sequences of flat objects such as wafers, FPDs or PCBs.

When it is needed to convey at extremely accurate flat thin and wide format objects such as FPD (typical current dimensions are up to 180×200 cm), and the flatness accuracy is limited to a small zone, or to an elongated narrow zone, where the process takes place, the non-contact platform incorporates PV-type with PA-type air-cushions in order to provide cost-effective non-contact platform, where (a) In case of elongated processing zone, such as coating or inspection, where the object is transferred linearly during the process in a lateral direction normal to the elongated processing zone, a PV-type air-cushion is used to provide local high performance and flatness accuracy at an area that is close to the elongated processing zone, but with marginal area to provide relaxation of disturbances induced by outer zone, and when the $\epsilon_n$ of the two types of air-cushion is not the same, but at the much larger outer supporting areas, before and after the elongated processing zone, a low cost PA-type air-cushion is used in places where the loading and unloading sequences may be done. Similarly, such a division is also practical In case where (b) high flatness accuracy is desired at a restricted small processing zone, such as found in the step-by-step photolithography process, where an X-Y drive system is used to move very accurately around the objects (FPDs or wafers) from one step to the other. In that case PV-type air-cushion is used only at the small processing zone. It is impotent to emphasize that a significantly wider relaxation zone must be provided, much larger than the PV-type air-cushion basic-cell typical scale, in order to provide a relaxation length of several basic cell typical dimension (practically 4-10 cells) from all relevant sides. It is necessary in order to create an Isolation from outer-zones disturbances and smooth cross-area transfer, thus accurate performance at the processing zone is obtained.

It is an option, with respect to another embodiment of the present invention to apply aerodynamic technique to adjust $\epsilon_n$, at the process-zone by regulating (such as modulating) the supply vacuum or pressure, or additionally, to create several distinct supplies at the processing zone to provide aerodynamic technique for local regulation of the vacuum or pressure supplies, in order to enhance locally the flatness accuracy at the processing zone.

In particular, when a process is taking place on the object while conveying it at high flatness accuracy by a PV-type platform, the active-surface can be divided into two or more sections to assist the process from its bottom side. Practically, a space may be provided between two sections, which for many applications discussed hereinabove may be as wide as 10-50 mm in the direction of motion, without ruining much of the high flatness of the gripped object, depending on the elasticity of the object. With respect to a preferred embodiment go the present invention, such an inter-section space can be useful in the following manners: (1) It becomes possible to assist the process from its bottom side as the process takes place above the object while it is conveyed without contact (continuously or at a step-by-step motion). Any source of light for illumination or imaging, laser beams of low to high power, as well as heating by radiation, or by hot air flow are only a few practical examples that become thus available. (2) It becomes possible to perform a dual-side process on both the upper and the lower surfaces of the object, while it is accurately gripped above the non-contact platform.

With respect to a preferred embodiment of the present invention, it is possible to create a system based on the PV-type air-cushion where the object is supported or conveyed with no contact, part of the time, but at the rest of the time it becomes a vacuum-table to hold down the object in-contact for any practical reasons. Such a system can grip with or without contact objects that are much smaller than the platform active-surface due to the AD-blockage mechanism of flow-restrictors that effectively limit the waste of MFR at the uncovered areas in both operational cases. It can be done by turning off the pressure supply to the active-surface where the object softly lands, where such flow-restrictors, limit the flow. In similar way, when the pressure supply is regenerated, the object disconnects and lifts softly. With respect to another application of the present invention, such a soft process can be applied in vacuum table systems equipped with only one type of flow-restrictors such as SASO-nozzles, where a soft non-contact landing and disconnecting mechanism is applied. It can be done by firstly operating with pressure, at the loading sequence, gently switching to vacuum to provide soft landing, executing the process while the object is held down in contact by the vacuum, and finally switching back to pressure to provide softly disconnecting and lifting process at the unloading phase. The on/off switching of the pressure can be a rapid process when applying the low-volume integrated dual-manifold to be described hereafter.

It is another preferred embodiment of the present invention, to engage two opposing active-surfaces, in one PV-type platform, having substantially identical active-surfaces and aligned in parallel at a mirror-image symmetry. Such a configuration provides dual-side non-contact gripping of an object that is inserted parallel in between the opposing active-surfaces. The AD-stiffness of such a configuration is doubled and it is one of the most important features of such non-contact platform. The gaps between the two opposing air-cushions share the difference between the object width and the distance between the opposing active-surface in a self adaptive manner. If the two active-surfaces are similar and operate at the same operational conditions, the $\epsilon_n$ will be equal on either sides of the object. In fact, it is a similar configuration to the PP-type platform to be discussed hereafter and it is also relevant to the dual-side PV-type platform. A significant disadvantage of the dual-side PV-type platform with respect to the PP-type platform is the need to supply also vacuum and the potential to provide high AD-stiffness that is smaller, but there is one significant advantage: the PV-type air-cushions do not apply large forces on the structure of the platform as the PP-type air-cushions do.

Vacuum preload PV-type air-cushion can also be used as an alternative non-contact air-bearing technology. (see the relevant paragraph with respect to the PA-type air-cushion, but the main difference is the ability of the PV-type air-cushion to exert holding-down forces to secure the horizontal up-wise motion).

Pressure-Preloading (PP) Type Air-cushion

According to a preferred embodiment of the present invention, PP-type air-cushion is generated using an active surface with a plurality of pressure ports, and another opposite active surface with a plurality of pressure ports, each active surface generating forces that are opposite in direction with respect to the forces of the other active-surface.

Consequently, PP-type air-cushion is a pressure preloaded platform, where the object is supported at rest or conveyed with no-contact from both its sides, thus PP-type non-contact platform is unconditionally stable. The opposing active-surfaces of the PP-type platform are preferably identical, provided with a plurality of pressure flow-restrictors such as SASO nozzles, and typically, with much less number of evacuation holes, to create a well functioning FRS mechanism and accordingly achieve high performance. The two opposing active-surfaces of the PP-type platform are assembled substantially in parallel, having identical active-surfaces and aligned in parallel with a mirror-image symmetry. The plane of symmetry is essentially the imaginary midplane of the thin (sectionally) and wide (laterally) space that is created between the two confronting active-surface. The two opposing air-cushions are established as the object is inserted between the two opposing active-surfaces. The gaps of the two opposing air-cushions share the difference between the object width and the distance between the opposing active-surface in a self adaptive manner. If the two active-surfaces are similar and operate at the same operational conditions, the $\epsilon_n$ at both air-cushions will be equal. The distance between the two opposing surface must be adjusted to be equal to the anticipated supported object's width plus twice the desired gap $\epsilon_n$. Accordingly, When It is intended to grip objects of different width, the PP-type non-contact platform must includes a "panel width adjustment" mechanis, allowing adjustment of the distance between the two opposing active-surfaces.

Due to pressure-preloading, PP-type platform provide high values of AD-stuffiness compared with both PV-type and PA-type air-cushions. The AD-stiffness of the dual-sided PP-type platform is of bi-directional nature and does not depend on the object weight. Typically, the supported objects, such as glass FPDs, wafers and PCB, are flat and have parallel opposing surfaces. When such objects are not flat, the PP-type platform provides high flattening performance of self-adaptive nature.

The PP-type air-cushion includes two types of conduits, pressure conduits equipped with a flow-restrictors such as SASO-nozzles to cater for the FRS behavior and evacuation holes, both preferably arranged in a rectangular format (see FIG. 6a) at the two opposing active-surface of the platform. The number of pressure flow-restrictors 22 that are distributed over each of the active-surface is much larger with respect to the number of evacuation holes 24, which optionally may not be provided at all (although it is recommended to provide evacuation holes), where factor of 3-16 may be practical (a factor of 9 is shown in the basic cell 26 depicted in FIG. 6a). Evacuation is needed to provide uniform camping and AD-stiffness of local nature, by providing evacuation holes and/or grooves at each of the opposing active-surfaces, mostly in cases where wide format active-surfaces are involved, or through the edges of these surfaces, mostly in cases where the active-surfaces are definitely not wide (typically of width of one or a few basic-cells of that platform that shown in FIG. 6a).

Figure 5:
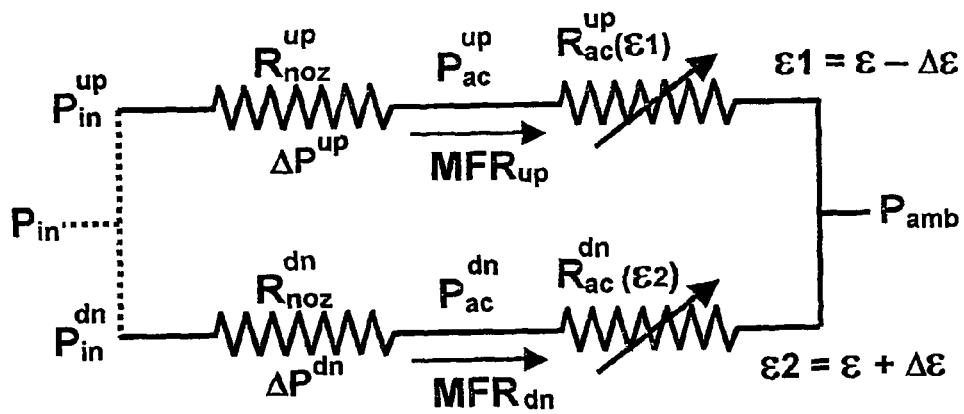
FIG. 5 illustrates an electric-circle analogy of the PP-type air-cushion.

The PP-type platform may be described analogously by an electric-circuit having two parallel conducing channels as shown in FIG. 5, where the notations "up" and "dn" (down) are used to distinguish between the two opposing active-surfaces. The text herein refers to a specific "channel" only when needed. $R_{noz}$ represents the FRS flow-restrictors of the pressure conduits, which are preferably SASO-nozzles, and $R_{ac}$ symbolized the AD-resistance of the opposing air-cushions. $P_{in}$ is the supply pressure, where it is an option to supply different pressures to each of the opposing active-surfaces, and $P_{ac}$ is the pressure introduced to the air-cushions. $\Delta P$ is the pressure drop along the flow-restrictor $R_{noz}$. $P_{amb}$ is the outlet pressure that can be atmospheric pressure, or vacuum when vacuum preloading is in-addition applied. MFR is the mass flow rate. $R_{ac}$ is a flow-restrictor that depends on the air-cushion detailed design, and it include parameters such as the flow-restrictor resolution, the diameter of the conduit's outlet and the ratio between the numbers of pressure outlet and evacuation-holes. At equilibrium state, $R_{ac}$ depends on the $\epsilon_n$, which is essentially identical for both opposing air-cushions, but $R_{ac}$ is a dynamic flow-restrictor where the AD-resistance depends in a self-adaptive manner with $\epsilon$. When an offset of $\Delta\epsilon$ from equilibrium is occurs, the gap $\epsilon 1$ of the upper air-cushion becomes smaller $\epsilon 1 = \epsilon_n - \Delta\epsilon$ and accordingly, the gap $\epsilon 2$ of the lower opposing air-cushion becomes larger $\epsilon 2 = \epsilon_n + \Delta\epsilon$. In such an offset, the global force down $\Sigma F_p^{up}$ that applied on the object from it upper side are significantly larger, and the opposing global forces up $\Sigma F_p^{dn}$ that applied on the object from it lower side are significantly smaller, with respect to the equilibrium state. Accordingly $R_{ac}$ are dynamic resistors characterized by AD-resistance that is depends on the $\epsilon_n$ of both sides. When the air-cushion is established, the pressure levels introduced to the opposing air-cushions are controlled by that gap offset $\Delta\epsilon$.

The functionally of the PP-type air cushion may be disassociated with gravity. In equilibrium state, the object is supported by two opposing air-cushions at a substantially the same distance to the object, which is symmetrically gripped in the middle of the platform, where the global pressure forces $\Sigma F_p^{up}$ and $\Sigma F_p^{dn}$ that oppose each other are of the same order of magnitude. Both opposing forces may be substantially larger in magnitude from the object weight, and the difference between those opposing forces balances the gravity (depending on the orientation of the system with respect to gravity). In such a magnitudes, the performances of the PP-type air-cushion with respect to the AD-stiffness and accordingly to the flatness accuracy are disassociated form the object weight. The PP-type air-cushion grips the object with no-contact from both sides and accordingly it has an inherently bi-directional stiffness, which is a most important property of the PP-type air-cushion. It means that when trying to move the object towards one of the active-surfaces of the non-contact platform, opposing AD-forces are developed by the air-cushion in a self adaptive manner. With respect to a preferred embodiment of the present invention, (a) a horizontal object can be gripped form both sides by a non-contact PP-type platform where the difference between the two opposing forces balances the object weight, or (b) a non-contact PP-type platform is capable of gripping an object where the object facing-surfaces are not horizontally oriented or even vertically oriented with respect to gravity.

The dual-sided PP-type platform is of complex configuration as it has two active-surfaces, and the cost per area is at least doubled (with respect to PA or PV platforms), if structural rigidity and complexity do not affect the system price. Therefore, it is worth considering only for specific tasks. Indeed, with respect to the present invention, the non-contact PP-type platforms are of superior performance having the ability to flatten non-flat objects, and at the same time to provide high accuracy when the object is gripped at rest or while conveyed without contact. Therefore, high flattening performance is the most important feature of the PP-type platform.

The PP-type platform provides a flattening mechanism of local nature, where when the object is not flat, pure flattening moments are developed in a self-adaptive manner by re-distribution of $\epsilon$ in such a way that $\epsilon$ becomes $\epsilon(x,y)$ and the off-set $\Delta\epsilon(x,y)$ must be of both negative and positive signs in order to provide both pure flattening moments and new off-set equilibrium state, to balances the object weight. Furthermore, the self-adaptive flattening nature of the PP-type platform is also time dependent in cases where a non-flat object is conveyed by the platform with non-flatness $NF(x',y')$ with respect to a moving coordinate system that is attached to the traveling object $(x',y')$. In such a dynamic case, the offset $\Delta\epsilon$ becomes of three-dimensional character $\Delta\epsilon(x,y,t)$. Nevertheless, the self-adaptive flattening mechanism exhibits temporal and local nature. For specific requirements of flattening performance with respect to the object's elasticity, width and lateral dimensioned, the larger the AD-stiffness of the PP-type platform is, the smaller is the $\Delta\epsilon(x,y)$, Therefore. high AD-stiffness is needed to provide a non-contact platform with high performances in terms of flattening and flatness-accuracy.

Figure 6A:
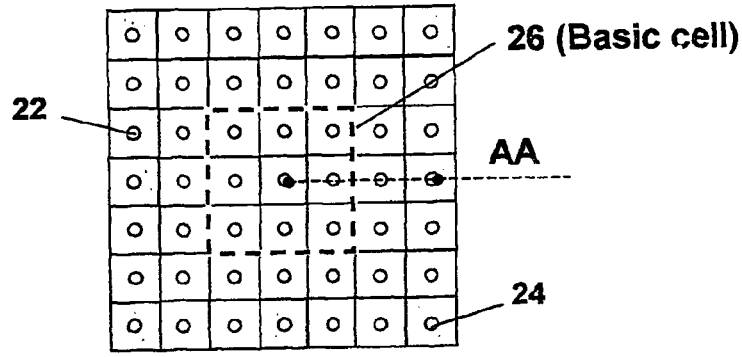
FIG. 6a illustrates a typical arrangement for the active-surface of the PP-type platform.
Figure 6B:
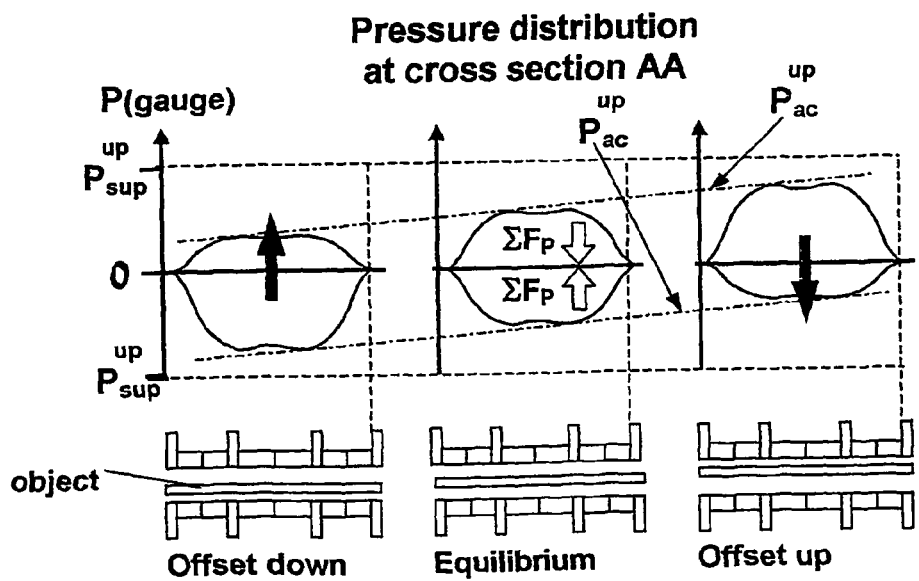
FIG. 6b illustrates the functionality of the PP-type air-cushion

In order to understand the pressure preloading mechanism associated with the PP-type platform, we shell refer to a case where a thin and flat object is horizontally supported or conveyed. In order to establish the dual-side air-cushions, the whole object or part of it must be inserted between the two opposing active-surfaces of the platform. Where the active-area will be only the area on the active-surface of the platform where the object subsists. In equilibrium state, the upper and the lower air-cushions induce opposing forces on the object, and the resultant of these forces balances gravity. Since the active-surfaces of the PP-type platform are identical and aligned in a "mirror-image" symmetry with respect to the central plane of the platform, the pressure distributions on both sides of the object are almost identical, as illustrated in FIG. 6$b$, equilibrium case. The dynamic characteristics of the PP-type platform are hereby explained with reference to FIG. 6$b$. When trying to unbalanced the PP-type air-cushion by offsetting it down by $\Delta\epsilon$ (see FIG. 6$b$, offset down case), the gap of the upper air-cushion $\epsilon_1$ is increased and the gap of the lower air-cushion $\epsilon_2$ is decreased. Accordingly, the pressure introduced to the lower air-cushion $P_{ac}^{dn}$ significantly increases as portion of $\Delta P^{dn}$ is released by the FRS flow-restrictors $R_{ac}^{dn}$, as the $MFR^{dn}$ of the lower air-cushion is reduced when the AD-resistance of the lower air-cushion $R_{ac}^{dn}$ increases. As a result, a global lifting force $\Sigma F_p^{dn}$ is exerted on the object by the lower air-cushion that significantly increases by additional force $\Delta\Sigma F_p^{dn}$. Simultaneously the pressure introduced to the upper air-cushion $P_{ac}^{up}$ significantly decreases as $\Delta P^{up}$ inside flow-restrictors $R_{ac}^{up}$ (of similar characteristics with respect to $R_{ac}^{dn}$), increases as the $MFR^{up}$ of the upper air-cushion intensifies when the AD-resistance of the upper air cushion $R_{ac}^{up}$ is decreased. As a result the counter direction (down) global forces $\Sigma F_p^{up}$, exerted on the object by the upper air-cushion are significantly decreased by $\Delta\Sigma F_p^{up}$. Accordingly, large opposing forces from both sides push the object up to equilibrium-state. In a same way, when trying to unbalanced the PP-type air-cushion by offsetting it up by $\Delta\epsilon$ (see FIG. 6$b$, offset up case), the gap of the upper air-cushion $\epsilon_1$ decreases, and the gap of the lower side air-cushion $\epsilon_2$ increases as a result of similar occurrences. But in the counter direction, large opposing global forces $\Sigma F_p^{dn}$ push the object down to equilibrium-state.

Some conclusions stem from the above explanation. Firstly, the bi-directional inherent characteristic of the PP-air-cushion is clearly evident. Secondly, it sheds a light on the meaning of the term "pressure preloading"; When the forces $\Sigma F_p^{up}$ and $\Sigma F_p^{dn}$ are much larger than the object weight (for example, 50-500 times higher), and an offset by $\Delta\epsilon$ in the range of 5%-10% with respect to $\epsilon_n$ occurs. $\Delta\Sigma F_p^{up}$ and $\Delta\Sigma F_p^{dn}$ are also much larger than the object weight (20-200 times larger with respect to the above example). Accordingly $\Delta\Sigma F_p^{up}$ and $\Delta\Sigma F_p^{dn}$ are almost equal to their average value $\Delta\Sigma F_p$, because the two changes contribute FRS forces in both cases where the offset is up or down. Accordingly, the "net" FRS forces that act on the object at offset of $\Delta\epsilon$ from $\epsilon_n$ equals to twice $\Delta\Sigma F_p$ and the essential meaning of the pressure-preloading mechanism is the fact that the FRS forces are doubled (with respect to a one-sided air-cushion, as in the PA-air-cushion, that is preloaded by only the weight of the object). The higher the PFR forces are, with respect to small $\Delta\epsilon$ offset, the higher the air-cushion AD-stiffness is. The PP-type air-cushion may potentially generate AD-stiffness that is much larger with respect to the PA-type or PV-type air-cushions.

High AD-stiffness performance of the PP-type platform can be obtained by implementing the following considerations: (1) It is most important with respect to the present invention to use of a plurality of flow-restrictors such as SASO nozzles, to introduce the flow to the PP-type air-cushion, these flow-restrictors serving as a FRS of local nature, and providing a self-adaptive mechanism that is rapidly generating opposing forces in response to any changes in $\epsilon$ (2) Optimization of the FRS mechanism can be obtained by adjusting the AD-resistance of the flow restrictors ($R_{noz}$), with respect to the air-cushion AD-resistance ($R_{ac}$) in such a way that when the air-cushion is working at a predetermined $\epsilon_n$, half of the input pressure $P_{in}$ is introduced to the air cushion ($P_{ac}$), thus the other half ($\Delta P$), is used up as a potential pressure drop inside the flow-restrictor to serve the FRS mechanism when $\epsilon_n$ is off-setted by $\Delta\epsilon$. In such conditions, maximum AD-stiffness is obtained at the $\epsilon_n$ (3)

It is very important, with respect to PP-type platforms of the present invention, to maximize the effective area of the active-surface in order not to reduce the benefits of the pressure preloading mechanism. With respect to a preferred embodiment of the present invention, it can be done by distributing much more flow-restrictors than evacuation holes, where a factor of 9 that is shown in FIG. 6a seems to a convenient factor. Practical factors are, for many purposes, in the range of 3-16. It has to be emphasized that the evacuation holes are used to provide uniform and high stiffness at internal zones of the active-area of the PP-type air-cushion, and to maintain the local balance nature. Evacuation must be done in a way that avoids significant changes in the pressure distribution, changes that were found to be very effective in enhancing the AD-stiffness and the functionality of the PA-type and PV-type platforms, but significantly reduce the AD-stiffness of the PP-type platform. Other practical parameters enhancing the AD-stiffness include (4) working at high operational pressure, where the more the input pressure and thus the more MFR, the more AD-stiffness is intensified. (5) If there are no system or process restrictions, it is preferable to reduce the predetermined equilibrium gap $\epsilon_n$ to gain more sensitivity to offsets $\Delta\epsilon$, and it means high AD-stiffness at possibly lower MFR.

Enhanced FRS forces can be obtained by using also vacuum preloading, where the payoff is reduced values of $\Sigma F_p^{up}$ and $\Delta\Sigma F_p^{dn}$. It is acceptable if the main objective is to enhance AD-stiffness. Therefore, with respect to another preferred embodiment of the present invention, it is an option to connect the evacuation holes to vacuum source, thus, in addition to the basic pressure preloading character of the PP-type platform, vacuum preloading mechanism may additionally be implemented in order to further enhanced the AD-stiffness of this platform.

Pressure and vacuum preloading are very known mechanisms to enhanced AD-stiffness and are frequently used in air-bearings application to provide accurate motion-systems. However, with respect to the specific application of the present invention, when applying preload mechanisms, in particular pressure preloading, for the PP-type platform and when aimed at providing non-contact gripping and flattening mechanism of essentially thin and wide flat-objects while supported at rest or conveyed by motion-system, this is basically a new platform of different embodiment and its functionally and objectives are totally different from air-bearing applications. Also different are the operational conditions. The PP-type air-cushion may also be operated at pressure supply that is much more than one Bar above the atmospheric pressure, and in most cases a few hundreds of millibars, specifically, for many pruposes, the range between 100-1000 millibars, which are very practical operational values, the active area of the PP-type air-cushion being very large with respect to the active-area of air-bearing systems. In addition, a typical air-gap of air-bearing systems is in the range of 3-10 µm, while the typical gap ($\epsilon_n$) of the two opposing air-cushions of the PP-type platform is effective in the range of 10-1000 µm. The PP-type platform air-cushion gap, $\epsilon_n$, is selected with chosen to meet the required accuracy and flattening performances needed with respect to the object elasticity, its width and lateral dimensions.

With respect to another preferred embodiment of the present invention, the PP-type platform, which has a wide active-surface and works at convenient operational conditions, can be implemented to linear motion systems as a replacement to the air-bearing motion-systems. The latters have a much smaller active-area and work at severe operational conditions (with respect to operational pressure and floating gap that dictates a very smooth sliding surface). Thus it is possible to provide, employing a system in acordnace with the present invention, similar AD-stiffness and accurate linear motion. When adopting the PP-type Platform for routine air-bearing applications, it can be in a configuration where it is implemented on a traveling carriage having active opposing surfaces that slide along a special passive slider, gripping the object from both sides thus avoiding vertical movements, or on the opposite, it can be configured as a passive carriage, that is vertically gripped, and travels over a sliding rail, which has active opposing surfaces. The latter configuration is feasible only when MFR is of no concern. Indeed, the use of reduced operational pressure, and the beneficial use of the AD blockage mechanism provided by the plurality of flow-restrictors, which limit the MFR at the uncovered areas, makes this configuration practical. With respect to preferred embodiments of the present invention, The PP-type air-cushion can be employed, (1) with or without respect to the direction of gravity, (2) in linear motion systems of different configurations such as (2a) one-directional linear motion systems, (2b) two-axes planner motion systems, and (2c) systems where rotational motion is involved, such as spindles and rotary tables.

The PP-type air-cushion performance exhibits local-balance nature thus no-global effect occurs. Therefore it is possible to provide much as wide as needed non-contact PP-type platform to support or to convey flat objects of extremely large dimensions, such as glass plates, FPDs or PCB. It has to be emphasized that the locality and uniformity nature is valid as long as the dimensions of the basic-cell of the PP-type platform are much smaller with respect to object lateral dimensions. Locality and uniformity are no-longer valid at areas that are close to the edges of the active-areas. In order to encounter the edge effects it is recommended to increase the resolution close to the edges of the active-area and optionally even not to provide evacuation holes in closed to the edges of the active-areas, where evacuation is available over the edges, thus reducing the lateral scale of the edge effects. For the same purpose it is also an option to differentiate the pressure supply and provide higher pressure to edge-areas. Such edge-treatment improves the edge-areas performances.

Typically, with respect to a preferred operational condition of the present invention, as a flat object is of large dimensions or when moderate performance is desired, wider $\epsilon_n$, lower operational pressure and preferably larger basic-cell dimensions (less resolution) can be applied, and as the object is of small dimensions or it is more elastic and when high AD-flatness is needed to provide high performance in terms of flattening capabilities and flatness-accuracy, narrower $\epsilon_n$, higher operational pressure and smaller basic-cell dimensions (more resolution) are preferred. For many purposes, the practical dimensions of the basic cell, which contains 9 squares as shown in FIG. 6a, are between 15×15 mm to 72×72 mm. It is also an option that the two lateral dimensions of the basic cell may not be of the same lengths. It is very practical to use different aspect ratio for the basic cells when these are close to the edges of the active-area, and to provide fine resolution in the direction that is normal to that edges, to improve local performance at the edges of the non-contact platform.

The aero-mechanic design of the PP-type non-contact dual-side platform must be pedantically performed, taking into account (1) The operational conditions and the available MFR. (2) The characteristics of the flow-restrictors (in terms of MFR vs. the input and the output pressure). In particular, with respect to the present invention, it is preferred to use SASO-nozzles as the FRS flow-restrictors. (3) Geometrical parameters such as the lateral dimensions of basic cell (in other words: the resolution of the platform), as well as the factor between the number of flow-resistors and the evacuation-holes, where a preferable and a convenient value of that factor is in the range of 3-16, and the details of the outlets of both the pressure conduits the evacuation holes. Typical values of AD-stiffness for the PP-type platform are in the range of 10-200 gram/cm$^2$/µm, and if thin objects like wafers or FPDS are supported in rest or conveyed, a FRS force, which is 50 to 1000 times greater than the object weight, may be developed with respect to a $\Delta\epsilon$ of only 1 µm.

The nature of the AD-stiffness at different floating gap, with respect to a specific aero-mechanic design of a PP-type platform, is characterized by an optimum equilibrium gap $\epsilon_n$. Accordingly, the AD-stiffness decays both at wider and narrower gaps. It is important to identify such behavior, to guarantee well functioning and no-contact that can be also of local nature, in cases where the object is subjected to external forces, including forces that are related to accelerated motion, or in cases where the object is instantly subjected to external forces. Such enforcements on the object may occurs also in a local manner where only a restricted zone is disturbed, Furthermore, it is mostly important to guarantee no-contact especially when the object is thin and of wide dimensions and accordingly flexible, where local forces may produce deformations of three-dimensional nature.

When it is required to support at rest or to convey with no-contact flat and thin low-weight objects of wide dimensions such as wafers, FPDs or PCBs (inner and outer layers), at extremely high flatness accuracy, the local-balanced PP-type platform is suited to be selected to perform the task. Furthermore, the PP-type platform has a capability to provide high flattening performance, which is very effective in cases where the object is not flat and still high flatness accuracy is necessary at a zone where accurate processing takes place. The PP-type platform can provide, with respect to the elasticity of the above mentioned objects, flatness accuracy in terms of a few micrometers at the processing zone where the object non-flatness is commonly measured in term of up to a few millimeters and more. With respect to a preferred configuration of the present invention, (1) the processing zone can be either an elongated zone opened between two sections of the PP-type platform, or (2) an internal rectangular or circular processing zone can be opened, a zone that is much smaller than both the PV-type platform active surface and the object dimensions. When the conveyed object is both wide and long, it is expensive to provide overall manufacturing flatness of the active-surfaces and overall operational flatness accuracy that includes errors that are contributed by the air-cushion itself and additional errors of the motion system and the gripping elements. Therefore it is cost-effective, with respect to a proffered embodiment of the present invention, to configure a non-contact platform where the PP-type air-cushion is applied only at a section of the platform, to provide high flatness performances only close to the zone where the accurate processing takes place, and elsewhere the PA-type air-cushion or any other means of conveying may be used.

Although we considered only flat surfaces so far, there is no restriction to create, with respect to another preferred embodiment of the present invention, any practical active-surface that is not flat, for applications where high flatness-accuracy must be provided at the processing-zone. It is true also for PV-type and PA-type platforms, Typical example is to shape the two opposing active surfaces of the PP-type platform in a cylindrical shape where the diameter of the cylindrical surface can be large, thus reducing lateral wavy patterns. Such a surface can be very useful when flexible object such as found in the printing world are considered, or even when FPDs or PCBs inner layer, are considered, where a curvature in one-dimension significantly increases the rigidity of such flat, thin and flexible objects. The opposing active-surfaces of the PP-type platform can also be "v" shaped for linear motion application where a passive carriage is accurately slided over an active elongated PP-type platform (slider) and vise-versa. The latter and other similar configurations provide accurate motion where lateral movements are prevented.

With respect to the operational conditions of PP-type platform, the higher the input pressure is, the higher are the AD-stiffness and accordingly the associated performance. But, with respect to flat, thin and wide objects such as wafers, FPDs or PCBs, effective operational pressure is in the range of 100-1000 millibars. it has to be emphasized that very large forces may be develop if working with high pressure and wide active-surfaces. Such forces threaten to tear apart this dual-side configuration thus it is suggested, with respect to another preferred embodiment of the present invention, to provide only as much as needed pressure supply and not more, and to limit the lateral size of the active-surfaces and accordingly to design a strong structure for the platform, otherwise the flatness-accuracy will deteriorate. For example: opposing forces of 1000 kg may be developed in a PP-type platform having active-area of 100×40 cm when working at pressure supply of 250 millibars. The dual side PP-type platform must be very rigid to maintain the $\epsilon_n$ within the allowed tolerance, and not to be affected by dynamic structural deformations. Practical $\epsilon_n$ for the PP-type air-cushions is in the range of 20-500 micrometers. Also, when equal operational conditions for the two opposing air cushion are considered, it is an option to design the PP-type platform to operate at different operational conditions and at different $\epsilon_1$ and $\epsilon_2$.

Accordingly, with respect to another preferred embodiment of the present invention, it is an option to connect the active-surfaces of the platform by use of pre-loaded supporting mechanical springs in order to limit the maximum forces that may be developed, thus when AD-forces surpass beyond their limit, the opposing active surfaces are adjusted further apart, and the gap of the air-cushions widens in a self-adaptive manner. Accordingly, a global "force-limit mechanism" is created. The use of such mechanical spring can be also helpful in cases where the objects widths are not uniform and the machinery of the width-compensation sub-system that must be included in the PP-type platform if objects such as PCB or FPD of essentially different width are occasionally considered, and such a sub-system is designed to adjust the Air-cushion gaps only for a nominal object width.

The non-contact PP-type platform offers high performance in terms of stiffness, flattening capacities and at-rest or in-motion flatness accuracy gripping, Accordingly, with respect to the present invention, it is preferred to use the PV-type platform when such high performances are needed. But, the PP-type platform can be useful for other reasons, such as safety reason, hence from stability point of view, the PP-type platform is supeiorly stable. Furthermore, PP-type platform allows dual-sided process to be carried. It may be relevant for flat objects such as FPDs wafers and PCBs, to be supported or conveyed with no-contact while any process activity is taking place on both its sides. Such objects may not be flat, and the high flattening capabilities, such as the PP-type platform provides, are needed to meet the process flatness-accuracy requirements.

When it is needed to convey at extremely flatness-accurate thin and wide format objects such as FPD (commonly, actual dimensions are up to 180×200 cm), or PCB that are not flat in most cases and the flatness accuracy is desired for a small zone or for an elongated narrow zone where the process takes place, it is preferable and cost-effective to use PP-type air-cushion at the processing zone, with the PA-type or the PV-type air-cushions serving as a non-contact platform. As mentioned before, a relaxation length must be specified to avoid effects of external disturbances. With respect to a preferred embodiment of the present invention, it can be implemented (1) In case of elongated processing zone, such as cleaning, coating or inspection, where the object is transferred linearly during the process in a direction that is normal to the elongated processing zone. (2) Similarly, in the case of wafers support, it is convenient that the elongated processing zone be the radial direction where the object is rotated around its center.

With respect to another preferred embodiment of the present invention, it is suggested to (3) support and to flatten the object by a PP-type air-cushion that is provided only at a restricted area close to the elongated processing zone, but wide enough to allow relaxation, and in the much larger outer supporting areas, before and after the processing zone, a low cost PA-type or PV-type air-cushions may be provided, or alternatively, any other practical supporting means. (4) in cases where only a small, two-dimensional processing zone is required (such as found in the lithography process, where X-Y horizontal steppers are commonly used to move objects such as FPD or wafers, step by step), it is convenient to apply the PP-type air-cushion only at a restricted zone around the small processing zone, where at the outer large areas around the accurate zone, it is practical to employ the lower-cost PA-type or PV-type air-cushions. It has to be emphasized again that In both cases (3 and 4), it is suggested to provide a relaxation strech such as described at the PV-type air-cushion.

In addition, with respect to a preferred embodiment of the present invention (5) It is an option to apply aerodynamic techniques to regulating the pressure at one of the active-surfaces of the dual-side PP-type platform, in order to adjust the distance between the object surface and the process machine active element, possibly at each step, or constantly, by involving a control system. Furthermore (6) it is an option to divide the actual processing zone into several sectors, to provide also local adjustment of that distance. With respect to this option, It is convenient to divide the processing zone into several individually pressure-controlled sectors. It can be achieved either at the factory or by on-line controls.

In particular, when processing takes place on the object while it is flattened and supported or conveyed with no contact at high flatness accuracy by the PP-type air-cushion, the upper and the lower active-surfaces of that platform can be similarly divided into two or more sections, to assist the processing from both sides of the object. In Particular, the space created between two sections can be as wide as 10-50 mm in the direction of motion, without spoiling much the flatness accuracy of the gripped object, but it depends of course on the elasticity of the object. Such an inter-section space can be useful in the following manners: (1) It allows room for reaching and performing the processing from its upper side as the process takes place above the object, while it is flattened and conveyed without contact at high flatness accuracy (continuously or at a step-by-step motion). Any source of light for illumination or imaging, laser beam of any power as well as heating by radiation or by hot air flow are only a few practical examples that become available. (2) It becomes possible to perform dual-sided processing (possibly simultaneously), on both the upper and the lower surfaces of the object, while it is flattened and accurately gripped or conveyed inside the PP-type non-contact platform. Such a divided platform can grip with no-contact objects that are much smaller than the active-area of the platform due to the AD blockage mechanism, which is provided by flow-restrictors.

The vacuum preload PP-type air-cushion can also be used as an alternative to the non-contact air-bearing technology, especially in cases where accurate-motion is required and the object is of moderate or low weight, where it may be subjected to local and temporal external forces, and where the pressure preloading provides high AD-stiffness that is disassociated from the object bodyweight.

When only one active-surface such as for the PP-type platform is placed against a thin object and a second non-active plate is positioned on the other side of the object, only one air-cushion presses the object against the non-active surface. Such platforms is referred to herein as a PM-type air-cushion. The PM-type platform can be used with or without respect to gravity. It can be used for many applications to flatten and/or to increase lateral friction forces on objects such as FPD, PCB wafers or any printing world media without touching the surface of the object that is facing the air-cushion side, where touching this surface is forbidden. The surfaces of the PM-type platform can be planar or non-planar, for example cylindrically shaped or V-shaped (or in any other desired shape). The active-surface of the PM-type platform can be stationary while the non-active surface with the object may be in motion, or vise-versa. It may include or combine linear motion and rotating motion with a spinning direction that is perpendicular to the surface or, when a cylinder is used as the non-active surface, it is an option to revolve the cylinder. It has to be emphasized that the PM-type platform is used to apply forces in a cost-effective manner and the AD-stiffness is provided in a self-adaptive manner to the platform by using pressure flow-restrictors such as SASO nozzles, with respect to non-uniform objects and to provide a AD-blockage mechanism that limits the MFR when the active-surface of the platform is not fully covered (when the object is of smaller lateral dimensions). Accordingly, and since flatness is mainly defined by the flatness of the non-active surface of the platform, the AD detailed design of the PP-type platform is different from the the AD detailed design of the PP-type platform with respect to evacuation holes and resolution, and high AD-stiffness may not be the top-priority performance.

Figure 7:
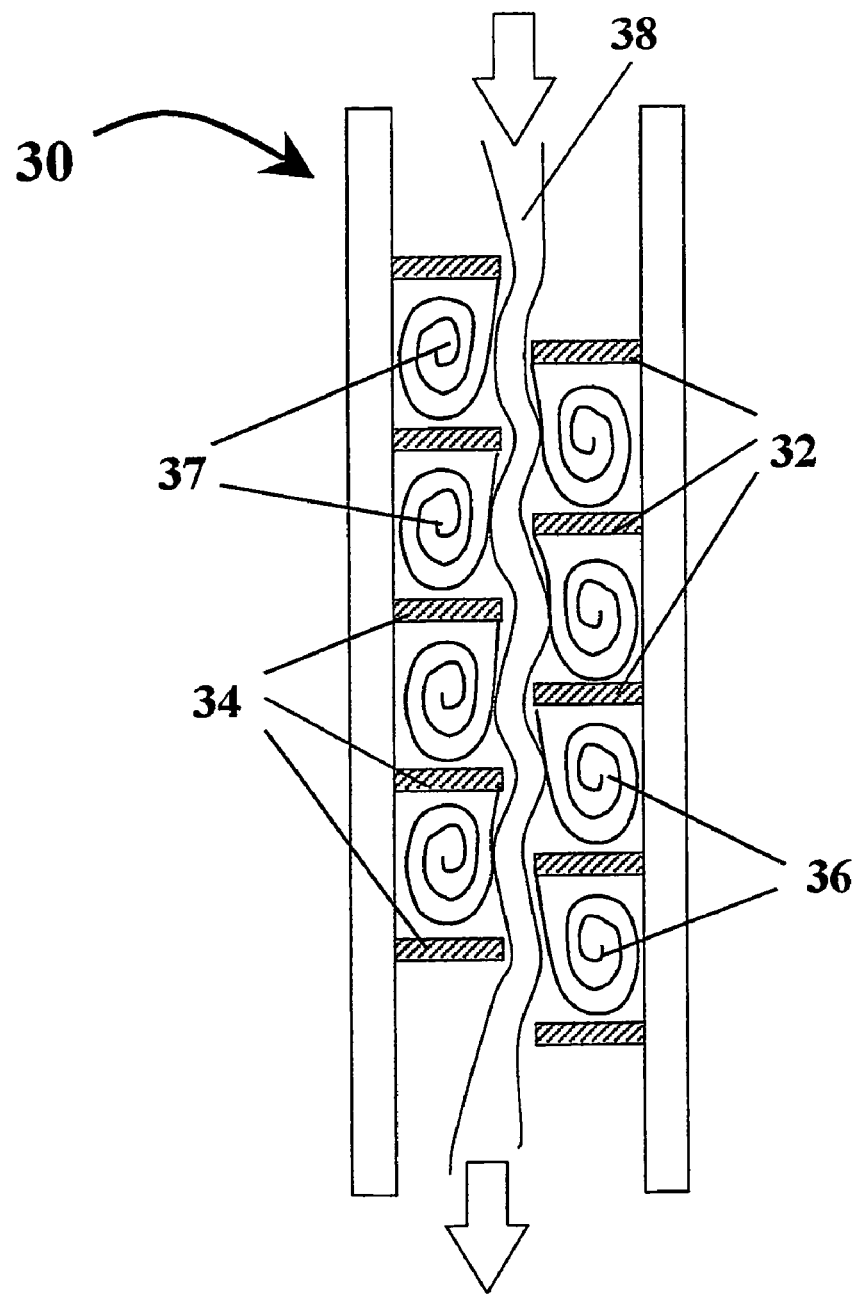
FIG. 7 illustrates a typical Self Adaptive Segmented Orifice (SASO) to be used as the preferred flow-restrictor (PRIOR ART)

According to a preferred embodiment of the present invention, each active surface of the non-contact support system is equipped with a plurality of pressure-flow restrictor to provide the FRS capabilities which is the most important element of the present invention. In preferred embodiments of the present invention it is recommended to use the SASO flow-restrictors described in WO 01/14782, WO 01/14752 and WO 01/19572, all incorporated herein by reference. Generally, a SASO flow-restrictor (see FIG. 7) described therein comprises a conduit 70 having generally two substantially opposite rows of fins 72, 74 positioned inside the conduit, protruding internally, one row of fins shifted with respect to the other row, so that opposite the cavities 76, 77 formed between consecutive fins of one row a fin of the other row is positioned, to allow a formation of vortices within these cavities when air (or other fluid) flows through the conduit, and the formation of a thin core-flow 78, substantially confined between the tips of the fins. An elaborate description and explanation of the nature of the conduit and the nature of the flow within is found in the above mentioned publications, the performance of the SASO flow-restrictor, the FRS mechanism and the AD-blockage mechanism of self-adaptive nature are described hereinabove.

Figure 8A:
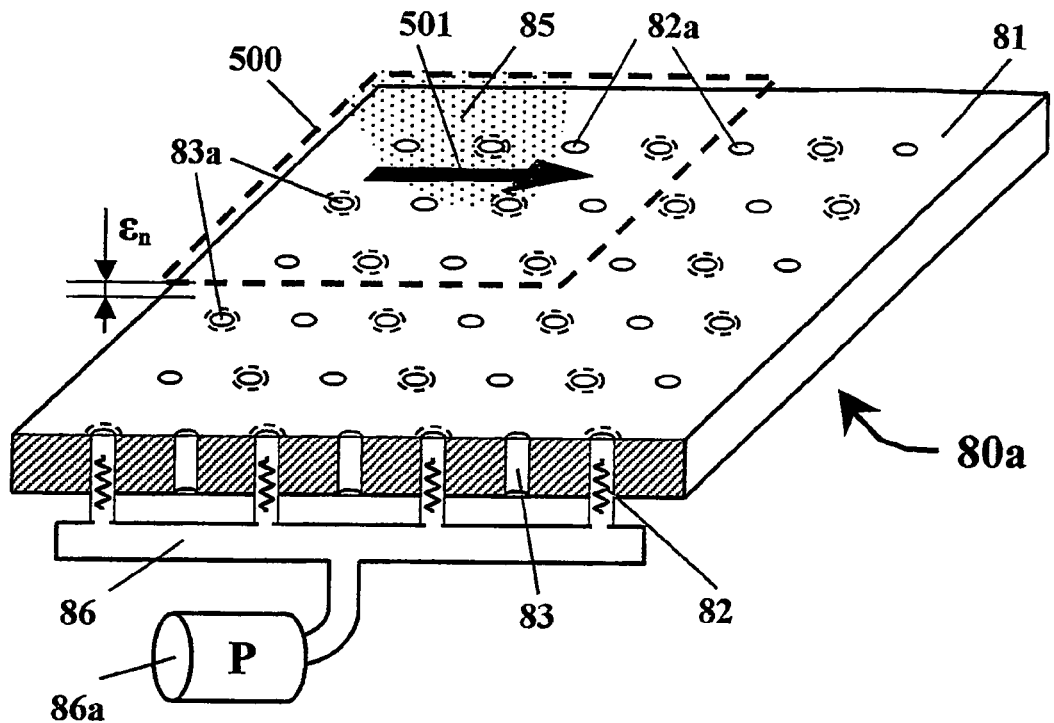
FIG. 8a illustrates a basic PA-type non-contact platform.

In accordance with a preferred embodiment of the present invention reference is now made to FIG. 8a, illustrating a PA-type non-contact platform 80a, having a flat active-surface 81, equipped basic cells in a chess-table format (to provide uniform support and local balance), with a plurality of pressure outlets equipped with flow-restrictors 82, preferably SASO nozzles, aimed at facilitating PRS characteristics of platform 80a and securing the pressure level when the active-surface is not fully covered, and a plurality of evacuation vents 83. It has to be emphasized that the resistor-symbol" denoted for the flow-restrictor as shown in the figures is used only as a symbolic illustrating, and the actual details of flow-restrictors 82, are shown for example in FIG. 7, and described in great details in WO 01/14782, WO 01/14752 and WO 01/19572, all incorporated herein by reference. A PA-type air-cushion 85 is established between the object's 500 lower surface and the active-surface 81 when an object 500, that may be larger, substantially equal or much smaller than the active-surface 81, is placed in parallel in a close vicinity over the active-surface 81 of the platform 80a (at a predetermined gap $\epsilon_n$). The object 500 may optionally be at rest or conveyed or towed in a direction defined by the arrow 501. The outlets 82a of the pressure flow-restrictors 82, that introduce the air to the air-cushion 85, and the outlets 83a of the evacuation vents 83 through which the air is released from the air-cushion 85, are distributed at the active-surface 81 in an alternating format. The diameters of outlets 82a, 83a may vary, may be unequal and have a round shape or other shape. Each of the inlets of the pressure flow-restrictors 82 is fluidically connected to a pressure reservoir 86, itself fluidically connected to an air-pump 86a to provide pressurized air. Alternatively, each of the inlets of the pressure flow-restrictors 82 is fluidically connected to an integrated single-manifold to be described hereafter (see FIG. 15a), that is fluidically connected to an air-pump 86a. It is an option to provide a flow restrictor in the evacuation channel in order to raise the average air-cushion pressure.

The performance of the PA-type non-contact platform can be determined by specifying a variety of mechanical and aeromechanical means, including, (1) the dimensions of the platform with respect to the dimensions of the object to be supported by the system. It may include allocation of relaxation areas to decay outside disturbances and vibrations (2) the flow-restrictors characteristics (and with respect to the preferred flow-restrictor, by specifying the geometric parameters of the SASO nozzle configuration and physical dimensions), (3) the air-cushion gap $\epsilon_n$, (4) the PA-air-cushion basic-cell dimensions and details, and (5) the operational conditions. From application point of view, the aeromechanic design must take into account (6) flatness accuracy and other performance specifications (7) the character of the object (materials, bodyweight and dimensions), and (8) the details of the motion involved, and (9) the details of the processing involved, including dimensions and forces that be by developed.

Figure 8B:
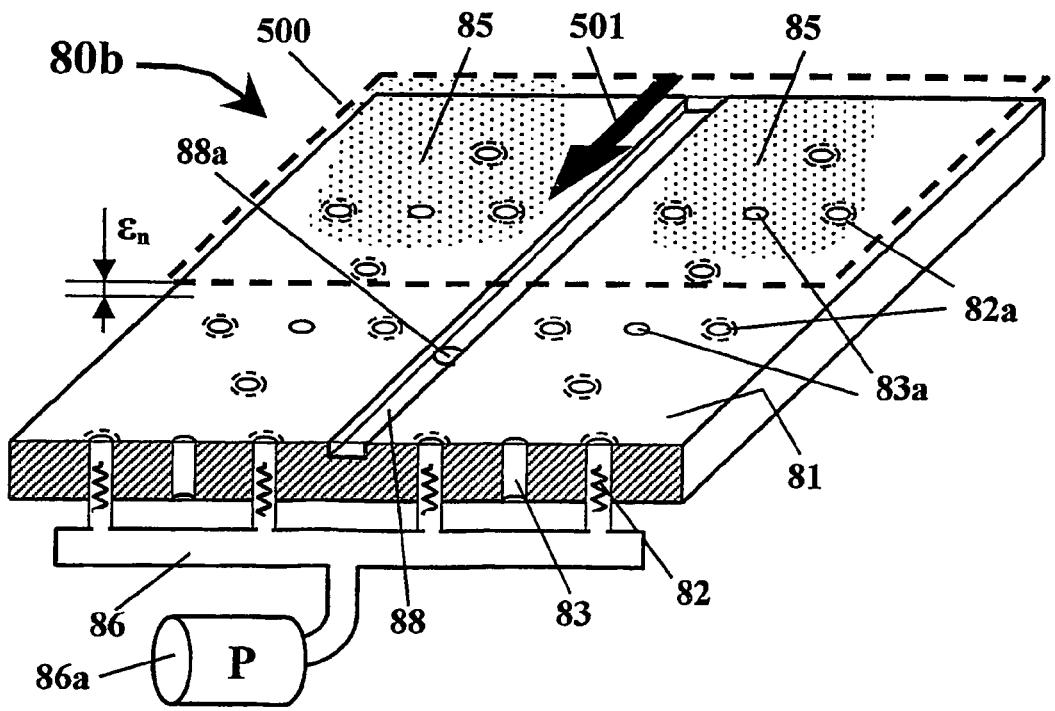
FIG. 8b illustrates a PA-type non-contact platform with evacuation grooves.

Reference is now made to FIG. 8b, illustrating a PA-type non-contact platform 80b in accordance with another preferred embodiment of the present invention, having a flat active-surface 81 with basic cells in a chess-table format (to provide uniform support and local balance), with a plurality of pressure flow-restrictors 82. In addition here, surface-grooves 88 are provided at the active surface 81, in parallel to the direction of motion 85, in order to assist the air-evacuation, where the air can be released to atmosphere at the end of the grooves or by optional bores 88b. Evacuation-grooves can be also made in perpendicular to the direction of motion 501. Alternatively, the evacuation vents 83 may be omitted and evacuation is achieved only through the evacuation grooves.

Figure 8C:
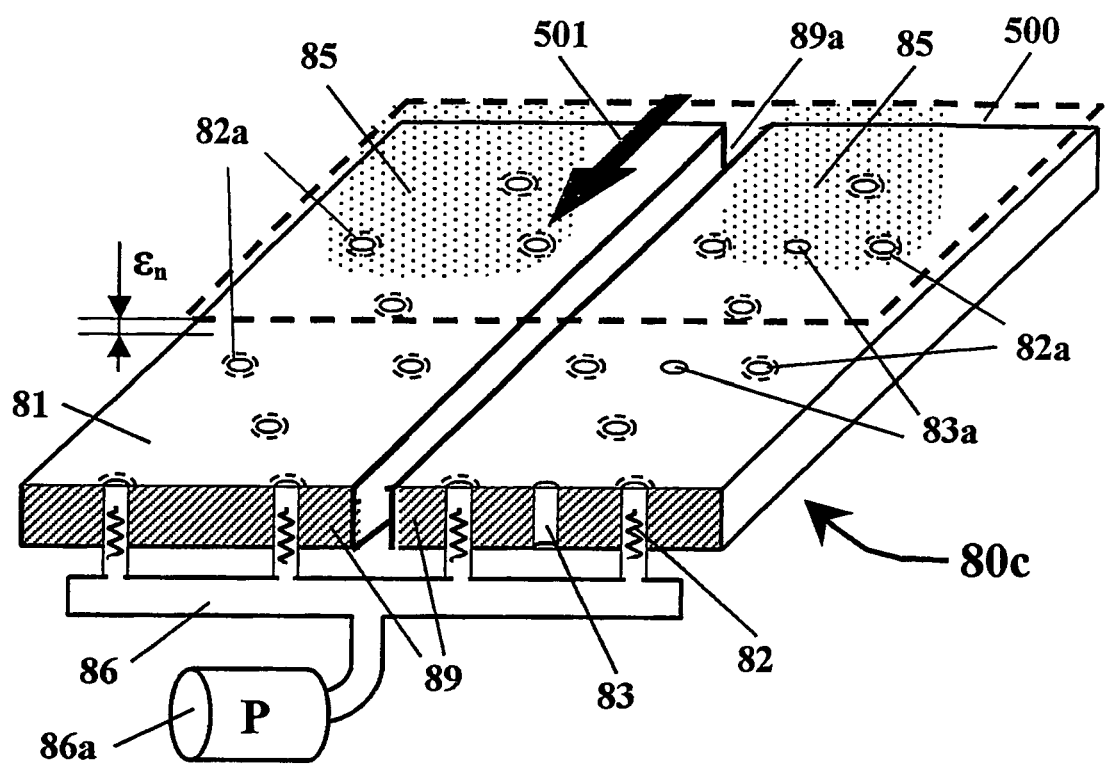
FIG. 8c illustrates a basic PA-type non-contact platform consisting of two segments.

Furthermore, In accordance with another preferred embodiment of the present invention, the flat active-surface 81 of the PA-type non-contact platform 80c can be divided to several elongated segments 89 along the direction of motion 501 of the object, (a division into two segments is shown in FIG. 8c). In this case the evacuation is partly performed through each of the elongated spaces 89a provided between the segments 89 (see right side). Alternatively, evacuation holes may not be used thus evacuation is achieved solely through the elongated spaces 89a (see left side). The active-surface 81 can be divided also in perpendicular to the direction of motion or in a two-dimensional manner. In general evacuation surface-grooves (not seen in this figure), may also be incorporated. In particular, such opened spaces can be used for handling and conveying tools, to position sensors for motion or process control, and access the object so as to allow processing that may take place above the object, optionally even performing a dual-sided processing. The active surface may be provided with one or more through-openings for the purpose of handling operations on the object.

The active-surface of the PA-type non-contact platform in accordance with the present invention is preferably planar, suited for many supporting and conveying purposes, but it may also be cylindrical, curved or tortuous, according to specific design requirements, and the nature of objects supported or conveyed on it, and it may also depend on the nature of processing to be optionally performed above it. Processing may take place also at outer zones that are close to the edges of the active-area. It has to be emphasized that the active-surface of the PA-Type is not always rectangular and it may be of any desired shape. In particular it is convenient to use round PA-type platform to support a round wafer, which may be held at rest or moved in a turning motion. Although it is convenient to use a chess-table format for allocating the outlets, the two lateral dimension of the basic cell (see FIG. 2a) should not necessarily be equal. In particular, it is favorable to apply fine resolution close to the edges of the active-surfaces. In the embodiments depicted in the figures one evacuation hole (if at all) is associated with each of the flow restrictors, but it is possible to select any other ratio between them, in order to handle effectively ultra-low-weight objects (for example, for the purpose of finger touch support more evacuation are needed) or heavy objects (where less evacuation is needed) in order to provide enough force to balance gravity).

Figure 9A:
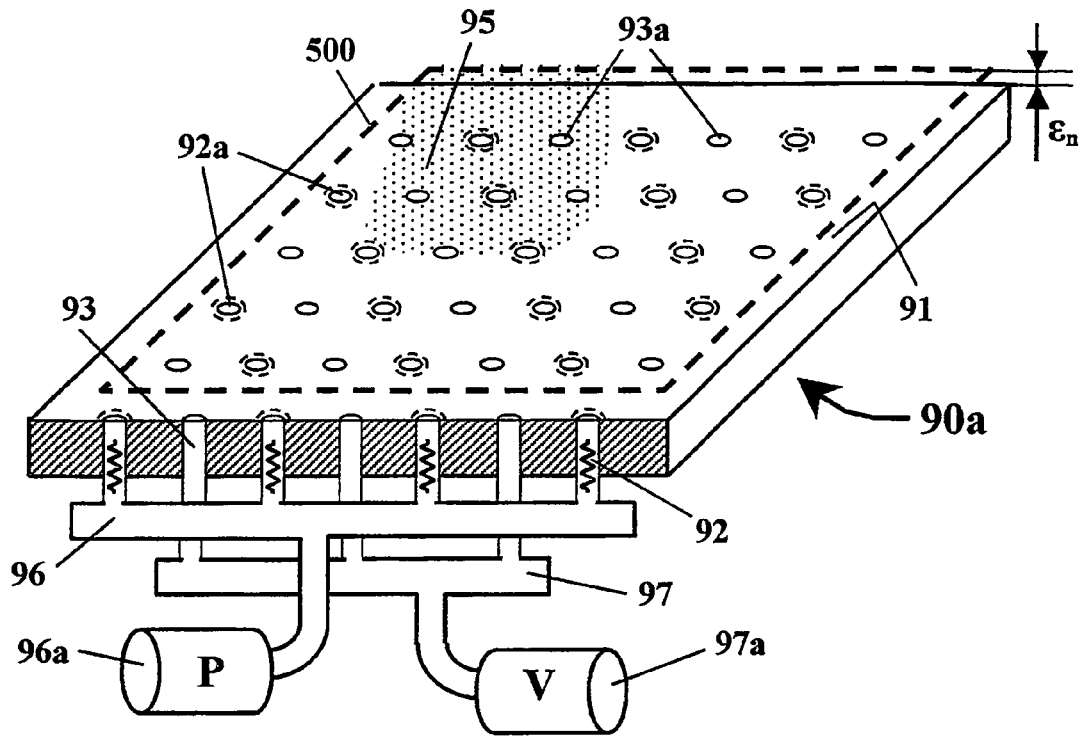
FIG. 9a illustrates a PV-type non-contact platform with only pressure flow-restrictors and a supported object that fully covers the platform's active-area.

In accordance with a preferred embodiment of the present invention reference is now made to FIG. 9a, illustrating the PV-type non-contact platform 90a having a flat active-surface 91, in a chess-table format (to provide uniform support and local balance), with a plurality of pressure outlets with flow-restrictors 92, and a plurality of vacuum-conduits 93. PV-type air-cushion 95 is established between the object 500 lower surface and the active-surface 91 when an object 500, which fully covers the active-surface 91, and can be essentially equal or larger than active surface 91, is placed in parallel in a close vicinity to the active-surface 91 of the platform 90a, (at a predetermined gap $\epsilon_n$). The object is supported at rest, but may optionally be conveyed, however it must at least fully cover the active-surface 91 (as frequently found in circular configurations such as wafers, hard-disc, CD,DVD ex). The pressure outlets 92a of the pressure flow-restrictors 92, which introduce the air to feed the air-cushion 95, and the vacuum outlets 53a of the vacuum-conduits 93 through which the air is sucked from the air-cushion 95, are distributed at the active-surface 91 in an alternating format. The outlets 92a,93a are not necessarily equal nor must have a round shape. Each of the inlets of the flow-restrictors 92 is fluidically connected to a bottom-side pressure reservoir 96, that is fluidically connected to an air-pump 96a providing pressurized air, and each of the inlets of the vacuum-conduits 93 is fluidically connected to a bottom-side vacuum reservoir 97, which is fluidically connected to a vacuum-pump 97a to provide vacuum suction. Alternatively, each of the inlets of the flow-restrictors 92 and the inlets of the vacuum conduits 93 is fluidically connected to a bottom-side integrated double-manifold to be described hereafter (see FIG. 15b), which is fluidically connected to an air-pump 96a and a vacuum pump 97a. It is an option to use one pump to supply both pressure (to be connected to the pump-outlet) and vacuum (to be connected to the pump-inlet), but it may limit the performance and the option of aerodynamic adjustments and is therefore not recommended.

The performance of PV-type non-contact platform can be determined by specifying a variety of mechanical and aero-mechanical means, including, in addition to the dimensions of the platform also (1) the flow-restrictors characteristics (and with respect to the preferred flow-restrictor, by specifying the geometric parameters of the SASO nozzle configuration and physical dimensions), (2) the air-cushion gap $\epsilon_n$, (3) the PV-tape air-cushion basic-cell dimensions and details, and (4) the operational conditions, including optional means of regulation and control. It is a possibility to apply local vacuum/pressure regulation by dividing the active-surface or part of it to several individually regulated sectors to enhance flatness-accuracy. For the PV-type platform, one-dimensional sectors distribution is applicable at the edges areas, which are close to the laterally wide and short space where processing may take place, as shown in the divided configuration, see FIG. 9c, or at the "Processing zone" if it takes place above the object. From the application point of view, the aeromechanic design considerations must include the (5) flatness accuracy and other performance specifications (6) the character of the object (materials aspects, bodyweight and dimensions), and (7) the details of the motion involved, and (8) the nature of the processing involved, including dimensions and forces that need to be developed.

Figure 9B:
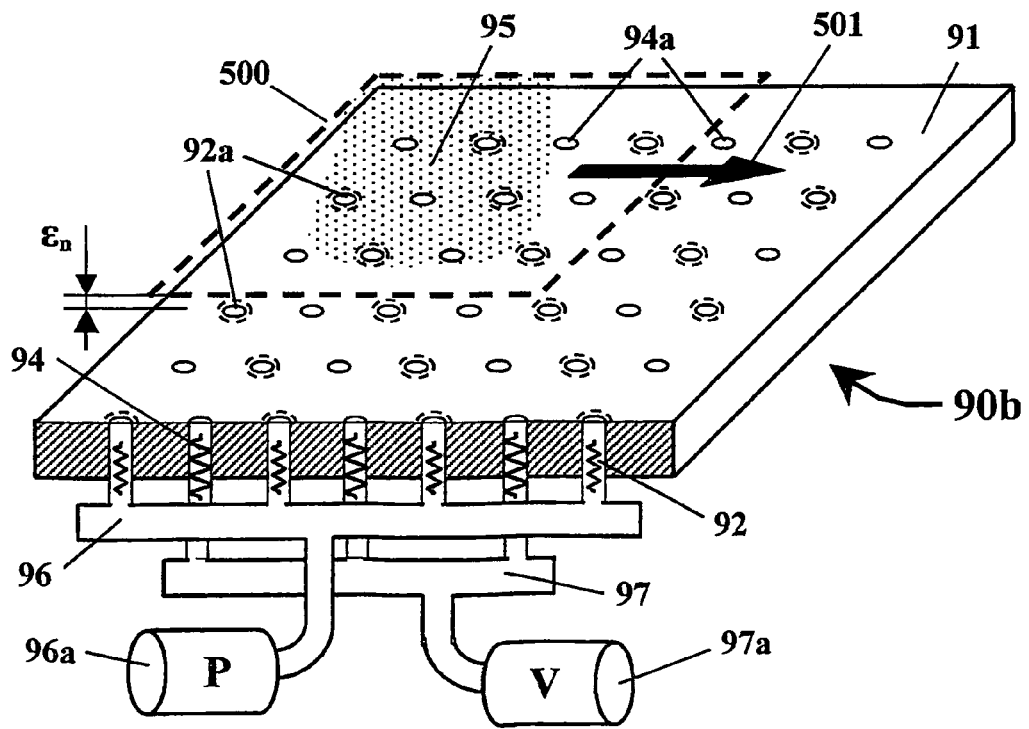
FIG. 9b illustrates a basic PV-type non-contact platform with both vacuum and pressure flow-restrictors where the supported object is much smaller than platform's active-area.

In accordance to another preferred embodiment of the present invention reference is now made to FIG. 9b, illustrating the PV-type non-contact platform 90b having a flat active-surface 91, equipped in a chess-table format (to provide a uniform support and local-balance), with a plurality of pressure flow-restrictors 92. preferably SASO nozzle, to provide the PRS characteristics of platform 90b, and a plurality of vacuum flow-restrictors 94 of much lower AD-resistance with respect to 92, preferably SASO nozzles. The PV-type air-cushion 95 is established between the object 500 lower surface and the active-surface 91 when an object 500 that may be larger, essentially equal or much smaller than the active-surface 91, in parallel placed in a close vicinity to the active-surface 91 of the platform 90b (at a predetermined gap $\epsilon_n$). The object 500 can optionally be supported at rest or be conveyed in a direction that is indicated by arrow 501. Both flow-restrictors 92, 94 secure the vacuum and the pressure level when the active-surface 91 is not fully covered. The outlets 92a of the pressure flow-restrictors 92, which introduce the air to feed the air-cushion 95, and the vacuum outlets 94a of the vacuum flow-restrictors 94 through which the out-coming air is sucked from the air-cushion 95, are distributed at the active-surface 91 in an alternating format. The of the outlets 92a, 94a are not necessarily equal nor must have a round shape. Each of the inlets of the pressure flow-restrictors 92 is fluidically connected to a bottom-side pressure reservoir 96, that is fluidically connected to an air-pump 96a to provide pressurized air, and each of the inlets of the vacuum flow-restrictors 94 is fluidically connected to a bottom-side vacuum reservoir 97, that is fluidically connected to a vacuum-pump 97a to provide "active" evacuation by vacuum suction. Alternatively, each of the inlets of the pressure flow-restrictors 92 and the inlets of the vacuum flow-restrictors 94 is fluidically connected to a bottom-side integrated double-manifold to be described hereafter (see FIG. 15b), that is fluidically connected to an air-pump 96a and vacuum pump 97a.

Figure 9C:
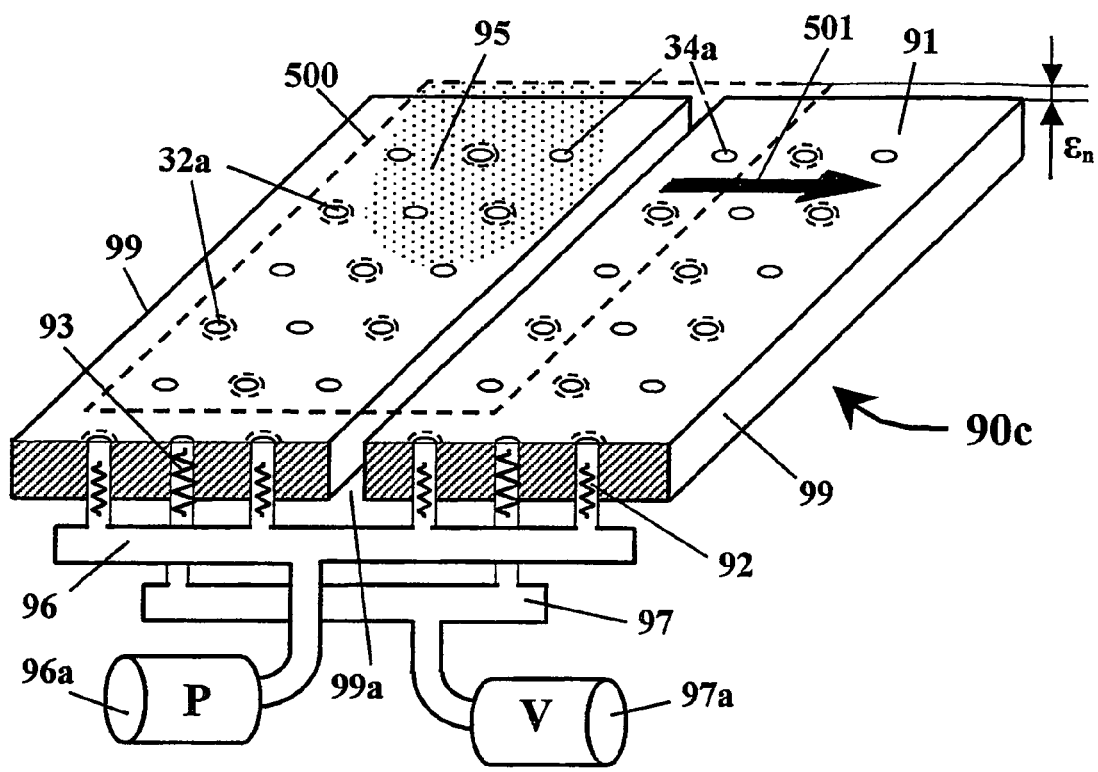
FIG. 9c illustrates a basic PV-type non-contact platform consisting of two segments.

In accordance with another preferred embodiment of the present invention reference is now made to FIG. 9c, where the flat active-surface 91 of the PV-type non-contact platform 90c is divided to several segments, where a division to two segments 99 in perpendicular to the object 500 direction of motion 501 is shown in FIG. 9c. The active-surface 91, equipped with both a plurality of pressure flow-restrictors 92 and vacuum flow-restrictors 94, preferably two different SASO nozzles, having an outlets 92a, 94a distributed at the active-surface 91 in an alternating format. The active-surface 91 can be divided also in parallel to the direction of motion or in a two-dimensional manner. In particular, such open spaces can optionally be used for assisting the process that takes place above the object through these open spaces, and it also allows to perform a dual-sided processing of the object. It can also be used for handling and conveying tools, and to position sensors for motion or process control. Other relevant details where discussed with respect to FIG. 9a or 9b. The active surface may be provided with one or more through-openings for the purpose of assisting the processing of the object and for handling operations on the object.

Figure 9D:
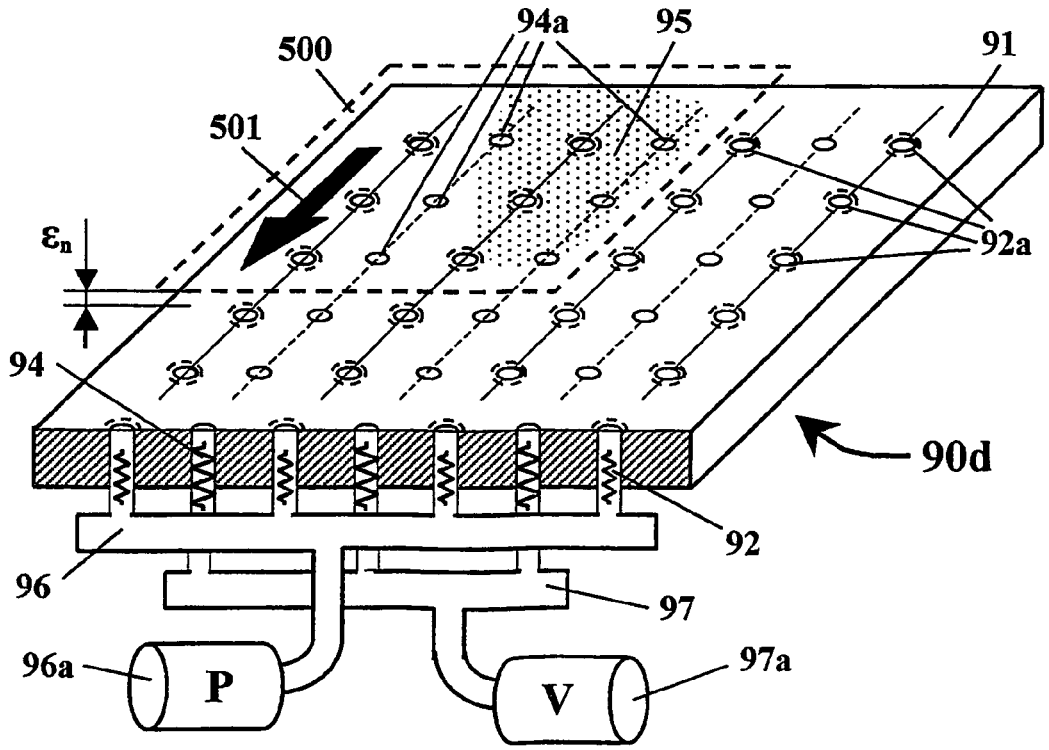
FIG. 9d illustrates a basic PV-type non-contact platform where the pressure and vacuum flow-restrictors are arranged in parallel alternating lines.

In accordance with another preferred embodiment of the present invention reference is now made to FIG. 9d, illustrating the PV-type non-contact platform 90d having a flat active-surface 91 that equipped with both a plurality of pressure flow-restrictors 92 and vacuum flow-restrictors 94, (preferably two different SASO nozzles), having outlets 92a, 94a distributed at the active-surface 91 in an alternating lines format (and not in a chess-table format), to provide enhanced flattening performances in an effective direction that is not perpendicular to these lines. For the same matters, it is an option to replace a limited number of vacuum flow-restrictor 94 with vacuum conduits with no flow restrictors.

In accordance with another preferred embodiment of the present invention reference is now made to FIG. 9e, illustrating the upper-gripping PV-type non-contact platform 90e having a downwards-facing flat active-surface 91 that is equipped with both a plurality of pressure flow-restrictors 92 and vacuum flow-restrictors 94, (preferably two different types of SASO nozzles), having outlets 92a, 94a distributed on the active-surface 91. In this case the object 500 is suspended at rest or conveyed in direction 501 with no-contact while it is gripped without contact from its upper side.

The scope of using the PV-type platforms is wide. In accordance with some preferred embodiments of the present invention, without derogating the generality, reference is now made to FIGS. 9f-h, where the PV-type platform is a carriage having an active-surface that can travel over a passive flat surface. The first example is illustrated in FIG. 9f, where a carriage 510 having a flat lower active-surface (not seen on the figures). The carriage is traveling over a wide flat table 520 where a motion in all directions is available. The carriage may have its own pressure and vacuum source or alternatively, it may fluidically connected to pressure and vacuum sources (not shown in the figures for brevity) though flexible pipes 540. This configuration can be applied also upside down where the carriage 510 is suspended under the flat table 520, which is located over it, (see FIG. 9h). Furthermore, this configuration is also relevant in case where the carriage 510 is the passive element and the flat table 520 is the active one. It is an option to use also PA-type platform (but not in the upper gripping option), in such configuration, especially when heavy loads are involved.

FIG. 9g illustrates a configuration for linear motion where a carriage 511 has a bottom flat active-surface (not seen on the figures). The carriage is traveling over an elongated flat pathway 521, and may be laterally limited from both sides by two limiting rails 531 (which may optionally be two opposing vertical non-contact surfaces to provide accurate and stable frictionless motion). The direction of motion is denoted by the arrow. The carriage optionally has its own pressure and vacuum source, but, alternatively, it may be fluidically connected to pressure and vacuum sources though flexible pipes 541. This configuration is also relevant in case where the carriage 511 is the passive element and the flat table 521 is the active one. It is also an option to use the PA-type platform in such configuration, especially when heavy loads are involved.

FIG. 9h illustrates an up-side-down configuration with respect to FIG. 9g, to be used for linear motion where a carriage 512 has an upper flat active-surface (not seen on the figures). The carriage is traveling below an elongated flat pathway 522, suspended by the PV-air-cushion from the upper side of it. The object may be laterally limited from both sides by two limiting rails 532 (which may optionally be two opposing vertical non-contact surfaces to provide accurate and stable frictionless motion). The direction of motion is denoted by the arrow. The carriage optionally has its own pressure and vacuum source, but, alternatively, it may be fluidically connected to pressure and vacuum sources though flexible pipes 542. Again, this configuration is also relevant in case where the carriage 512 is the passive element and the flat table 522 is the active one.

The active-surface of the PV-type non-contact platform in accordance with the present invention is preferably planar, suited for many supporting and conveying purposes, but it may also be cylindrical, curved or tortuous, according to the design requirements and the nature of the supported objects that are to be conveyed on it, and it may also depend on the processing performed above it. A Process may take place also at outer zones that are close to the edges of the active-area. It has to be emphasized that the active-surface of the PV-Type is not always rectangular and it may be of any shape. In particular it is convenient to use a round PV-type platform for supporting a round wafer that may be held at rest or moved in a spinning motion. Although it is convenient to use a chesstable format for allocating the outlets of the basic cell, the two lateral dimensions of the basic cell (see FIG. 4a) may be equal or not. In particular, it is favorable to apply fine resolution at a limited "process zone" to enhance performance at the area where the process is executed and, (for different reasons) to provide fine resolution close to the edges of active-surfaces, to limit edge-effects.

Figure 10A:
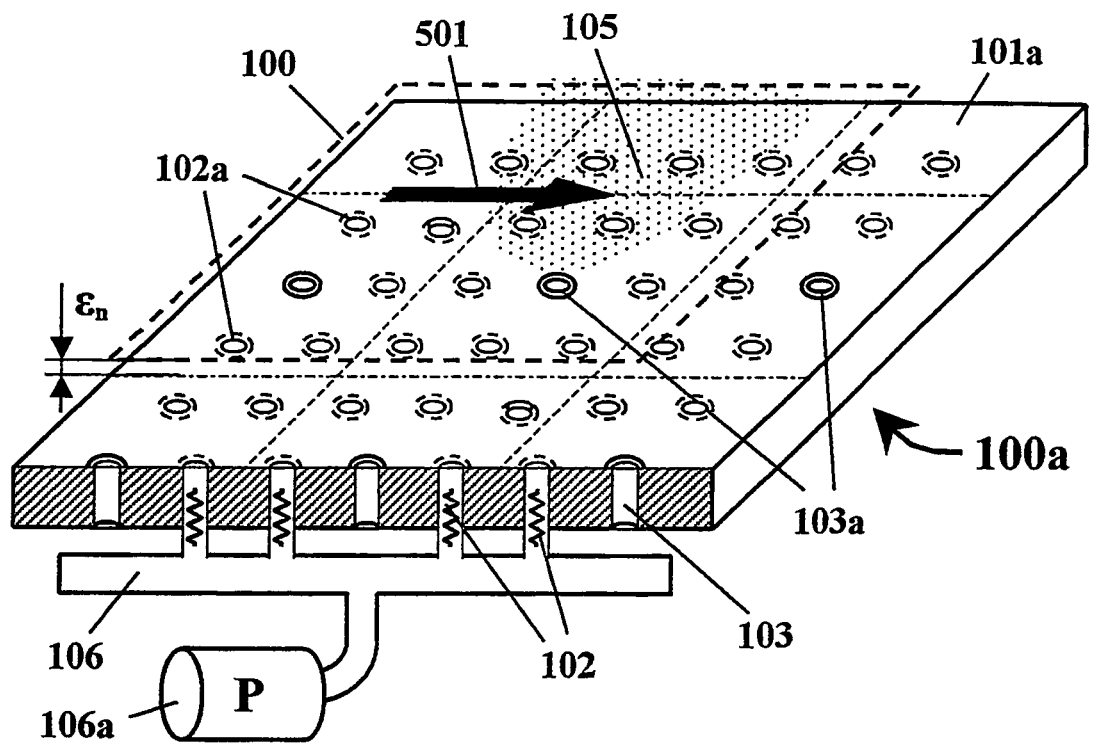
FIG. 10a illustrates a single active-surface of a basic dual-sided PP-type non-contact platform.
Figure 10B:
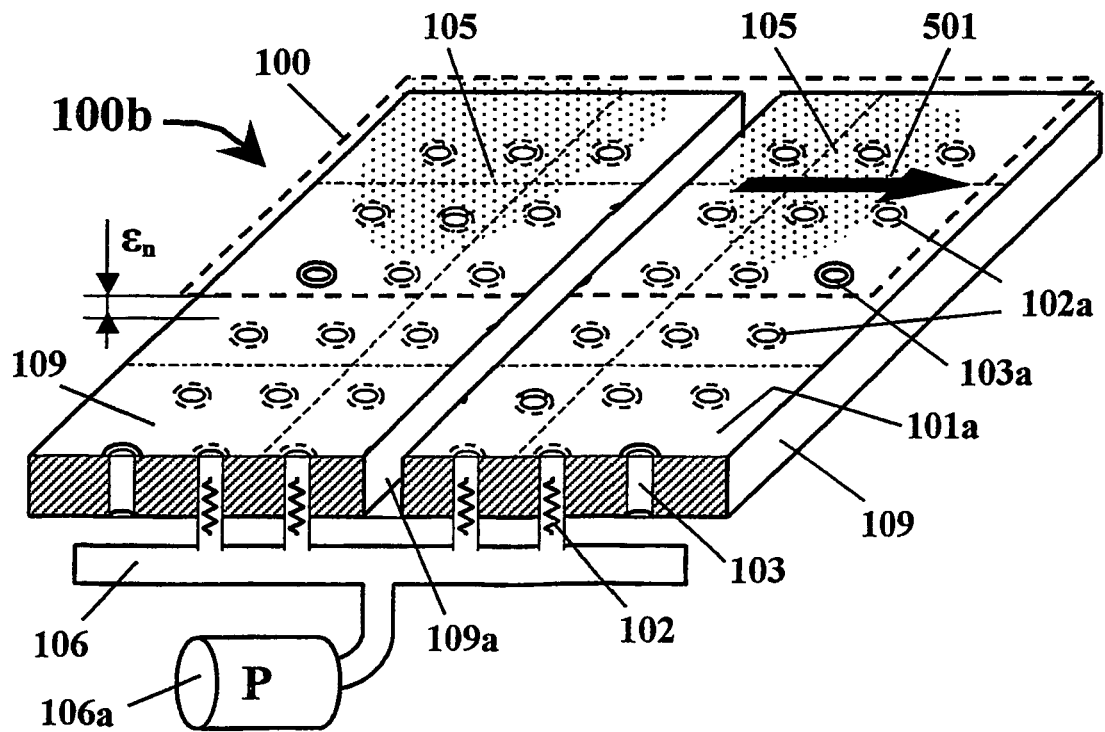
FIG. 10b illustrates a single active-surface of a basic dual-sided PP-type non-contact platform consisting of two segments.
Figure 10C:
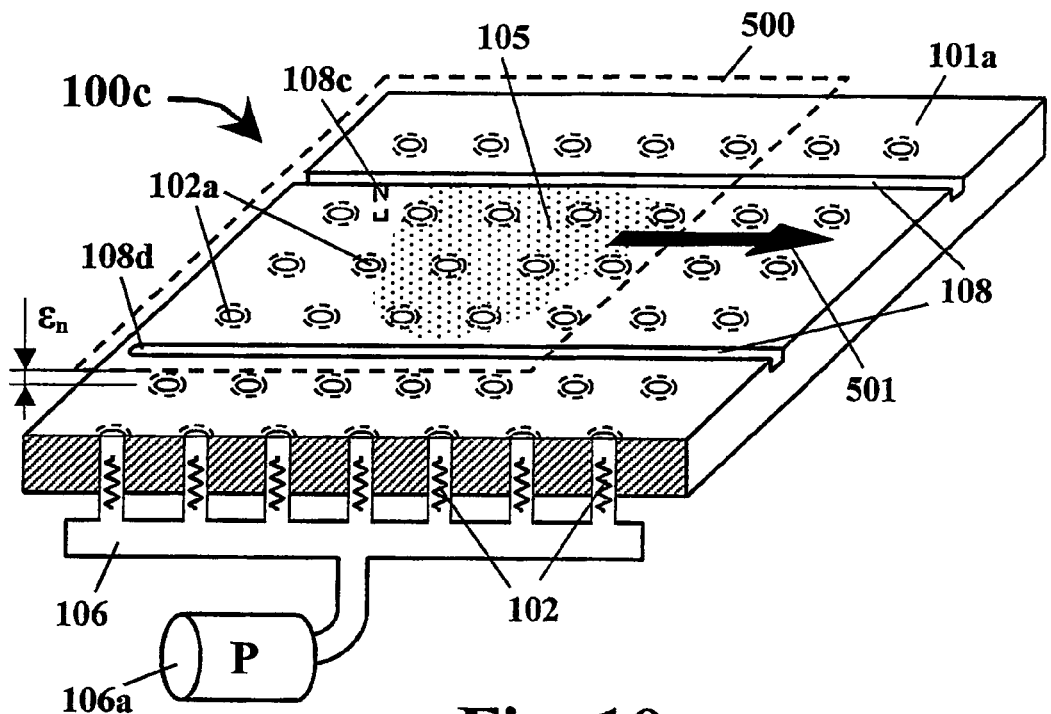
FIG. 10c illustrates a single active-surface of a basic dual-sided PP-type non-contact platform with surface air-evacuation grooves.
Figure 10D:
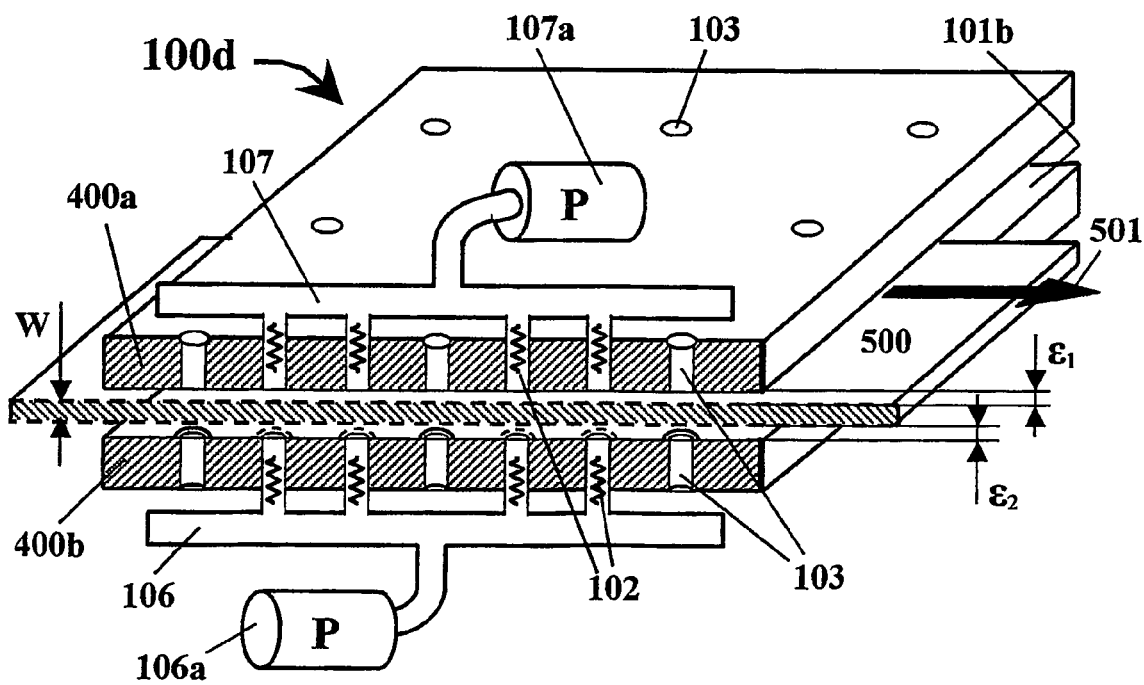
FIG. 10d illustrates a basic dual-sided PP-type non-contact platform.

In accordance with a preferred embodiment of the present invention reference is now made to FIG. 10a, illustrating a single flat active-surface 101a of the PP-type non-contact platform 100d having dual-side configuration (see FIG. 10d). The active-surface 101a is equipped with a plurality of pressure flow-restrictors 102, aimed at providing FRS characteristics to platform 100d and to secure the pressure level when the opposing active-surfaces are not fully covered, and a plurality of evacuation vents 103. The arrangement used for this active-surface follows the 8:1 ratio of a convenient basic-cell given in FIG. 6a. The air-cushion 105a is established between one of the surfaces of the object 500 and the facing active-surface 101a when the object 500, that may be larger equal or much smaller than the active-surface 101a, is in parallel placed in a close vicinity to the active-surface 101a (at a predetermined gap $\epsilon_n$), in between the two-opposing active-surfaces of the dual-side platform 100d. The object may optionally be held at rest or conveyed in a direction defined by arrow 501. The outlets 102a of the pressure flow-restrictors 102, which introduce pressurized air to the air-cushion 105a, and the outlets 103a of the evacuation vents 103 through which the air is evacuated from the air-cushion 105a, are distributed over the active-surface 101a at the above mentioned basic-cell format (to provide uniform gripping and local balance). The diameters of the outlets 102a, 103a are not necessarily equal nor must have a round shape. Each of the inlets of the pressure flow-restrictors 102 is fluidically connected to a pressure reservoir 106, that is fluidically connected to an air-pump 106a to provide pressurized air. Alternatively, each inlet of the flow-restrictors 102 is connected to a single-manifold integrated in the support surface (see FIG. 15a), which is connected to an air-pump 106a. In case of using vacuum-preloading, the vents 103 may connect to a reservoir, which is connected to a vacuum pump (not seen in the figure).

In accordance with a preferred embodiment of the present invention it is an option to divide the active surface of the PP-type non-contact dual-sided platform 100e configuration (see FIG. 10e), into several segments (a division into two segment 109 is shown in FIG. 10b) This configuration is considered to be the most practical PP-type platform. The figure illustrates a single flat active-surface 101b of the PP-type non-contact platform 100e having dual-sided configuration. The active-surface 101a is provided with a plurality of pressure flow-restrictors 102 for providing FRS characteristics of the platform 100e and to secure the pressure level when the opposing active-surfaces are not fully covered, and a plurality of evacuation vents 103. The arrangement used for this active-surface follows the 8:1 ratio of a convenient basic-cell given in FIG. 6a. The air-cushion 105a established between the one of the surfaces of the object 500 and the facing active-surface 101a when the object 500, which may be larger, equal or much smaller than the active-surface 101a, is in parallel placed in a close vicinity to the active-surface 101a (at a predetermined gap $\epsilon_n$), in between the two-opposing active-surfaces of the dual-side platform 100e. The object may optionally be held at rest or conveyed in a direction defined by the arrow 501. The two segments 109 of the active-surface 101a are divided in perpendicular to the direction of motion 501 and a space 109a is opened between them through which air may also be evacuated. In general, the active-surface 101a can be divided also in parallel to the direction of motion or in a two-dimensional manner.

In accordance with a preferred embodiment of the present invention it is an option to provide grooves on the active surface 101a of the dual-side PP-type platform such as platform 100d (see FIG. 10d), as illustrated in FIG. 10c. Grooves 108 are provided in parallel to the direction of motion 501 but they may be also aligned at any practical direction and dimension. Grooves can also be provided in a two-directional manner. The grooves may actually include evacuation-holes 108c and may also have an end 108d before reaching the active-surface 101a edges to direct the evacuated flow to the other side. The grooves may evacuate part of the out-coming flow as illustrated in the figure or perform most of the evacuation task, together with the edges of the active-area. In addition, such grooves can be optionally used for assisting the process that may take place above the object. They can also be used for handling and conveying tools, and for positioning sensors for motion or process control.

The active-surface of the PP-type non-contact platform in accordance with the present invention is preferably planar, suited for many supporting and conveying purposes, but may also be cylindrical or of any other practical shape, according to the desig requirements and the nature of objects supported or conveyed on it, and it may also depend on the nature of anticipated processing performed in the space between two segments of the PP-type platform, having two opposing active surfaces. In particular it is convenient to use a round PP-type platform to support a round wafer that may be holds in rest or being moved in a spinning motion. Although it is convenient to use the basic-cell format (see FIG. 2a), the two lateral dimension may not necessarily be equal. It is favorable to apply fine resolution close to the edges of active-surfaces.

In accordance with a preferred embodiment of the present invention, reference is made to FIG. 10d, illustrating a dual-sided PP-type non-contact platform 100d, having two opposing substantially identical active-surfaces, an upper active-surface 400a, similar to the active-surface 101a illustrated in FIG. 10a, and a substantially identical lower active-surface 400b. Alternatively, the active-surface 101a with surface grooves illustrated in FIG. 10c may also be used. The two opposing active-surfaces 400a, 400b of the platform 100d are in parallel aligned at a narrow distance in between them. The object 500 is gripped without contact by the aerodynamic forces exerted on it by the dual-sided platform 100e from both its sides. The object 500, which may be larger, equal or much smaller than the active-surfaces 101a, is in parallel placed in a close vicinity to the active-surfaces 400a, 400b of the dual-side PP-type platform 100d (at a similar predetermined air-cushion gaps). The object 500 may optionally be held at rest or conveyed in a direction defined by the arrow 501. The gaps of the two opposing air cushions, $\epsilon_1$ of the upper air-cushion that is established between the upper-side of the object 500 and the upper active-surface 400a and $\epsilon_2$ of the lower air-cushion that is established between the lower-side of the object 500 and the lower active-surface 400b can be identical or different. Different gaps can be situated by regulating the pressure of one of the active-surfaces, to adjust the levitation clearance with respect to any spatial requirements. The object 500 is gripped without contact in between the opposing active-surfaces 400a, 400b of the dual-side PP-type platform 100d, having a predetermined distance that is equal to the object width "w" plus $\epsilon_1$ plus $\epsilon_2$. If the objects may have different width, a "panel-width regulating mechanism" may be added to the dual-side PP-type platform 100d (not seen it the figure) in order to adjust the distance between the opposing surfaces. The pressure is individually supplied to the upper pressure reservoir 106, which is fluidically connected to an air-pump 106a, and to the lower pressure reservoir 107, that is fluidically connected to an air-pump 107a. Alternatively, the two pressure reservoirs can be replaced by a single-manifold integrated in the surface (see FIG. 15a), Alternatively, one air-pump is used to supply pressurized air to both the upper and the lower active-surfaces.

Figure 10E:
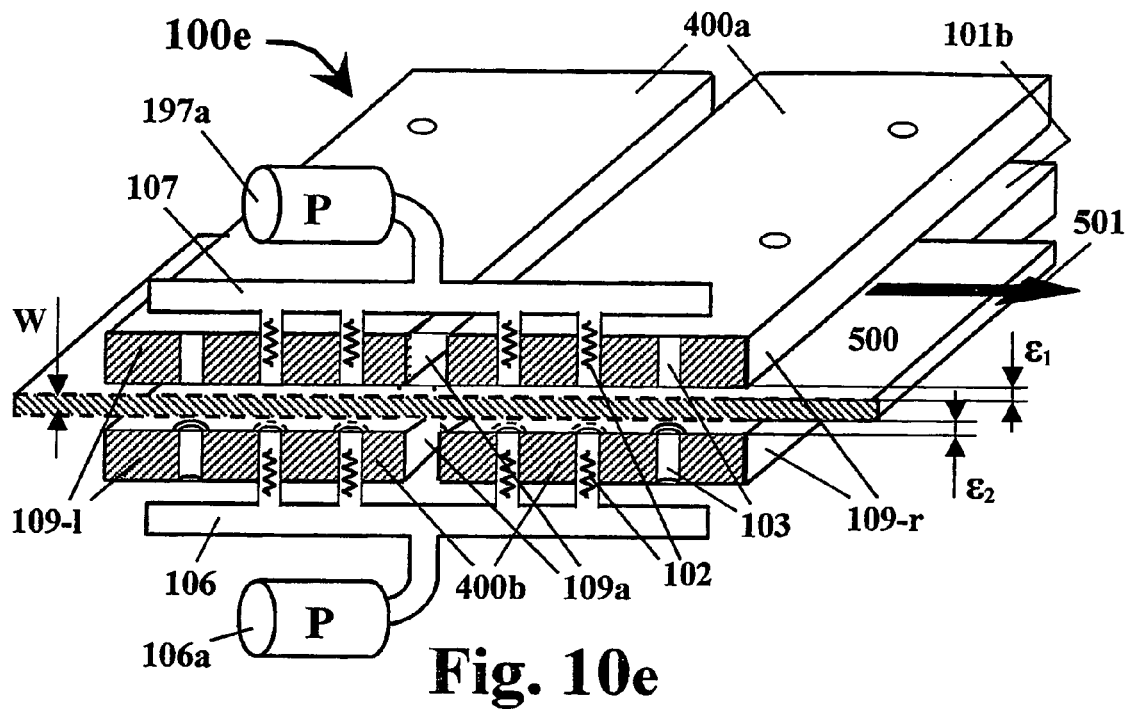
FIG. 10e illustrates a dual-side PP-type non-contact platform consist of two segments

In accordance with another preferred embodiment of the present invention, the active-surfaces are divided into several segments and a dual-side PP-type non-contact platform 100e with two segments, 109-l, 109-r as illustrated in FIG. 10e. The dual-side PP-type non-contact platform 100e has two opposing identical active-surfaces, a divided upper active-surface 400a, identical to the divided active-surface 101b illustrated in FIG. 10b, and an identical lower active-surface 400b. The two opposing active-surfaces 400a, 400b of the non-contact PP-type platform 100e are in parallel aligned at a narrow distance in between them. The object 500, that may be larger, equal or much smaller than the active-surfaces 101a, is in parallel placed in a close vicinity to the active-surfaces 400a, 400b of the dual-side platform 100a (at a similar predetermined air-cushion gaps). The object 500 is gripped without contact by the dual-sided platform 100e from its both-sides. The object 500 may be held at rest or conveyed in a direction defined by the arrow 501.

Figure 10F:
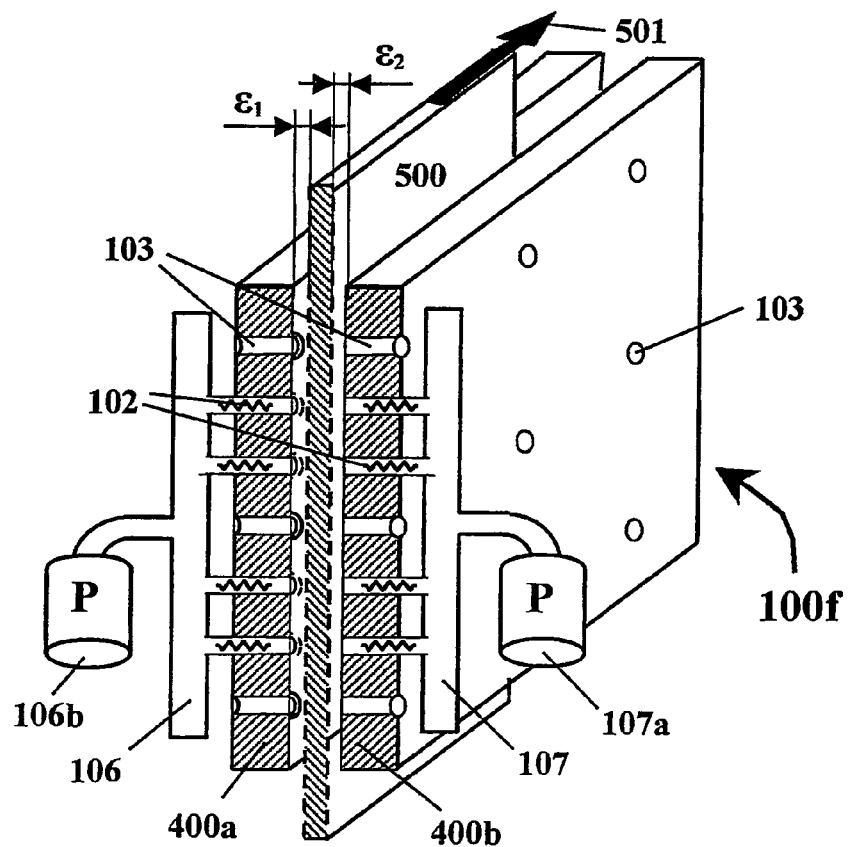
FIG. 10f illustrates the PP-type non-contact dual-side platform in a vertical orientation.

In accordance with another preferred embodiment of the present invention, reference is made to FIG. 10f, illustrating the dual-side PP-type non-contact platform 100d, positioned in a vertical orientation. In this vertical case, the foot print of the platform may be small, in-particular when wide-format objects such as FPD are involved. Object 500 may be vertically held at rest or conveyed in a direction defined by the arrow 501. It must be mentioned that vertical orientation provides the option to convey, and to perform any process where vertical orientation has any kind of advantages.

The performances of the dual-side PP-type non-contact platform can be determined by specifying a variety of mechanical and aeromechanical means, including, (1) the dimensions of the platform with respect to the object dimensions. It includes allocation of optional relaxation areas to decay the outside disturbances and vibrations (2) the flow-restrictors characteristics (and with respect to the preferred flow-restrictor, by specifying the geometrical parameters of the SASO nozzle configuration and physical dimensions), (3) the air-cushion gaps $\epsilon_n$, (4) the PP-type air-cushion basic-cell dimensions and details, (5) the operational pressure conditions, including optional means of regulation and control, and considering the possibility to apply local pressure regulation by dividing the active-surfaces, or one of them, or part of one on them to several individually regulated sectors to enhance flatness-accuracy. For the PP-type dual-side platform, one-dimensional sectors distribution is applicable at the edges areas that are close to the laterally wide and short space where processing may take place, as shown in the divided configuration, see FIG. 10d, (6) using of vacuum preloading to enhance AD-stiffness. From the application point of view, the aeromechanic design considerations preferably include the (7) flatness accuracy, flattening capabilities and other performances specifications (8) the character of the object (materials aspects, non-flatness imperfections, width bodyweight and dimensions), (9) the details of the motion involved, and (10) details of the process involved, including dimensionality and forces that may be imposed by the process.

The dual-side configuration of the pressure-preloaded PP-type non-contact platform provides high performance in terms of AD-stiffness, flattening capabilities and flatness-accuracy. It is mainly applied for providing accurate motion and flatness and parallel accuracies with respect to a processing machine, in cases of handling wide format planer objects. When non-contact gripping is applied by the dual side PP-type platform the following advantages are directly provided: (1) There is no contamination signature by contact. (2) No ESD (electrostatic discharge) problems or any other connecting or disconnecting problems (3) out-coming disturbances and vibrations are decayed. The PP-type platform effectively provides high performances in cases where the object is bowed or deformed in terms of up to a few millimeters with respect to the object characteristics and dimensions, It particular, it can flatten flat object having a width of few millimeters and more, with respect to the object characteristics and dimensions.

The opposing air-cushions of the dual-side PP-type platform may develop large counter forces on the object and accordingly on the structure of this dual-side PP-type platform that support the two opposing active-surfaces. Therefore, the structure must be of a very strong to avoid deformations that may affect the accuracy. The loads that involved are created when the object is placed in between the two opposing active-surfaces of the PP-type platform, but due to the evacuation vents or grooves or both, when an object with a width that is significantly larger than $\epsilon_n$ travels, loading occurs locally and temporarily only at the "active areas". If there is no object inside, the loads are significantly reduces, and practically may vanish.

With respect to mechanical means that may optionally be applied to a well-functioning dual-side PP-type platform, "panel-width adjustment mechanism" may be desired. In addition, such a mechanism can be a manual mechanism or fully automatic. Such a platform must include mechanical adjusting means to adjust the position and the orientation in term of flatness and parallelism with respect to the process machine or to any required reference. Shock observers are preferable to isolate any out-coming disturbances and vibrations.

It also preferable to add up-wise inlet section to the dual-side PP-type to direct the object leading edge to be smoothly inserted, preferably without contact and friction, in between the two opposing active-surfaces. Such an inlet may involve mechanical means such as roller and low friction materials or aeromechanic guiding means such as active-surfaces of the inlet and air-jets that may apply non-contact flattening forces by impingement to provide essentially in-motion insertion of the object. Alternatively, essentially motionless insertion process may applied where the inlet can be a unit with two active-surfaces where one of them is removed as needed for the insertion period and later it is returned towards the resting opposing active-surface that optionally may temporary is been switched to vacuum, in order to provide additional means of flattening (in-contact). After insertion, the in-motion active-surface closing back the gap and flatten the object during its motion. Finally the gap is adjusted to the operational gap (the object width+twice $\epsilon_n$). If vacuum switching was used, as mentioned above, switching back to operational pressure would terminate the insertion period and the object or its leading edge zone will be gripped and flattened without contact, ready for the following operations.

To avoid possible critical damage (both to the object and the platform), when trying to insert by mistake a flat object that is wider than intended, it is preferable to apply friendly barriers such as rollers or linear leaf-spring with a sensor capable of sending control alarm signal, thus stopping the process and avoiding such insertion failure. For this reason and with respect to the temporal nature of the loading during cycles of operations, it is preferable to connect the opposing active-surfaces of the PP-type platform via pre-loaded mechanical spring where as long as the force are below a predetermined limit, the platform act as usual but when, for any reason (width is not uniform, wider than expected or too-high operational pressure, to mention just a few) forced reache the allowed limit, the active-surfaces, or one of it is slightly pushed away in a self-adaptive manner (preferable to the counter direction with respect to the process). It provides a self-adaptive mechanism that limits the AD-forces and the forces acting on the structure to a predetermined value. A mechanical limiter for this mechanism may also be supply to allowed only small movements with respect to the air-cushion gap as it may be a non-parallel mechanism, unless it is designed for only one-directional translation movements. A signal to the main control unit may also be involved.

It has to be emphasized with respect to the divided-active surfaces that identical opposing divisions must be made for the upper and the lower active-areas, otherwise it will not function properly. A locally non balanced and not identical setup creates an asymmetric situation which causes strong local loading from one side and strong mechanical contact that may end with high friction forces if the object is in motion. Accordingly, the platform will malfunction and all required performance, in particular flatness-accuracy, will be severely damaged.

It is also important to emphasize that with respect to a preferred dual-side platform embodiment of the present invention, a dual-side non-contact platform can also be created on the basis of the PV-type active-surface as a replacement to PV-type active-surface. In such a case, the dual side PV-type platform has the essential advantages of the pressure-preloading mechanism, and additionally, vacuum-preloading mechanism. Although it may provide less AD-stiffness than the PP-type, due to the local "effective area" consequences, and accordingly less flattening performance, the dual-side PV-type platform is "passive" with respect to the loads imposed on the structure and, in fact, the outward forces practically vanish when it is operated at the nominal gaps ($\epsilon_n$). Nevertheless, in an off-set position, large forces may load the structure but they are much smaller than those developed in the PP-type platform. Although the dual side PV-type platform is a complicated platform with respect to the PP-type dual-side platform and additional vacuum source must be incorporated. It has the additional following advantages (1) It is allowed making of the upper and the lower active-surfaces slightly different without causing total malfunctioning, but it must be carefully designed. (2) upper side gripping can be applied during the insertion period. (3) switching to vacuum table is inherently available. It is also allowed to make a combination and to use PP-type active surface from one-side and PV-type active surface from the other side to create, for any reason, a mixed dual-side non-contact platform without causing total malfunctioning, but, again, it must be carefully designed.

Figure 11A:
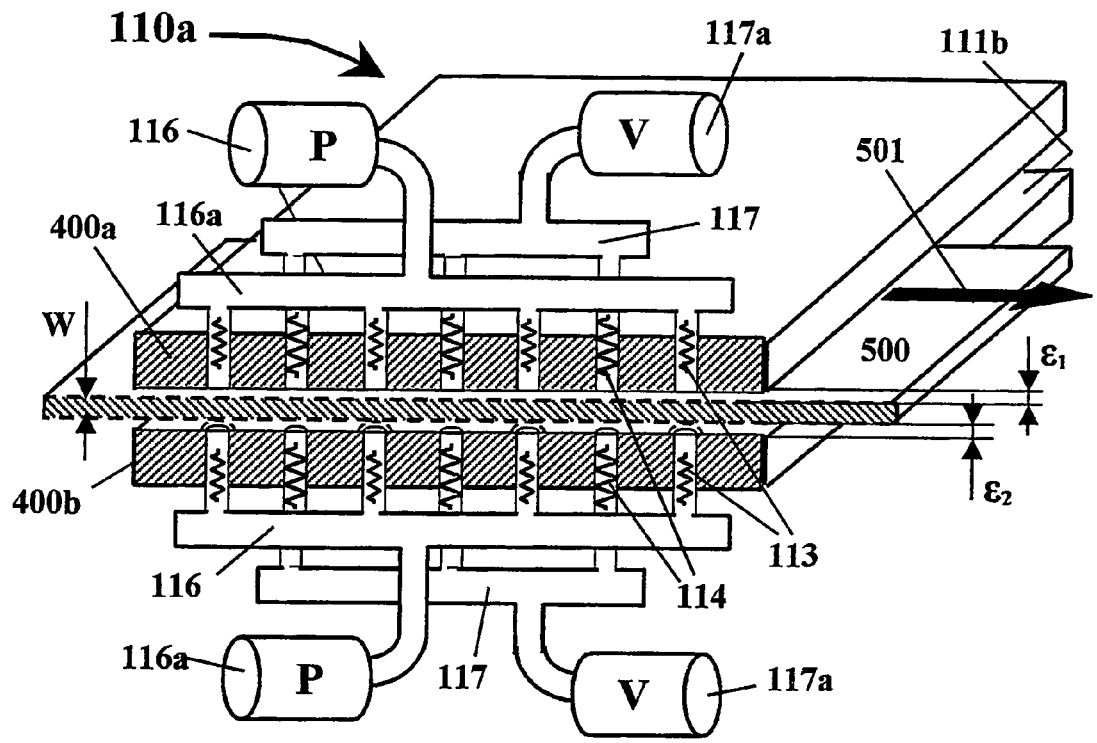
FIG. 11a illustrates a basic dual-sided PV platform.

In accordance with a preferred embodiment of the present invention, reference is made to FIG. 11a, illustrating another dual-sided non-contact platform 110a, each opposing surface being of the PV-type.

Figure 11B:
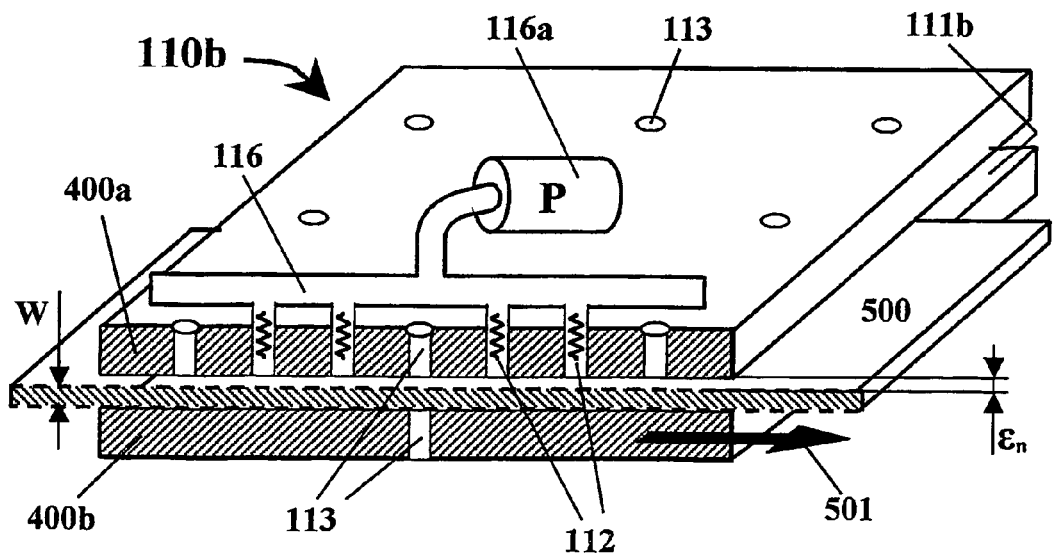
FIG. 11b illustrates a basic PM-type platform.

In accordance with a preferred embodiment of the present invention, reference is made to FIG. 11b, illustrating the dual-side PM-type non-contact platform 110b. where the upper surface is an active surface 111 such as shown in FIGS. 10a-c and the lower surface 112 is a passive flat surface capable of absorbing the AD imposed forces. When the PM-type platform is operated, forces are applied without contact to hold down the object 500, holding it pressed against the lower passive surface. Accordingly the object 500 is "flattened against a wall" and friction forces that may be useful to provide non-slippery motion are developed with respect to the upper air-cushion operational pressure. In fact a PP-type platform can immediately change its functionality to a PM-type platform by just switching of the pressure of the lower surface. The surface 112 can also be created with evacuation vents 113. Alternatively, the surface 112 is a vacuum table (not seen in the figure). Alternatively, the upper active-surface 111 may be divided into segments without respect to the lower passive surface 112. The lower-surface may be held at rest, or alternatively, the lower surface is used as a traveling table carrying the object as it travels. Without derogating the generality, the PM-type can be essentially of a flat or a cylindrical structure, and of a rectangular or around shape. In addition there is no restriction to apply such a platform upside down and irrespectfull of gravity.

Figure 12:
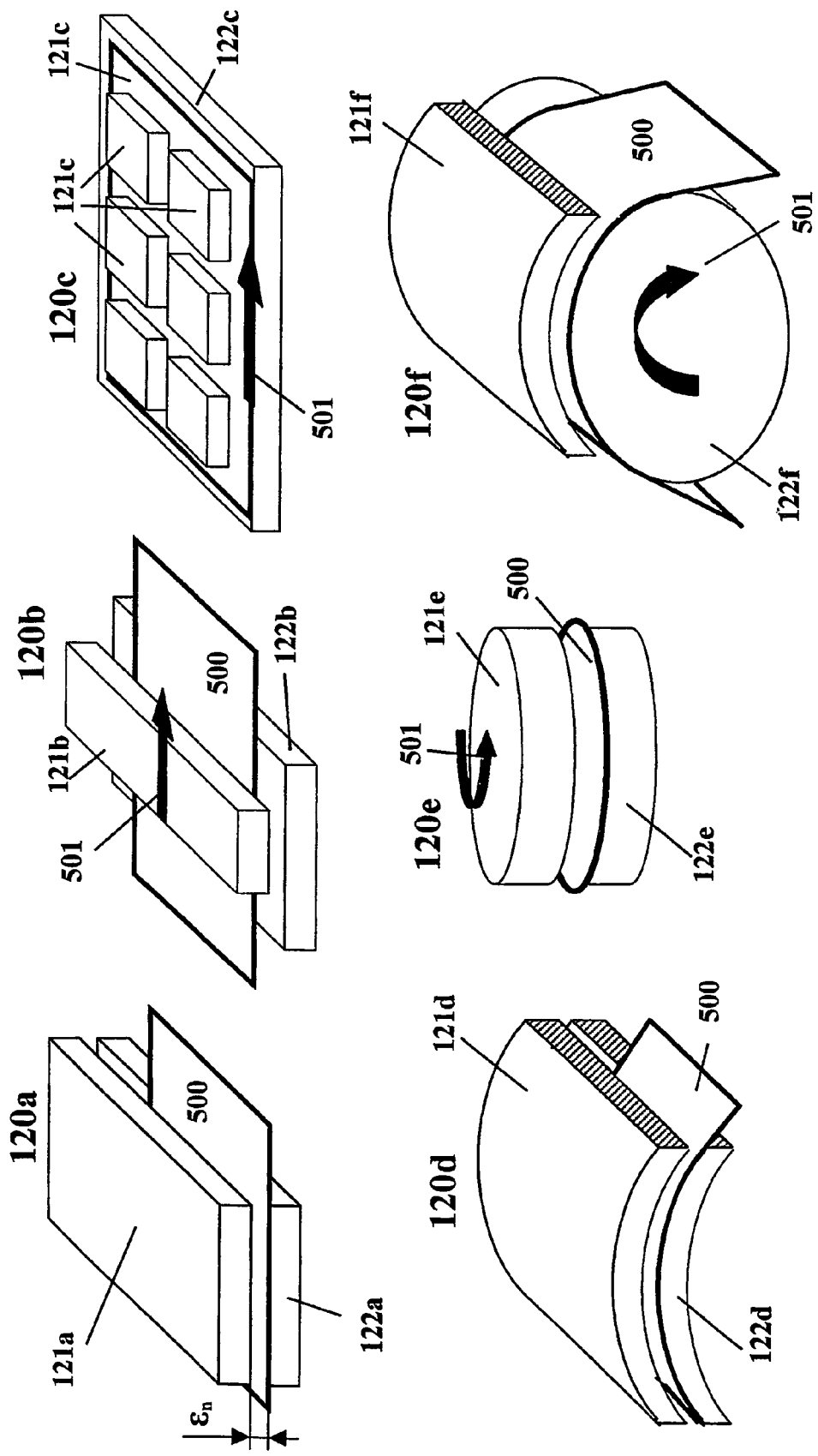
FIG. 12 illustrates various alternative embodiments of a PM-type non-contact platform.

In accordance with a preferred embodiment of the present invention, reference is made to FIG. 12 showing different practical applications for the PM-type platform. Case 120a illustrates a PM-type platform where the unit 121a has a lower active-surface and induces pressure forces on object 500 from a distance $\epsilon_n$, thus the object is flattened against the passive-surface of unit 122a, where both units are at rest. Both 121a and 122b are of substantially identical dimensions and the object is of different dimensions. Alternatively, the lower unit 122a is a vacuum table. Case 120b illustrates a PM-type platform where unit 121b has a lower active-surface which induces pressure forces on object 500, thus flattening it against the surface of the passive-unit 122b. The upper active-unit 121b is smaller than unit 122b and it travels in direction 501. Both unit 122b and the object 500 are at rest. Case 120c illustrates 6 active segments 121c that press the object 500 against the passive-unit 122c which is traveling with the object 500 in direction 501. Alternatively, the traveling unit 122c is a vacuum table. Case 120d is similar to case 120a but the opposing surfaces are cylindrically shaped, thus the object 500 is bowed against the lower unit 122d. Case 121e illustrates a round shaped unit where the upper unit 121e is capable of rotating. FIG. 120f illustrates a driving cylinder 122f that revolves in direction 501 and provides tensile motion to a flex media 500 where the friction forces is determined by the pressure that is induced by the active-unit 121f.

Figure 13:
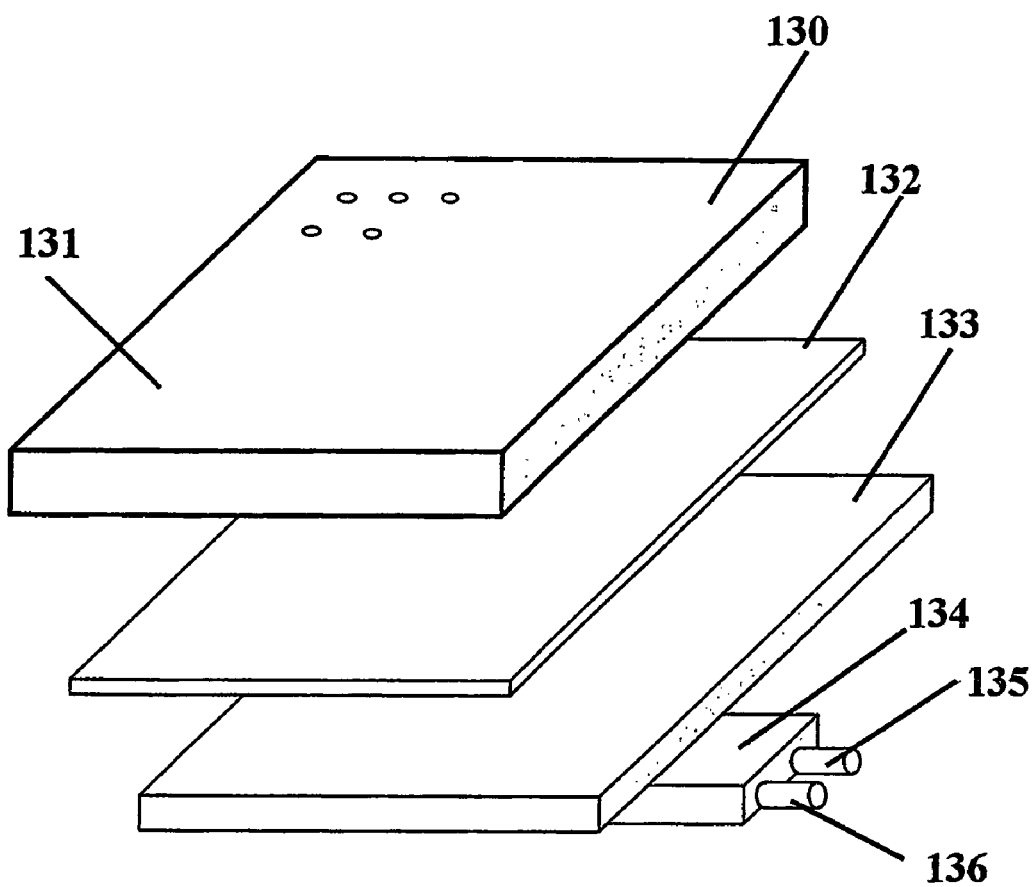
FIG. 13 illustrates a layered-structure of a typical active-surface.
Figure 14A:
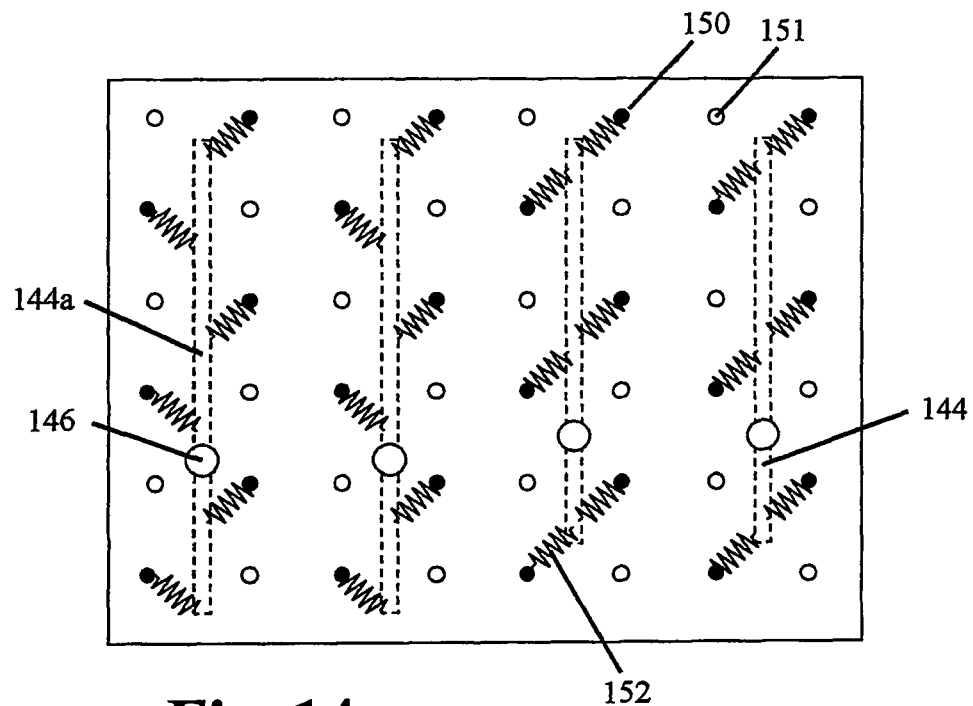
FIG. 14a illustrates a nozzle-plate with a plurality of pressure flow-restrictors.
Figure 14B:
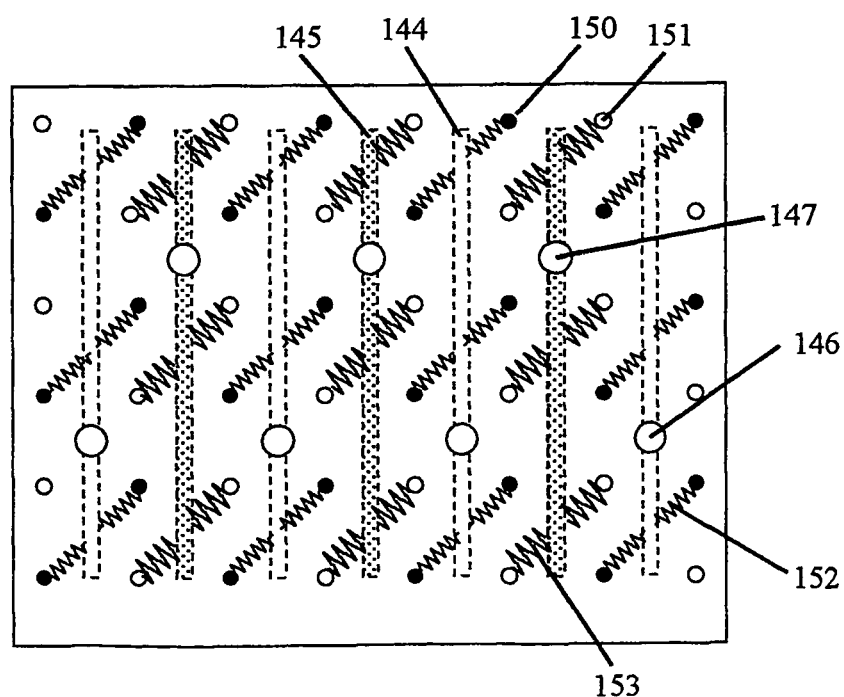
FIG. 14b illustrates a nozzle-plate with a plurality of pressure and vacuum flow-restrictors.

In accordance with a preferred embodiment of the present invention, attention is made to a specific structure of a typical active-surface with integral manifolds as shown in FIGS. 13-15. FIG. 13 illustrates a layered assembly of the active-surface having a top plate 130 that provides the top structural rigidity of active-surface 131. the intermediate plate 132 is the nozzles-plate and the lower plate 133 is the cover plate. The outer elongated manifold 134 with pressure connector 135 and optimally also with vacuum connector 136 provide the operational conditions in a one directional manner. Optional design details of the layers are shown, for example, in FIGS. 14a, 14b, 15a, 15b. FIG. 14a illustrates a nozzles-plate in cases where only pressure flow restrictors such as SASO nozzles are provided. Such a nozzles-plate can be for example, manufactured using Lasers (Yag and $Co_2$), or by punching or molding. It is possible to produce individual flow-restrictors, but it is convenient and cost-effective to manufacture such nozzles-plate, from assembly considerations. FIG. 14a presents a thin plate (typically 0, 1-4 mm thickness), having a plurality of flow-restrictors 152 having outlets 151 such as SASO nozzles and a plurality of through-holes 151 provided as the evacuation vents (either for free evacuation of air or coupled to a vacuum reservoir for active suction of the air, but without flow restrictors). It is an option to create a plurality of internal supply ducts 144 aligned in parallel (not a must), where each pair of flow-restrictors has shared inlets as shown in the right side. Alternatively each flow-restrictors is individually connected to the internal supply ducts 144a as shown it the left side. The air is supplied to the internal ducts by cross-layer passages 146. FIG. 14b illustrates a nozzles-plate in cases where also vacuum flow-restrictors 153 have outlets 151 (from which the air is sucked by the vacuum), such as SASO nozzles. The pressure flow-restrictors 152 have a significantly larger AD-resistance with respect to the vacuum flow-restrictors 153. Each of the pressure flow-restrictors 152 is connected to the pressure internal ducts 144 and each of the vacuum flow-restrictors 152 is connected to a second set of vacuum internal pressure ducts 145. The pressurized air to the pressure internal ducts is supplied by cross-layer passages 146, and the vacuum suction to the vacuum internal ducts is supplied by cross-layer passages 147. This figure presents one option of creating internal supply ducts inside the nozzles plates, but it is an option to create also ducts at the top plate or the bottom plate, or any practical combination.

Figure 15A:
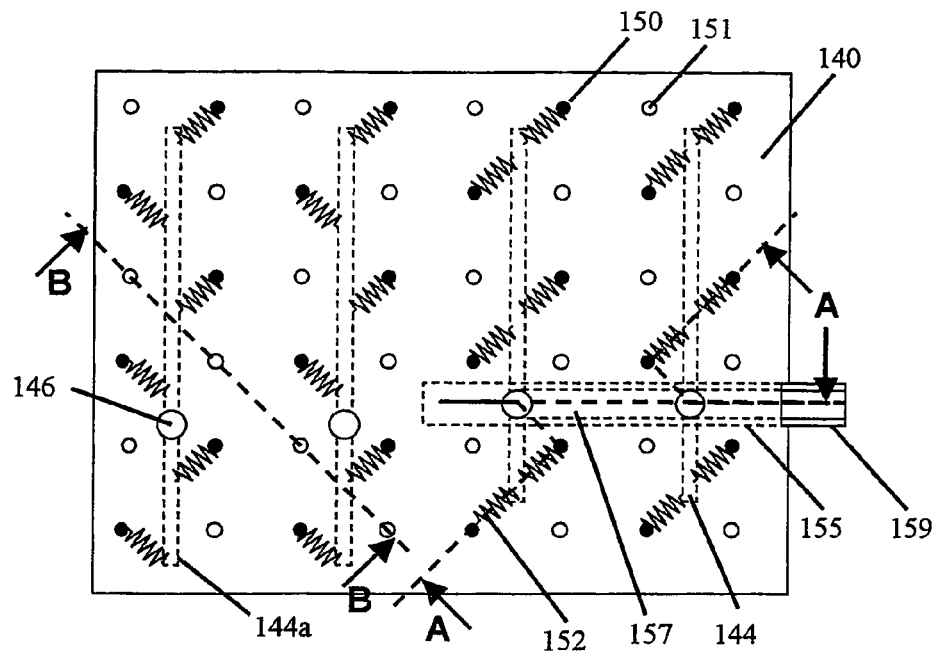
FIG. 15a illustrates an integrated single manifold embodiment of a typical active surface with only pressure flow restrictors, and cross-sectional views.
Figure 15A:
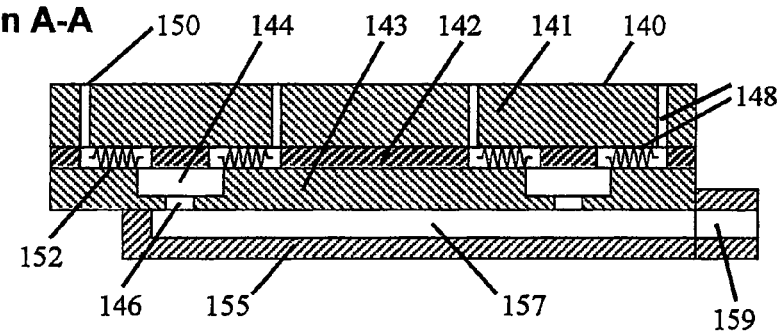
Figure 15A:
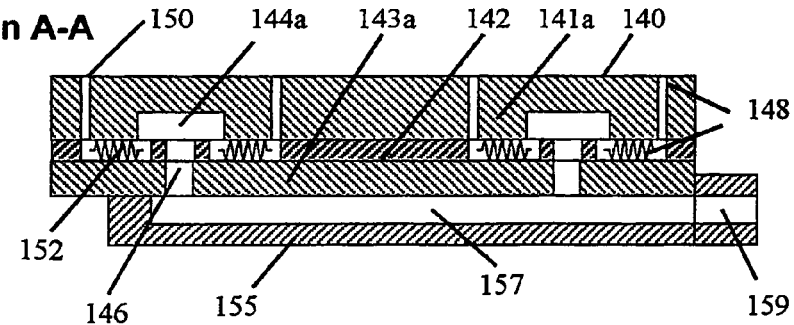
Figure 15A:
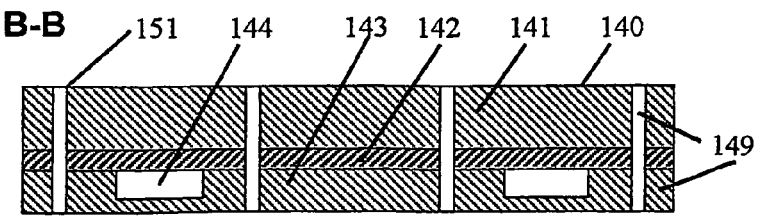

FIG. 15a illustrates an integral single-manifold with respect to the nozzles plate shown in FIG. 14A. The top part of the figure present the main pressure manifold 155 with a pressure connector 159 and internal channel 157 that is substantially orthogonal to the internal pressure ducts 144, thus it provides pressurized air to each of the internal pressure ducts 144 through the cross-layer passages 146. Accordingly, channel 157 is much wider than the internal ducts typical width, to deliver a predetermined MFR without pressure losses. Cross section AA (option 1) illustrates a case where the internal pressure ducts 144 are created at the lower surface of the cover plate 143 and cross section AA (option 2) illustrates a case where the internal pressure ducts 144 are created at the upper surface of the top plate 141 having the active-surface 140. Cross section BB shows the evacuation vents 149 having outlets 151, crossing the three layers assembly.

Figure 15B:
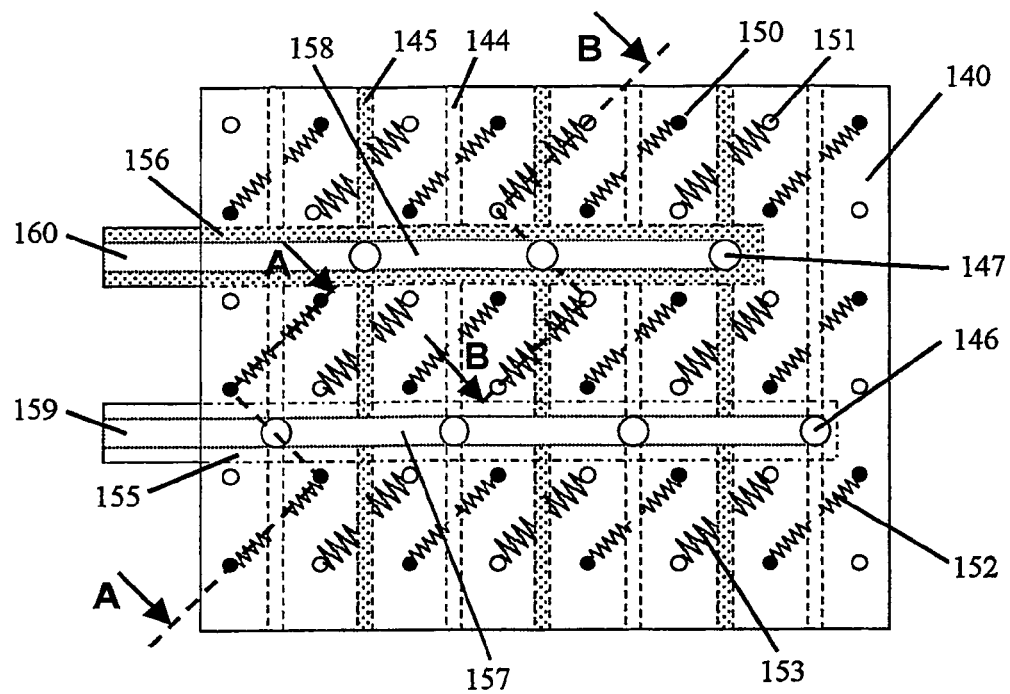
FIG. 15b illustrates an integrated double-manifold embodiment of a typical active surface with pressure and vacuum flow restrictors, and cross-sectional views.
Figure 15B:
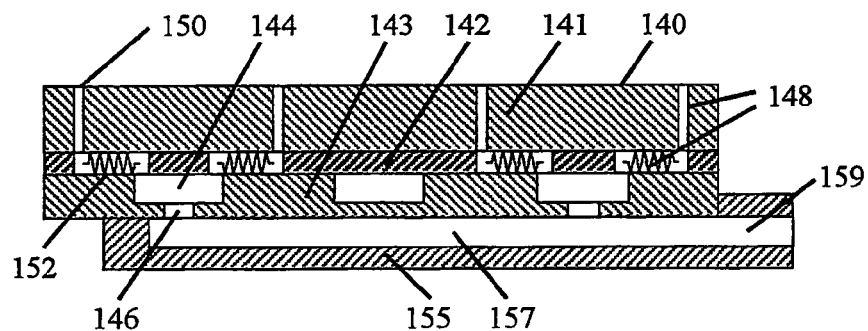
Figure 15B:
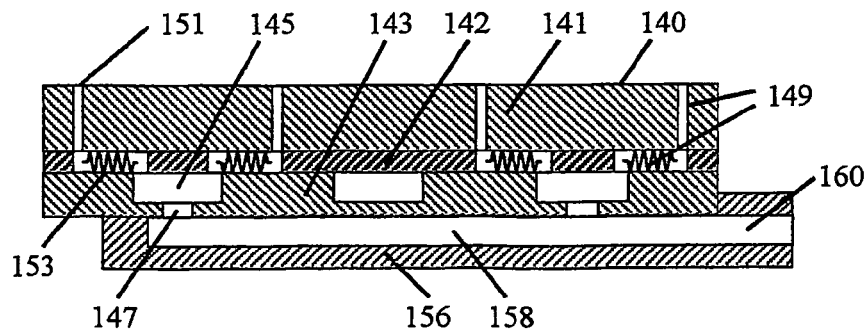

FIG. 15b illustrates an integral double-manifold with respect to the nozzles plate shown in FIG. 14b. The top part of the figure present the main pressure manifold 155 with a pressure connector 159 and internal channel 157 that is substantially orthogonal to the internal pressure ducts 144, thus it provides pressurized air to each of the internal pressure ducts 144 through the cross-layer passages 146. Accordingly, channel 157 is much wider than the internal pressure ducts' typical width, to deliver MFR without pressure losses. In addition the integral double-manifold includes a main vacuum manifold 156 with a vacuum connector 160 and internal channel 158 that is substantially orthogonal to the internal vacuum ducts 145, thus it provides vacuum to each of the internal vacuum ducts 144 through the cross-layer passages 147. Accordingly, the channel 158 is much wider than the internal vacuum ducts' typical width, in order to deliver MFR without vacuum losses. Cross section M illustrates schematically a cross-section of the pressure flow-restrictors 152, and cross section BB illustrates schematically a cut of the vacuum flow-restrictors 153.

Without derogating the generality, When a non-contact platform is applied to support the object with no contact there are two essential options. Firstly, the supported object may be made to be supported at rest. The object position can be fixed in place with respect to the platform by using of several side pins or cylinders or circumferential guiding plates. Alternatively It can be fixed in place by several vacuum pads that hold the object's lower or upper or side surfaces or circumferential elongated vacuum gripping. Alternatively it may be held mechanically by edge grippers. All those examples are aimed at preventing lateral motion and movements. Some of the means to hold the object at rest may be integrated in the non-contact platform.

Secondly, when motion is desired, the supported object travels without contact over the support-surface of the platform and may be driven by pushing pins or pushing guiding plate. Alternatively the object may be driven by horizontal rollers or cylinders, or vertical drive cylinders that touch the object edges, or belts, where friction may be enhanced by non contact induced forces (implementing a PM unit). Alternatively the object is driven by a one or two side gripper bars that hold the object side edges, by several mechanical dampers or by several vacuum pads at one or two of the object side edges. Alternatively the object may be driven by a gripper bar that holds the leading or the trailing edge of the object by mechanical dampers or vacuum pads. When the no-contact platform is a vertically oriented the object may tilt by a driven upper gripper bar or by bottom side rollers or belt. Alternatively the object is moved by a lower or upper drive mechanism that has vacuum pads to clamp internal areas of the lower or the upper surfaces of the object. In case of round non-contact platforms, the object may be rotated by a driving cylinder that touches the edge of a round object or clamped by a spinning circumferential open rig that has internal dampers or vacuum pads, thus relative motion between the object and the clamping unit is avoided. When non-contact platform supports an object, lateral and rotational movements can be easily performed by a robotic hand to manipulate the positing of the object as required. For example, it is convenient to use non-contact aligning and position-registration of wafers and FPDs and to provide non-contact support at accurate linear or rotational motion when a process on wafers or FPDs takes place, where horizontal positioning is governed by the drive unit and the vertical position is determined by the air-cushion that may be regulated by AD means. It is also an option to provide pure aerodynamic friction forces to drive the object, and one way is to use directing jets or wall-jets. Motion, of course, must be controlled both to provide the required speed and an accurate positioning.

Figure 16:
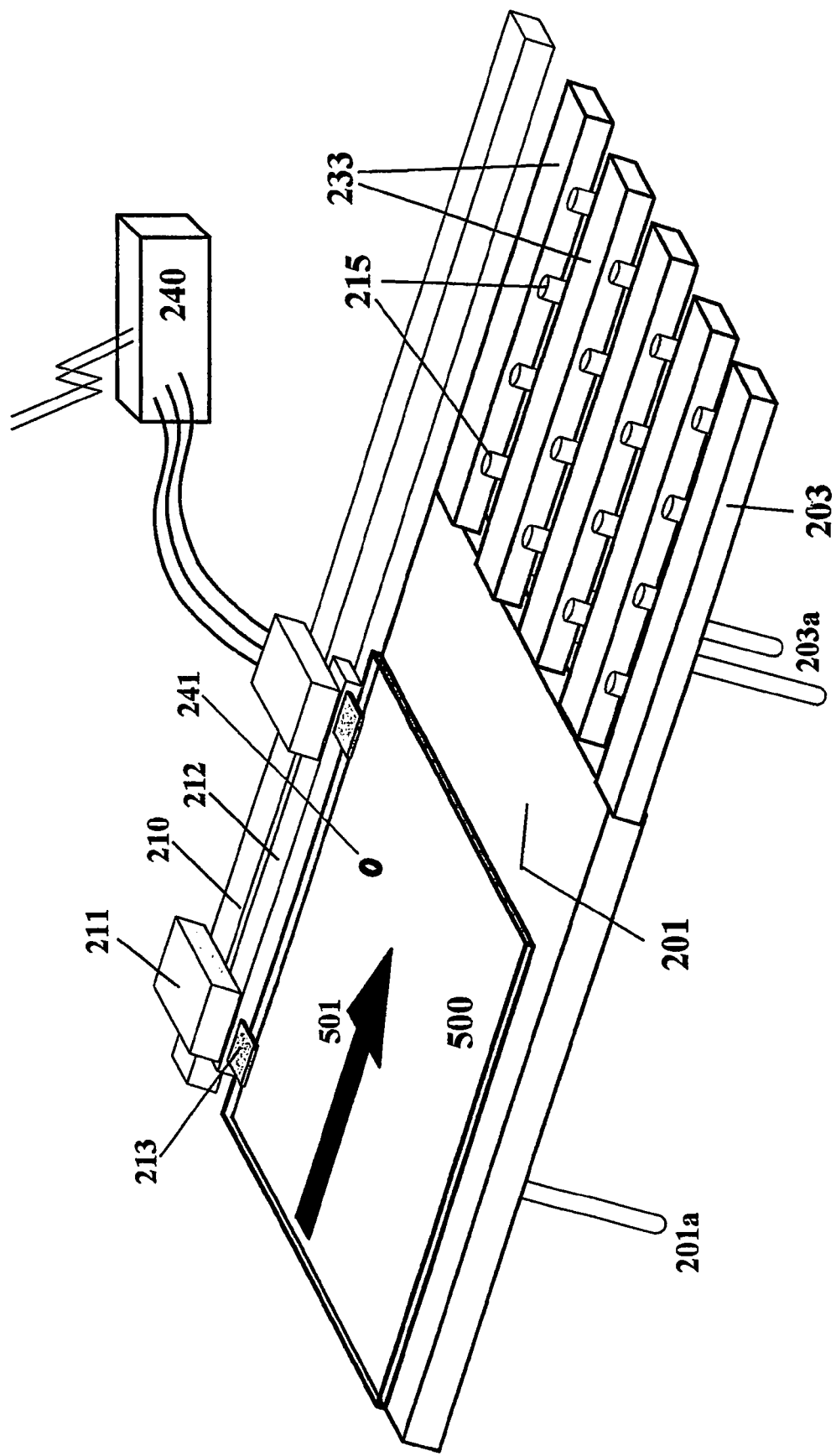
FIG. 16 illustrates a typical non-contact conveying system.
Figure 17:
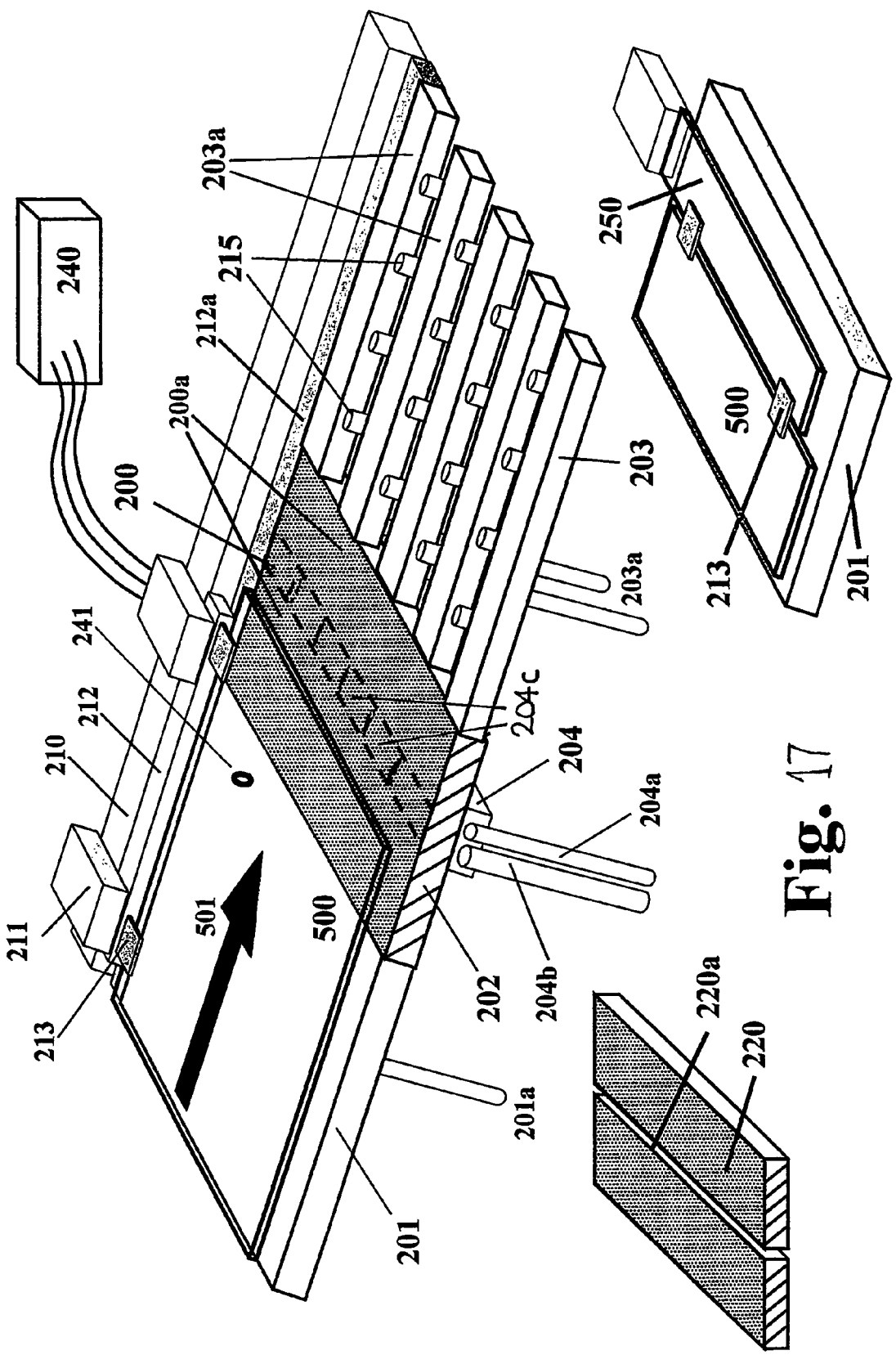
FIG. 17 illustrates a one-side high-performance system.
Figure 18:
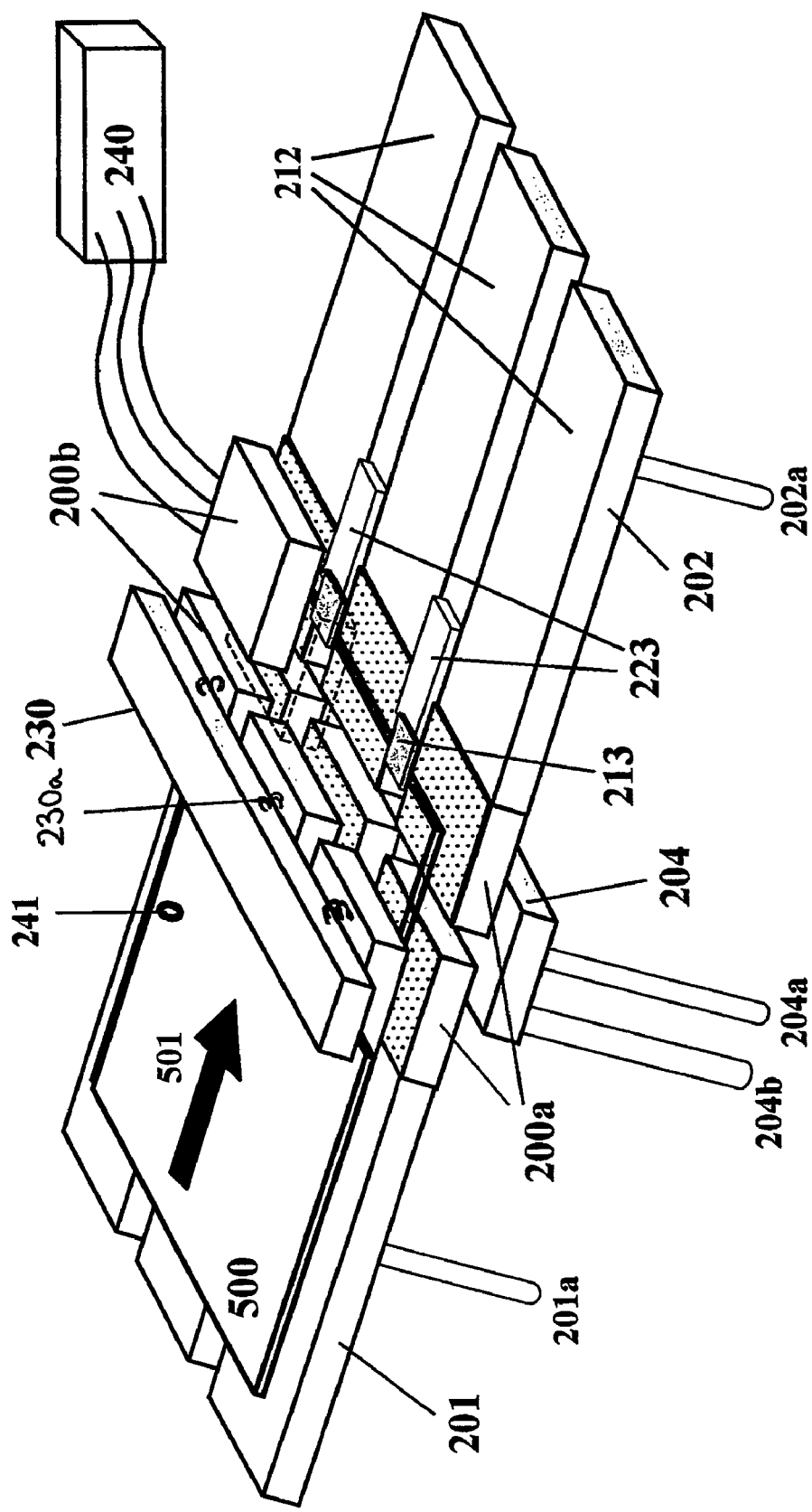
FIG. 18 illustrates a dual-side high-performance system.

Basic non-contact support systems of the present invention are presented in FIGS. 16-18. With respect to a preferred embodiment of the present invention, FIG. 16 illustrates a typical non-contact conveying system having a long PA-type (may alternatively be PV-type) active-surface 201 with pressure supply piping 201*a*. the object 500 is driven in direction 501 by a linear drive system having a straight pathway with two traveling carriage 211 that support a side gripper bar 212 with mechanical gripper fingers 213 that grip the object 500 side edge that is placed outwardly (typically up to 2 cm) from the active-surfaces. The left-side of the system is a loading/unloading area 203 built of 5 non-contact PA-type segments 233 (PV-type may also be used). The segments 233 connect to the pressure supply piping 203*a*. In between the segment 233 there is a lifting and landing mechanism having a plurality pines 215. The pins 215 may also be of non-contact pin where air-cushion is generated at each of the pines top surface (thus lateral movement must be provided by additional means such as peripheral guiding plates) or provided with top vacuum pads. Such a system is provided with a control unit 240 and various types of sensors, where for example, sensor 241 measured the speed of motion of the object 500. The control unit may also communicate with other machines.

With respect to another preferred embodiment of the present invention, FIG. 17 illustrates a typical one-sided high-performance system. This system provides high performance with respect to flatness accuracy and conveys the object 500 without vibrations. It includes the loading and unloading conveying zone 201, 203 that can be a conventional (like rollers or a belt conveyer) or of non-contact nature. With respect to the present invention, a PA-type non-contact platform is applied but it can be also the PV-type platform. In addition, a new central PV-type active-surface is provides 203 having main-manifold 204 and pipe lines for supplying pressure 204*a* vacuum 204*b*. If aeromechanic regulation is to be used, 204 is equipped with separately controlled pressure or vacuum sub-manifold sectors 204*c*, in order to adjust locally the levitation gap along the process zone. The PV-type unit 202 consists of a central process-zone 200 and relaxation zones 200*a* (typically of about 5-15 lengths of a basic cell).to decay spatial disturbances and vibrations coming from outer zones, When accurate lateral positioning is required, the linear drive-system must be accurate, optionally by using an air-bearing system. Optionally, the side-gripper-bar 212 is connected to the drive system (210,211) mechanically but it provides freedom in the vertical direction and the side-gripper-bar is supported without contact to the upper elongated active-surface 212*a*. It provides also an option to align the vertical level of the griper 212 with the object 500 by AD-means (by regulating the pressure). The process in this case is performed at the processing zone above the upper surface of object 500 but it is an option also to divide the central accurate zone into two segment 220 as shown in the left side, thus at option to assist the process from the lower side or to perform a dual-sided processing is available though the space 220*a* that is opened between the two segments. Other alternatives are: (1) to use a two side gripping bars to drive the object 500 from both sides, to eliminate dynamic moments (2) to use leading edge gripper-bar 250 shown on the lower left side that is floating on the same air-cushion that floats the object 500, thus it provides natural horizontal alignment between the gripper and the object.

With respect to another preferred embodiment of the present invention, FIG. 18 illustrates a typical dual-side high-performance PP-type or PV-type system (PV-type is shown in the figure), having a dual-sided central accurate section 200 that provides high flattening performance and flatness-accuracy, and loading and unloading outer conveying zones 201, 202 that can be of conventional or of non-contact nature. With respect to the present invention, a PA-type non-contact platform is used but it can be also a PV-type platform. The dual sided non-contact system shares many details with the previously mentioned systems. The dual side PP-type or PV-type platform opposing active-surface 200*a*, 200*b* and the outer conveying zones are divided into three identical segments 212, and the drive system is implemented through the two spaces that are symmetrically created between the segments 212. The object 500 that is clamped without contact between the opposing active-surface of 200*a*, 200*b* is driven in direction 501 pulled from the object leading edge by a drive system 213 that has two arms traveling in the space between the segments 212 and clamping by vacuum pads or mechanical griper 213 the surface that is close to the leading edge of object 500. As large forces may develop, a rigid supporting structure is required as indicated by the heavy bar 230. This bar is part of a panel with compensation mechanism for compensating by way of adjusting the gap between two opposing active surfaces, when operating with different object widths. It this case the process can be taken place at the lateral central space between the two segments of the accurate dual-side platform. The process can be performed above the surface or, alternatively, a dual side process can take place. Aerodynamic regulation of the flatness accuracy that is similar the system described in FIG. 21 can also be implemented in the non-contact dual side platform. Springs 230*a* are optionally provided to act as adjust the gap between the two substantially opposite support surfaces in a parallel and self-adaptive manner, and limit the forces induced on the two substantially opposite support surfaces to below a predetermined threshold.

Although only rectangular systems where disclosed, similar platforms can be created in a cylindrical coordinates where spinning motion is involved.

It should be clear that the description of the embodiments and attached Figures set forth in this specification serves only for a better understanding of the invention, without limiting its scope.

It should also be clear that a person skilled in the art, after reading the present specification could make adjustments or amendments to the attached Figures and above described embodiments that would still be covered by the present invention. Furthermore, details and features described herein with reference to the embodiments shown in the Figures can be, an many cases, implemented interchangeably, optionally or alternatively, where applicable.

The invention claimed is:

1. A non-contact support platform for supporting without contact a stationary or traveling object by air-cushion induced forces, the platform comprising:
   at least one of two substantially opposite support surfaces, each support surface comprising a plurality of basic cells each having at least one of a plurality of pressure outlets and at least one of a plurality of air-evacuation channels, each of the pressure outlets fluidically connected through a pressure flow restrictor to a high-pressure reservoir, the pressure outlets providing pressurized air for generating pressure induced forces, maintaining an air-cushion between the object and the support surface, the pressure flow restrictor characteristically exhibiting fluidic return spring behavior; each of said at least one of a plurality of air-evacuation channels having an inlet and outlet, the inlet kept at an ambient pressure or lower pressure under vacuum condition, wherein the pressure flow restrictor comprises a conduit, having an inlet and outlet, provided with two opposite sets of fins mounted on the inside of the conduit, each two fins of same set and a portion of the conduit internal wall between them defining a cavity and the fin of the opposite set positioned opposite said cavity.

2. The platform as claimed in claim 1, wherein internal supply ducts are provided to each of which some of the pressure outlets are connected.

3. The platform as claimed in claim 1, wherein said at least one of a plurality of air-evacuation channels includes an evacuation flow restrictor.

4. The platform as claimed in claim 3, wherein the evacuation flow restrictor comprises a conduit, having an inlet and outlet, provided with two opposite sets of fins mounted on the inside of the conduit, each two fins of same set and a portion of the conduit internal wall between them defining a cavity and the fin of the opposite set positioned opposite said cavity.

5. The platform as claimed in claim 1, wherein the air evacuation channels are fluidically connected to a vacuum reservoir.

6. The platform as claimed in claim 5, wherein the vacuum flow restrictor has lower aerodynamic resistance than the pressure flow restrictor.

7. The platform as claimed in claim 6, wherein the vacuum flow restrictor is designed to lower the vacuum level at said at least one of a plurality of the air-evacuation channels to a value in the range of 70%-90% of the vacuum level of the vacuum reservoir.

8. The platform as claimed in claim 7, wherein the absolute value of pressure supply to the platform is larger by a factor of 1.2.-3 with respect to the absolute value of vacuum supply to the platform.

9. The platform as claimed in claim 1, wherein the support surface comprises at least one of a plurality of planar surfaces.

10. The platform as claimed in claim 9, wherein the support surface is flat.

11. The platform as claimed in claim 9, wherein said at least one of a plurality of air-evacuation channels comprises grooves provided on the support surface.

12. The platform as claimed in claim 9, wherein the support surface is cylindrically shaped.

13. The platform as claimed in claim 1, wherein the support surface is substantially rectangular.

14. The platform as claimed in claim 1, wherein the support surface is substantially circular.

15. The platform as claimed in claim 1, wherein the support surface is constructed from plates in a layered formation.

16. The platform as claimed in claim 15, wherein at least one of the plates contains a plurality of voids constructing the flow restrictors and inter-layer passages for the air-evacuation channels and for pressure or vacuum supply.

17. The platform as claimed in claim 15, wherein the pressure reservoir is in the form of an Integral manifold within the layered-formation.

18. The platform as claimed in claim 17, wherein the evacuation channels are fluidically connected to a vacuum reservoir and the vacuum reservoir is in the form of an Integral manifold within the layered-formation, constituting a double-manifold structure.

19. The platform as claimed in claim 1, wherein said at least one of a plurality of basic cells is provided in a repeated arrangement in order to provide local balance.

20. The platform as claimed in claim 19, wherein each of the basic cells is provided in a one-dimensional repeated arrangement.

21. The platform as claimed in claim 19, wherein each of the basic cells is provided in a two-dimensional repeated arrangement.

22. The platform as claimed in claim 1, wherein the pressure flow restrictor is designed to reduce the pressure supplied by the high pressure reservoir to a value in the range of 30%-70% of the pressure of the high pressure reservoir.

23. The platform as claimed in claim 1, wherein at least one of a plurality of through-openings is provided in the support surface, for allowing access to the object for handling or processing.

24. The platform as claimed in claim 1, wherein the support surface is segmented into several segments, separated by spaces.

25. The platform as claimed in claim 1, wherein the air evacuation channels are fluidically connected to a vacuum reservoir, and wherein pressure level in the high pressure reservoir or vacuum reservoir is adjustable.

26. The platform as claimed in claim 25, wherein pressure level in the pressure reservoir or vacuum reservoir is adjustable in at least one selected separated zone of the high pressure reservoir or vacuum reservoir.

27. The platform as claimed in claim 26, wherein the selected separated zones are located at edges of the support surface to suppress edge effects.

28. The platform as claimed in claim 25, wherein the air evacuation channels are fluidically connected to a vacuum reservoir and wherein at selected separated zones of the high pressure reservoir the pressure is separately adjustable.

29. The platform as claimed in claim 28, wherein across the selected separated zones parallelism is maintained with respect to an independent reference.

30. The platform as claimed in claim 1, wherein resolution of the basic cells at edges of the support surface is higher with respect to resolution of the basic cells at inner zones of the support surface.

31. The platform as claimed in claim 1, wherein each of the basic cells comprises at least one of a plurality of evacuation grooves, serving as at least some of the air-evacuation channels.

32. The platform as claimed in claim 31, wherein each of the basic cells comprises at least one of a plurality of evacuation vents, serving as at least some of the air-evacuation channels.

33. The platform as claimed in claim 1, wherein each of the basic cells comprises at least one of a plurality of evacuation vents, serving as at least some of the air-evacuation channels.

34. The platform as claimed in claim 1, wherein the pressure outlets and the air evacuation channels are arranged linearly, pressure outlets aligned in lines and evacuation channels aligned in lines.

35. The platform as claimed in claim 1, wherein said at least one of two substantially opposing support surfaces is oriented so that the object is to be supported below it.

36. The platform as claimed in claim 1, wherein the platform is adapted to be supported or conveyed over the object, which is stationary.

37. The platform as claimed in claim 36, wherein the object is a carriage and the support surface is an elongated track.

38. The platform as claimed in claim 37, wherein the track is provided with rails on opposing sides of the track to limit the motion of the object to a predetermined path over the track.

39. The platform as claimed in claim 38, wherein the rails comprise each a platform as claimed in claim 1, for eliminating or greatly reducing friction forces.

40. The platform as claimed in claim 1, wherein the object is a flat track and the support surface is incorporated in a carriage.

41. The platform as claimed in claim 40, wherein the track is provided with rails on opposing sides of the track to limit the motion of the carriage to a predetermined path over the track.

42. The platform as claimed in claim 41, wherein the rails comprise each a platform as claimed in claim 1.

43. The platform as claimed in claim 1, wherein the ratio between the number of pressure outlets and evacuation channels is in the range of 3-16.

44. The platform as claimed in claim 1, wherein gripping means are provided to be coupled to the object for holding or moving the object over the support surface.

45. The platform as claimed in claim 44, wherein the gripping means comprise a gripper unit, which itself is supported with no contact by a support surface such as the one claimed in claim 1.

46. The platform as claimed in claim 45, wherein the gripping means comprise a gripper unit, which itself is supported with no contact by the support surface.

47. The platform as claimed in claim 44, wherein the gripping means is coupled to the object and used to convey it over the support surface sideways.

48. The platform as claimed in claim 47, wherein gripping means is coupled to the object and used to convey it over the support surface in a linear motion.

49. The platform as claimed in claim 47, wherein gripping means is coupled to the object and used to convey it over the support surface in a rotational motion.

50. The platform as claimed in claimed in claim 44, wherein the gripping means is coupled to the support surface and the support surface is transportable.

51. The platform as claimed in claim 1, wherein the platform is vertically oriented.

52. The platform as claimed in claim 1, wherein the air-evacuation channels allow air to be passively discharged into ambient atmosphere.

53. The platform as claimed in claim 52, wherein more flow restrictors are provided for each basic cell in order to support a heavier object and vice versa.

54. The platform as claimed in claim 1, wherein said at least one of two substantially opposite support surfaces comprise only one support surface, and opposite it a passive surface is provided so that the object may be pressed against the passive surface without contact by aerodynamically induced forces generated by the support surface.

55. The platform as claimed in claim 54, wherein the passive surface is adapted to be laterally moved.

56. The platform as claimed in claim 55, wherein the passive surface is a rotatable cylinder.

57. The platform as claimed in claim 55, wherein the passive surface is a vacuum table.

58. The platform as claimed in claim 1, wherein said at least one of two substantially opposite support surfaces comprises
two substantially opposite support surfaces.

59. The platform as claimed in claim 58, wherein each of the air-evacuation channels is connected to a vacuum reservoir.

60. The platform as claimed in claim 59, wherein each of the air-evacuation channels is connected to a vacuum reservoir through a vacuum flow restrictor, the vacuum flow restrictor characteristically exhibiting fluidic return spring behavior.

61. The platform as claimed in claim 58, wherein said at least one of two substantially opposite support surfaces comprises two substantially opposite support surfaces that are substantially symmetrical.

62. The platform as claimed in claim 61, wherein a gap between the two substantially opposite support surfaces is determined to be at least the width of an anticipated object to be supported within plus twice a desired air-cushion gap.

63. The platform as claimed in claim 62, wherein a preload mechanical spring is provided to adjust the gap between the two substantially opposite support surfaces.

64. The platform as claimed in claim 61, wherein pressure supply or vacuum to one of the two substantially opposite support surfaces is different from the pressure supply or vacuum supply to the second of the two substantially opposite support surfaces.

65. The platform as claimed in claim 1, further comprising:
driving mechanism for driving the object over said at least one of two substantially opposite support surfaces;
handling means for handling the object during loading or unloading of the object onto said at least one of two substantially opposite support surfaces;
sensing means for sensing properties selected from the group of properties including: position, orientation, proximity and velocity of the object; and
controller for controlling the position, orientation and traveling velocity of the object over said at least one of two substantially opposite support surfaces and for communicating with a process line adjacent the system.

66. The system as claimed in claim 65, wherein loading and unloading zones are provided.

67. The system as claimed in claim 65, wherein said at least one of two substantially opposite support surfaces comprises several one-sided substantially opposite support surfaces.

68. The system as claimed in claim 67, wherein one of the several one-sided substantially opposite support surfaces comprises a PV support surface for providing flattening of the object, where at central zone of that PV support surface a processing on the object can be conducted.

69. The system as claimed in claim 68, wherein the PV support surface is provided with a relaxation zone on edges of the PV support surface having a relaxation length of about 5-15 lengths of basic cells.

70. The system as claimed in claim 65, further comprising at least one of a plurality of dual-sided type of said at least one of two substantially opposite support surfaces.

71. The system as claimed in claim 70, the dual-sided type of said at least one of two substantially opposite support surfaces comprising PP-type dual-sided support surfaces for high flattening performance.

72. The system as claimed in claim 70, the dual-sided type of said at least one of two substantially opposite support surfaces comprising PV-type dual-sided support surfaces for high flattening performance.

* * * * *